(12) United States Patent  
Endo et al.

(10) Patent No.: US 7,993,966 B2
(45) Date of Patent: Aug. 9, 2011

(54) METHOD FOR MANUFACTURING SILICON CARBIDE SEMICONDUCTOR DEVICE HAVING HIGH CHANNEL MOBILITY

(75) Inventors: Takeshi Endo, Obu (JP); Tsuyoshi Yamamoto, Kariya (JP); Jun Kawai, Anjo (JP); Kensaku Yamamoto, Chiryu (JP); Eiichi Okuno, Mizuho (JP)

(73) Assignee: DENSO CORPORATION, Kariya (JP)

( * ) Notice: Subject to any disclaimer, the term of this patent is extended or adjusted under 35 U.S.C. 154(b) by 241 days.

(21) Appl. No.: 11/511,236

(22) Filed: Aug. 29, 2006

(65) Prior Publication Data

US 2007/0045631 A1 Mar. 1, 2007

(30) Foreign Application Priority Data

Aug. 31, 2005 (JP) ................................. 2005-251365
Jun. 12, 2006 (JP) ................................. 2006-162448

(51) Int. Cl.
*H01L 21/336* (2006.01)

(52) U.S. Cl. ........ 438/105; 438/268; 438/285; 438/767; 257/E21.409

(58) Field of Classification Search .................. 438/105, 438/197, 268, 285, 767, 779, 123
See application file for complete search history.

(56) References Cited

U.S. PATENT DOCUMENTS

| 5,736,753 | A | 4/1998 | Ohno et al. |
| 5,976,936 | A | 11/1999 | Miyajima et al. |
| 5,990,605 | A | 11/1999 | Yoshikawa et al. |
| 6,020,600 | A | 2/2000 | Miyajima et al. |
| 6,573,534 | B1 | 6/2003 | Kumar et al. |
| 6,764,963 | B2 | 7/2004 | Fukuda et al. |
| 6,864,507 | B2 * | 3/2005 | Yokogawa et al. .............. 257/77 |
| 7,338,869 | B2 | 3/2008 | Fukuda et al. |
| 2002/0102358 | A1 | 8/2002 | Das et al. |
| 2003/0013266 | A1 | 1/2003 | Fukuda et al. |
| 2004/0183080 | A1 * | 9/2004 | Kusumoto et al. .............. 257/77 |
| 2005/0064639 | A1 * | 3/2005 | Hisada et al. ................. 438/197 |
| 2005/0245034 | A1 | 11/2005 | Fukuda et al. |
| 2006/0197152 | A1 * | 9/2006 | Tokano et al. ................. 257/341 |
| 2008/0203400 | A1 | 8/2008 | Fukuda et al. |

FOREIGN PATENT DOCUMENTS

| JP | A-10-112460 | 4/1998 |
| JP | A-11-031691 | 2/1999 |
| JP | A-2000-286258 | 10/2000 |
| JP | A-2001-053293 | 2/2001 |

(Continued)

OTHER PUBLICATIONS

Office Action dated Jul. 18, 2008 in corresponding Chinese patent application No. 200610126666.7 (and English translation).

(Continued)

*Primary Examiner* — Thanh Nguyen
(74) *Attorney, Agent, or Firm* — Posz Law Group, PLC

(57) ABSTRACT

A silicon carbide semiconductor device having a MOS structure includes: a substrate; a channel area in the substrate; a first impurity area; a second impurity area; a gate insulating film on the channel area; and a gate on the gate insulating film. The channel area provides an electric current path. The channel area and the gate insulating film have an interface therebetween. The interface includes a dangling bond, which is terminated by a hydrogen atom or a hydroxyl. The interface has a hydrogen concentration equal to or larger than $2.6 \times 10^{20}$ cm$^{-3}$.

41 Claims, 29 Drawing Sheets

FOREIGN PATENT DOCUMENTS

| | | |
|---|---|---|
| JP | A-2004-319619 | 11/2004 |
| JP | A-2005-166930 | 6/2005 |

OTHER PUBLICATIONS

Office Action issued from the Swedish Patent Office dated May 16, 2008 in the corresponding Swedish Patent Application No. 0601692-7 (English translation enclosed.).

Office Action dated Apr. 17, 2009 in corresponding Chinese patent application No. 2006101266667 (and English translation).

Office Action dated Mar. 26, 2009 from German Patent Office in the corresponding DE Application No. 102006040818.7 (and English Translation).

Third Office Action dated Oct. 9, 2009 in corresponding Chinese patent application No. 2006101266667 (and English translation).

Office Action mailed May 20, 2010 in corresponding U.S. Appl. No. 12/219,007.

Office Action mailed Sep. 17, 2010 in corresponding U.S. Appl. No. 12/219,007.

Office Action dated Nov. 9, 2010 from the German Patent Office in corresponding German patent application No. 10 2006 040 818.7.

Office Action mailed Feb. 16, 2011 in corresponding U.S. Appl. No. 12/219,007.

Notice of Reason for Refusal mailed Mar. 22, 2011 from the Japan Patent Office corresponding to Japanese patent application No. 2006-162448.

* cited by examiner

METHOD FOR MANUFACTURING SILICON CARBIDE SEMICONDUCTOR DEVICE HAVING HIGH CHANNEL MOBILITY

CROSS REFERENCE TO RELATED APPLICATIONS

This application is based on Japanese Patent Applications No. 2005-251365 filed on Aug. 31, 2005, and No. 2006-162448 filed on Jun. 12, 2006, the disclosures of which are incorporated herein by reference.

FIELD OF THE INVENTION

The present invention relates to a silicon carbide semiconductor device having high channel mobility and a method for manufacturing the same.

BACKGROUND OF THE INVENTION

It is conventionally disclosed in U.S. Pat. No. 6,764,963 that the channel mobility in the MOS structure can be improved by performing processing in hydrogen anneal or a wet atmosphere in the SiC semiconductor device in which face a set to a (11–20)-plane in the plane azimuth of a crystal face is used in a channel. Concretely, it is intended that the channel mobility is improved by selecting concentration or temperature of the hydrogen anneal or the wet atmosphere.

However, it is not still sufficient in the channel mobility obtained in a technique shown in U.S. Pat. No. 6,764,963, and it is expected to intend a further improvement of the channel mobility.

SUMMARY OF THE INVENTION

In view of the above-described problem, it is an object of the present disclosure to provide a silicon carbide semiconductor device having high channel mobility. It is another object of the present disclosure to provide a method for manufacturing a silicon carbide semiconductor device having high channel mobility.

According to a first aspect of the present disclosure, a silicon carbide semiconductor device having a MOS structure includes: a substrate made of silicon carbide; a channel area for providing an electric current path, wherein the channel area is made of silicon carbide and disposed in the substrate; a first impurity area disposed on an upstream side of the electric current path; a second impurity area disposed on a downstream side of the electric current path; a gate insulating film disposed on a surface of the channel area; and a gate disposed on the gate insulating film. The channel area provides the electric current path as a channel by controlling a voltage applied to the gate so that an electric current in the electric current path flowing between the first impurity area and the second impurity area is controlled. The channel area and the gate insulating film have an interface therebetween. The interface includes a dangling bond, which is terminated by a hydrogen atom or a hydroxyl. The interface has a hydrogen concentration equal to or larger than $2.6 \times 10^{20}$ cm$^{-3}$.

The above device is characterized in that dangling bond of an interface of the channel area and the gate insulating film is terminated by an element of H or OH, and hydrogen concentration at the interface is set to $2.6 \times 10^{20}$ cm$^{-3}$ or more. Thus, if the dangling bond of the interface of the channel area and the gate insulating film is terminated by the element of H or OH, and the hydrogen concentration at the interface is set to a high value of $2.6 \times 10^{20}$ cm$^{-3}$ or more, it is possible to set a silicon carbide semiconductor device of high channel mobility.

According to a second aspect of the present disclosure, a method for manufacturing a silicon carbide semiconductor device having a MOS structure is provided. The method includes steps of: preparing a substrate made of silicon carbide; forming a channel area on the substrate, wherein the channel area is made of silicon carbide, and provides an electric current path; forming a first impurity area on an upstream side of the electric current path; forming a second impurity area on a downstream side of the electric current path; forming a gate insulating film on a surface of the channel area; forming a gate on the gate insulating film; and heating and cooling the substrate. The channel area provides the electric current path as a channel by controlling a voltage applied to the gate so that an electric current in the electric current path flowing between the first impurity area and the second impurity area is controlled. In the step of heating and cooling the substrate, the substrate is cooled in a wet atmosphere or a hydrogen atmosphere in a temperature range between 800° C. and 900° C. so that a dangling bond of an interface between the gate insulating film and the channel area is terminated by a hydrogen atom or a hydroxyl.

The above method is characterized in that a heat treatment process is included, and a wet atmosphere or a hydrogen atmosphere is continuously maintained in a temperature area of 800 to 900° C. at a temperature lowering time in the heat treatment process so as to terminate dangling bond of an interface of the gate insulating film and the channel area by an element of H or OH. Thus, at the temperature lowering time in the heat treatment process, the wet atmosphere or the hydrogen atmosphere is continuously maintained in the temperature area of 800 to 900° C. as the termination-desorption temperature, and temperature is lowered until the termination-desorption temperature or less. Therefore, the dangling bond of the interface of the gate insulating film and the channel area can be terminated by the element of H or OH. Therefore, the silicon carbide semiconductor device of high channel mobility can be set.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
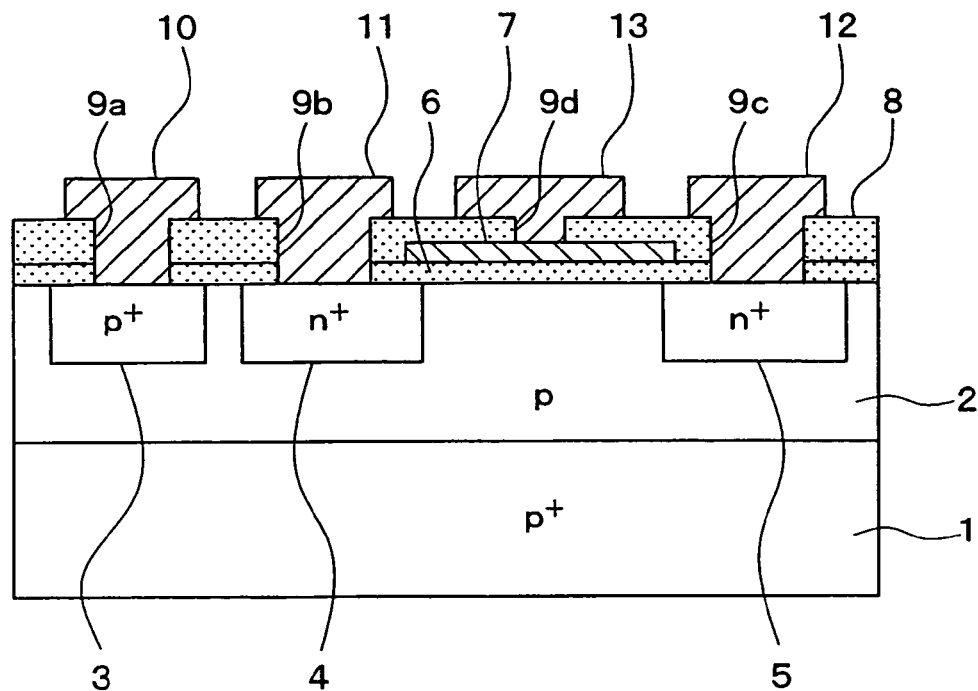
FIG. 1 is a cross sectional view showing the sectional construction of an inversion type lateral MOSFET to which a first embodiment mode of the present invention.

To study a silicon carbide semiconductor device having high channel mobility, the present inventors have considered channel mobility when a gate oxide film is formed in a wet atmosphere and wet anneal or hydrogen anneal is performed. Thus, it has been confirmed that no sufficient channel mobility can be obtained by merely forming the gate oxide film at a predetermined concentration or a predetermined temperature in the wet atmosphere, or merely performing the hydrogen anneal at a predetermined concentration or a predetermined temperature.

It is effective to improve the channel mobility that interface state density at an interface of SiC and the gate oxide film in a MOS structure is reduced. It is considered to reduce the interface state density in this way that dangling bond of the interface of SiC and the gate oxide film is terminated by an element of H or OH. Concretely, channel mobility can be improved when a state in which H or OH enters a defective portion of a lower layer portion abutting on SiC among the gate oxide film is held.

The present inventors have eagerly taken considerations so as to realize such a structure. Thus, it has been confirmed that temperature for terminating the dangling bond of the interface of SiC and the gate oxide film by H or OH, in other words, desorbing temperature (hereinafter called termination-desorption temperature) is determined. It has been also confirmed that it is important to realize the above structure whether or not it attains an atmosphere for desorbing no H or OH at this termination-desorption temperature.

Namely, H or OH is terminated and desorbed at the termination-desorption temperature. Therefore, the desorption is caused if it is under a situation in which the desorption has an advantage over the termination at this temperature. In contrast to this, the desorption can be prevented if it is under a situation in which the termination has an advantage over the desorption.

Therefore, if no wet atmosphere is formed in attaining the termination-desorption temperature even when gate oxidation is performed in the wet atmosphere, H or OH is desorbed from the dangling bond so that the above structure cannot be realized. Further, if no hydrogen atmosphere is always set under temperature exceeding the termination-desorption temperature even when the hydrogen anneal is performed, H or OH is desorbed and the above structure cannot be finally realized.

Therefore, the present inventors manufactured an inversion type lateral MOSFET of 10 μm in channel length and 70 μm in channel width in a SiC substrate having face a, i.e., a (11-20)-plane as a main surface by using a conventional technique and a consideration technique for maintaining the wet atmosphere until the termination-desorption temperature or less at a temperature lowering time when the gate oxide film was formed by the wet oxidation. The present inventors also examined electric field effect channel mobility (hereinafter called channel mobility) with respect to a gate voltage and the magnitude of a drain electric current.

Concretely, the gate oxide film is formed by performing the wet oxidation for 80 minutes at 1080° C. as the conventional technique. Thereafter, it is switched from the wet atmosphere to an $N_2$ atmosphere, and temperature is lowered at 10° C./min until 600° C., and MOSFET is manufactured, and channel mobility, etc. are examined. Further, as the consideration technique, the gate oxide film is formed by performing wet oxidation similar to that in the conventional case. At a temperature lowering time of this gate oxide film forming process, temperature is lowered at 10° C./min until 600° C. while the wet atmosphere is maintained. MOSFET is then manufactured and channel mobility, etc. are examined. As its result, results shown in FIGS. 25A and 25B have been obtained.

Figure 25A:
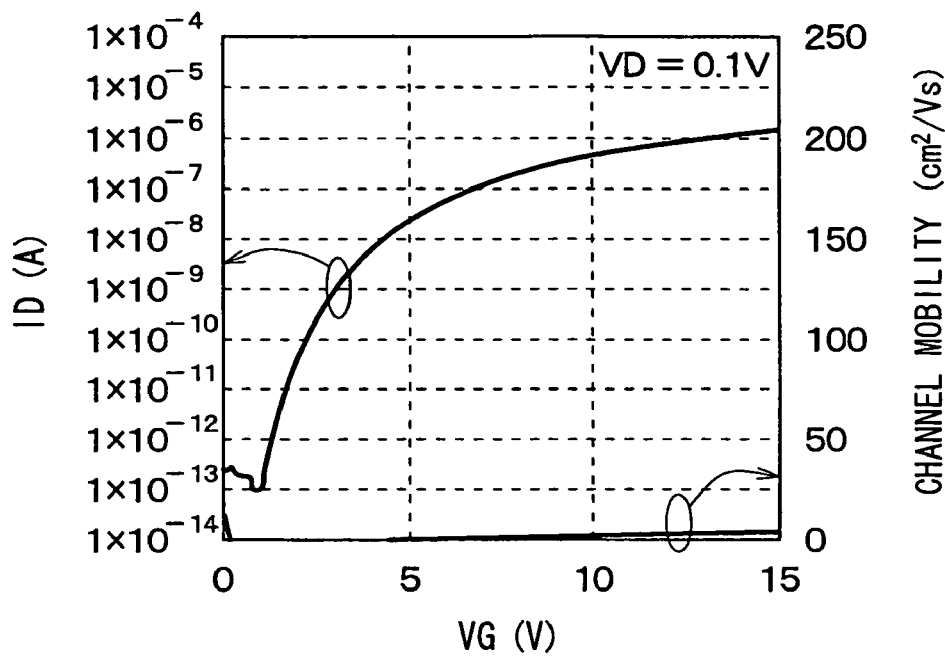
FIGS. 25A and 25B are graphs showing results in which the relation of channel mobility with respect to a gate voltage and the magnitude of a drain electric current is examined.

As shown in FIG. 25A, channel mobility is very small in the case of the conventional technique. This shows that no sufficient channel mobility can be obtained by merely forming the gate oxide film in the wet atmosphere.

Figure 25B:
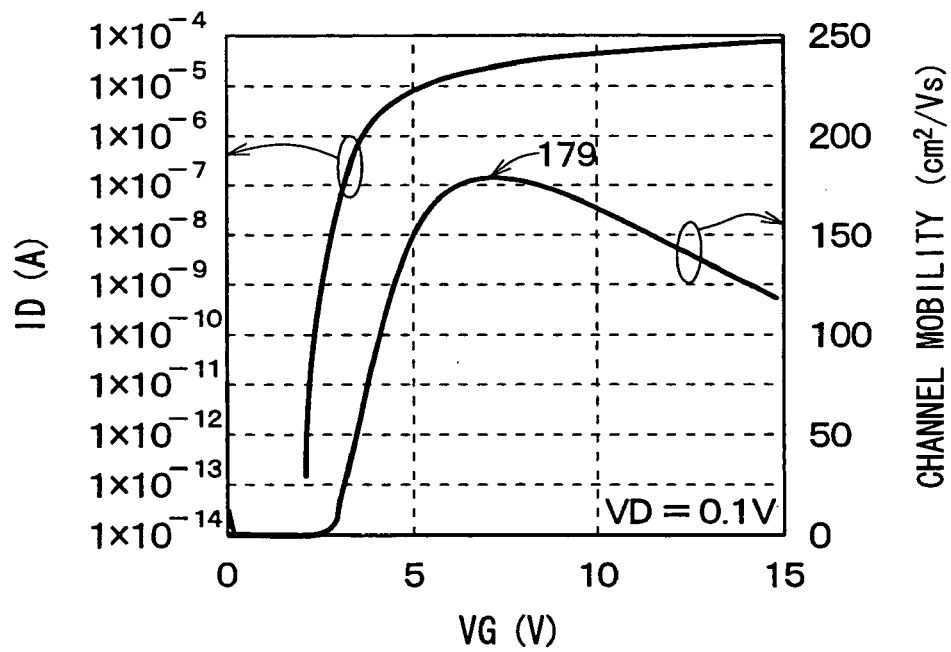

In contrast to this, as shown in FIG. 25B, in the case of the consideration technique, channel mobility is high and the drain electric current becomes large. It is considered from these results that it is possible to prevent desorption from having an advantage over the termination of H or OH from the dangling bond and prevent the desorption by setting a state for maintaining the wet atmosphere in lowering temperature until 600° C. supposed as the termination-desorption temperature or less.

In an experiment made here, the wet atmosphere is maintained until 600° C. at the temperature lowering time of the gate oxide film forming process, and is then switched to the nitrogen atmosphere on the basis of the following experimental results.

Figure 26A:
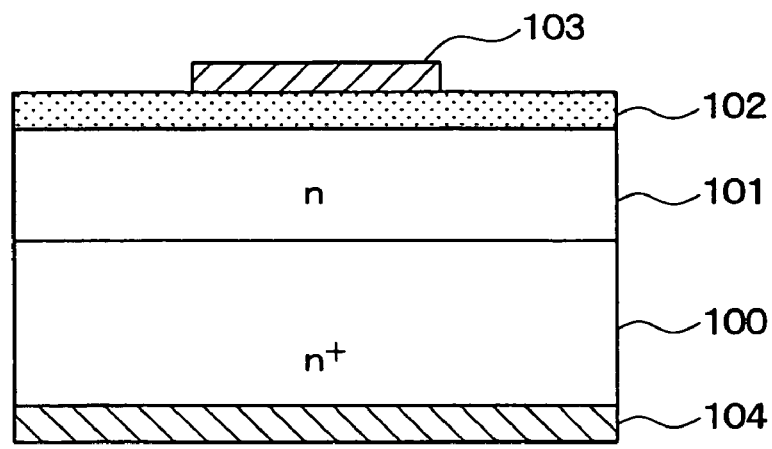
FIG. 26A is a cross-sectional view of a MOS capacitor as a sample used in an experiment.
Figure 26B:
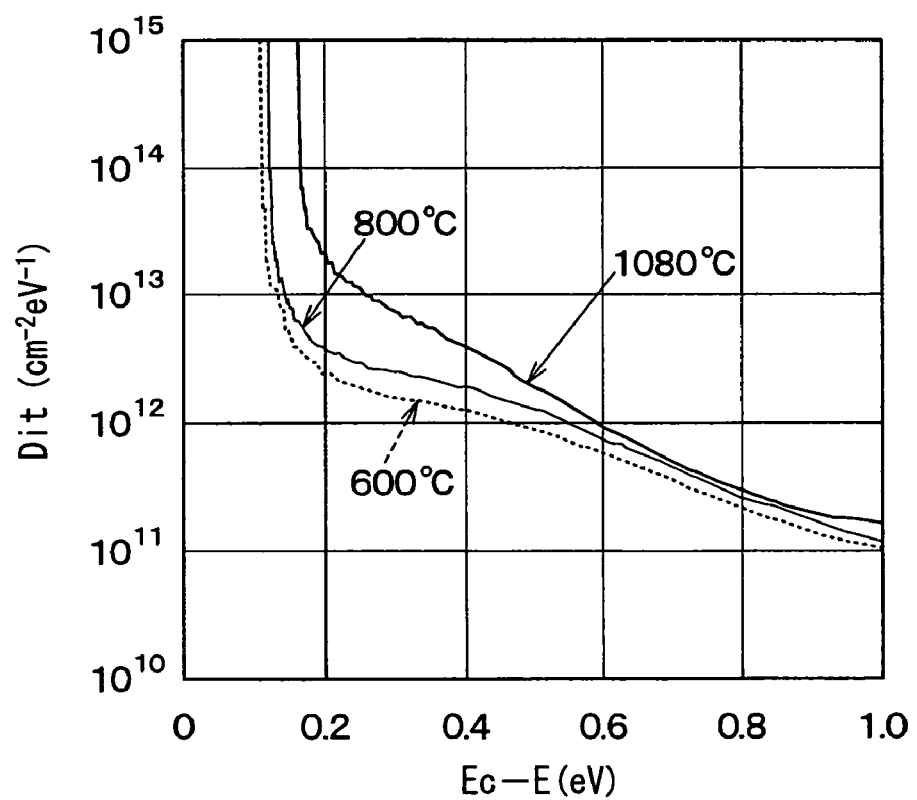
FIG. 26B is a graph showing the relation of switching temperature of an atmosphere and interface state density.

FIG. 26A is a cross-sectional view of a MOS capacitor as a sample used in the experiment. FIG. 26B shows the relation of switching temperature of the atmosphere and the interface state density.

As shown in FIG. 26A, an n type epitaxial layer 101 having $1 \times 10^{16}$ $cm^{-3}$ in impurity concentration is formed on an $n^+$ type layer 100. A gate oxide film 102 is formed by performing gate oxidation in a substrate having a surface set to face a. In the gate oxidation at this time, temperature is raised until 1080° C. in the nitrogen atmosphere, and the nitrogen atmosphere is then switched to the wet atmosphere and the wet oxidation is performed for 80 minutes, and temperature is lowered at 10° C./min in the wet atmosphere as it is. At this time, the switching temperature from the wet atmosphere to the nitrogen atmosphere is changed to 1080° C., 800° C. and 600° C. Ni 103 and Ni 104 having 500 nm in thickness are then evaporated on front and rear faces. Thereafter, Ni is patterned so as to have φ500 μm so that a MOS capacitor is constructed.

The interface state density ($D_{it}$) of each MOS capacitor changed with respect to the switching temperature is then evaluated. As a result, it has been confirmed that the interface state density is reduced by lowering the switching temperature from the wet atmosphere at the temperature lowering time to the nitrogen atmosphere. Thus, the interface state density can be reduced in accordance with the switching temperature from the wet atmosphere to the nitrogen atmosphere, and channel mobility can be improved. Therefore, in the above embodiment mode, the wet atmosphere is maintained until 600° C. at the temperature lowering time of the gate oxide film forming process, and is then switched to the nitrogen atmosphere.

Figure 27A:
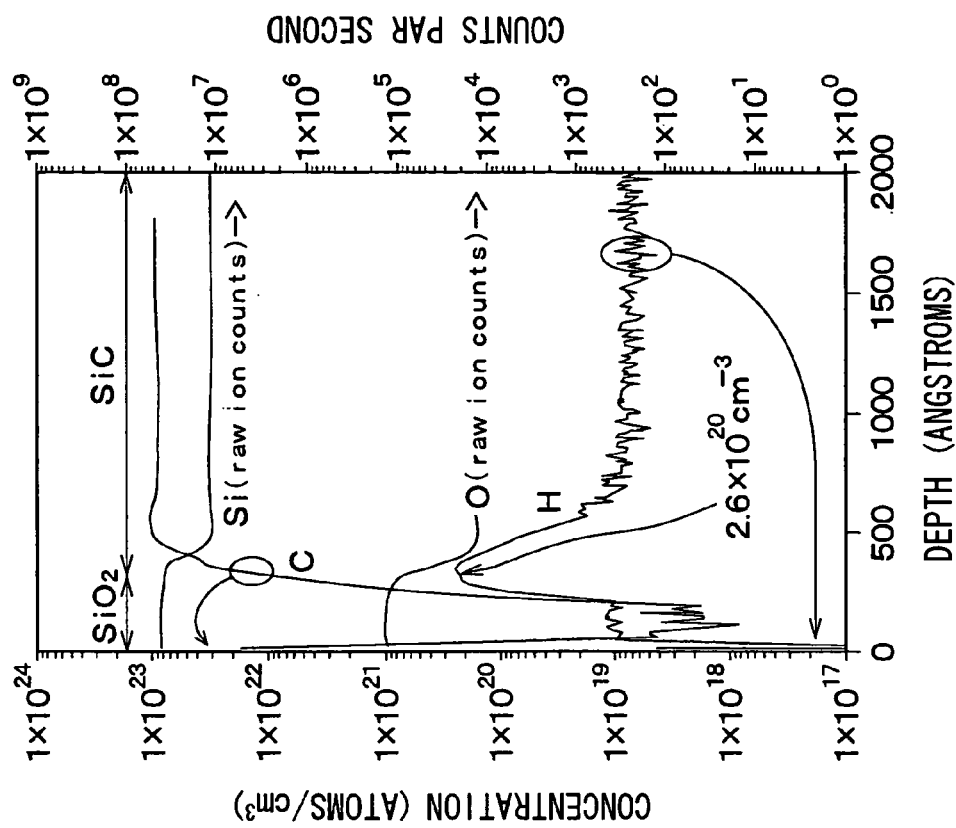
FIGS. 27A and 27B are graphs respectively showing hydrogen concentrations in the vicinity of the interface of SiC and a gate oxide film ($SiO_2$) in MOSFET manufactured by a conventional technique and a consideration technique.
Figure 27B:
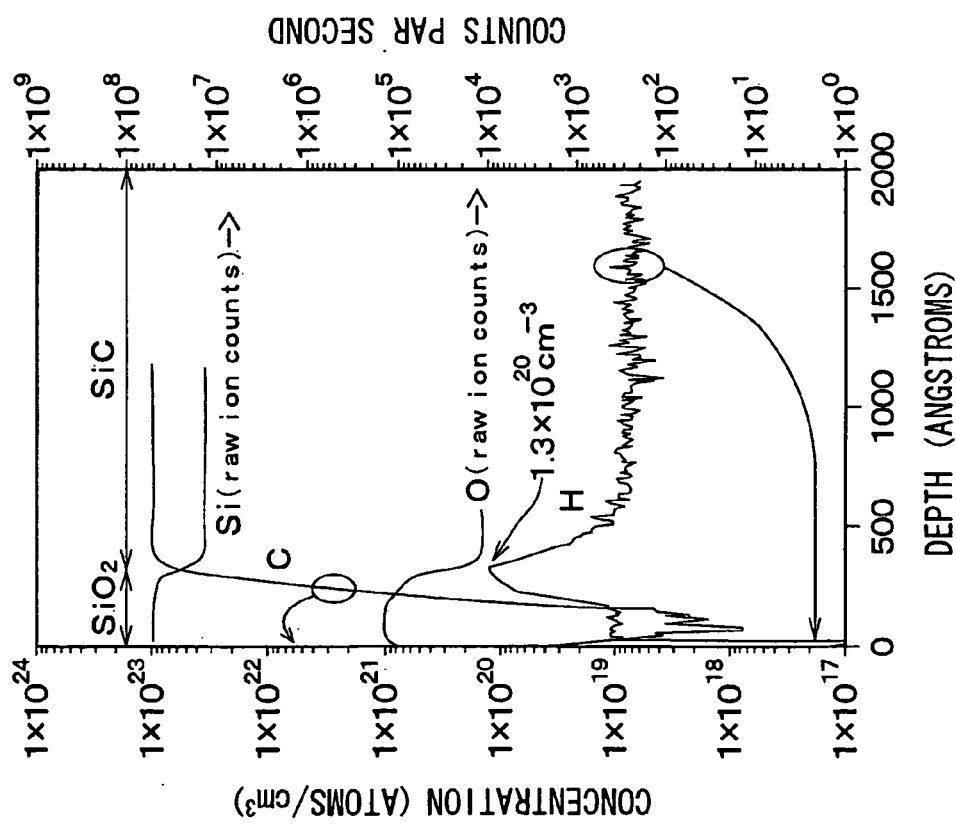

Hydrogen concentrations of the interface are compared by an SIMS analysis to verify termination effects of the dangling bond using H or OH in the above experiment. FIGS. 27A and 27B are views showing the hydrogen concentrations near the interface of SiC and the gate oxide film ($SiO_2$) in MOSFETs manufactured by the conventional technique and the consideration technique.

As shown in these figures, when the hydrogen concentrations at the interface of SiC and the gate oxide film are compared, the hydrogen concentration is about $1.3 \times 10^{20}$ $cm^{-3}$ in accordance with the conventional technique. In contrast to this, the hydrogen concentration is about $2.6 \times 10^{20}$ $cm^{-3}$ in accordance with the consideration technique. Therefore, it is understood that the hydrogen concentration of the consideration technique is therefore about twice the hydrogen concentration of the conventional technique. Namely, the dangling bond can be terminated by an element of H or OH by adopting the consideration technique in comparison with the conventional technique. It can be said from these contents that channel mobility is improved by raising the hydrogen concentration at the interface, i.e., by terminating the dangling bond by the element of H or OH.

Thus, the dangling bond at the interface of SiC and the gate oxide film can be terminated by H or OH by continuing the wet atmosphere until at least the termination-desorption temperature or less at the temperature lowering time in forming the gate oxide film.

On the other hand, it can be said from a way of thinking similar to such knowledge that the gate oxide film is formed by a technique different from the wet oxidation using the wet atmosphere, and the atmosphere is switched to the wet atmosphere at only the temperature lowering time, and the dangling bond of the interface of SiC and the gate oxide film can be also terminated by H or OH at the temperature lowering time.

For example, the gate oxide film is formed by performing oxidation in a dry atmosphere, an $N_2O$ atmosphere, an NO atmosphere, an ozone atmosphere, an $H_2O$ radical atmosphere, etc., or depositing LTO, TEOS, HTO, etc. by CVD, etc. At this time, the interior of a chamber for forming the gate oxide film attains a high temperature state. Therefore, the atmosphere is switched to the wet atmosphere by introducing $H_2O$ from this state into the chamber, and temperature is lowered until the termination-desorption temperature or less.

Here, the explanation has been made with respect to the case in which the gate insulating film is constructed by an oxide film. However, when this technique is used, the gate insulating film can be also constructed by an insulating film of another kind. For example, $HfO_2$, HfSiON, HfAlO, $Al_2O_3$, $Ta_2O_5$, $Si_3N_4$, etc. are enumerated.

Similarly, similar matters may be also separately performed by an anneal process after the gate oxide film forming process without terminating the dangling bond of the interface of SiC and the gate oxide film by H or OH at the temperature lowering time in forming the gate oxide film (gate insulating film). If both these matters are performed, the dangling bond of the interface of SiC and the gate oxide film can be more terminated by H or OH so that channel mobility can be also more improved.

Figure 28:
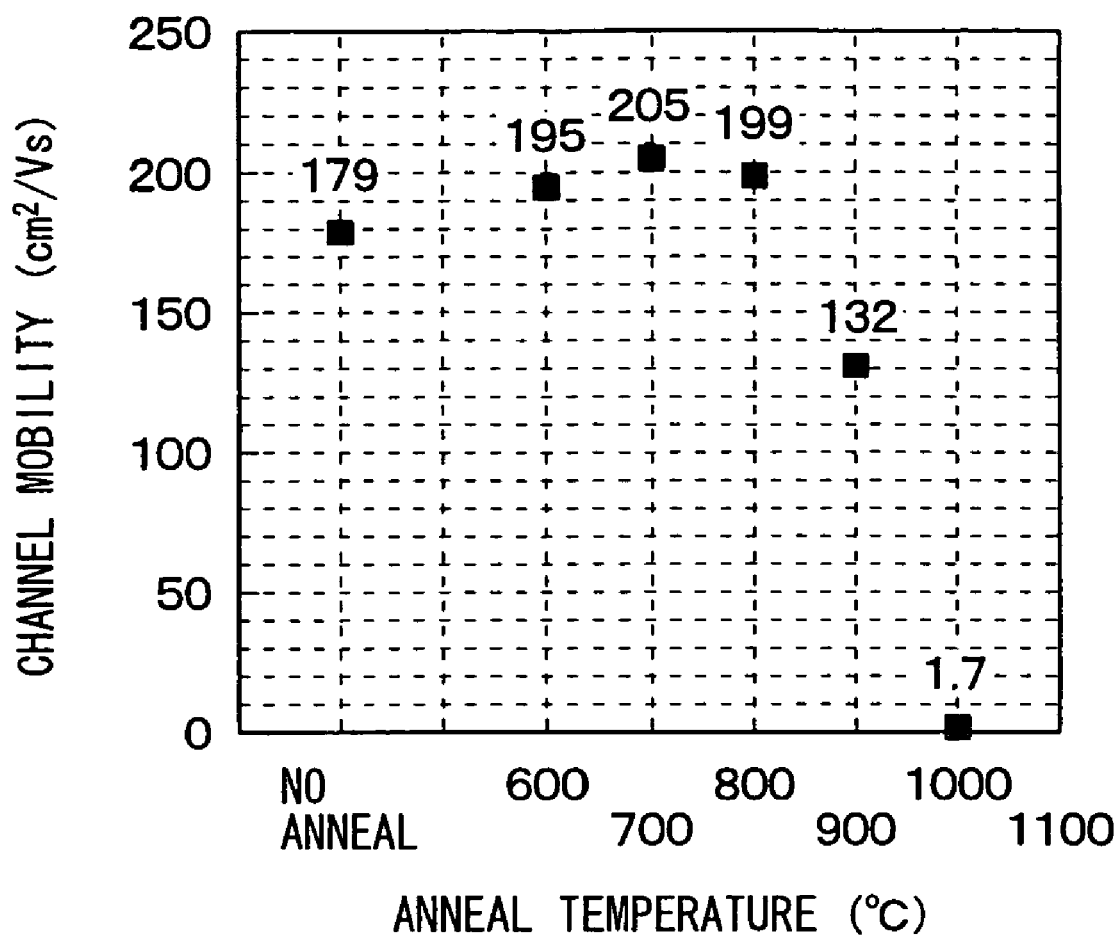
FIG. 28 is a graph showing the relation of anneal temperature and channel mobility.

Next, the wet atmosphere is maintained until the temperature lowering time of the gate oxide film forming process, and the gate oxide film is formed as mentioned above to analyze the above termination-desorption temperature. Thereafter, anneal is performed at various temperatures within an Ar atmosphere causing no termination of the dangling bond due to H or OH. FIG. 28 shows its experimental results.

FIG. 28 shows the relation of anneal temperature and channel mobility by using MOSFET of a structure used in an experiment of FIGS. 25A and 25B. This figure also shows the above relation when no anneal process is performed at all as a reference.

As shown in this figure, when no anneal process is performed at all, channel mobility becomes a large value of 179 $cm^2/Vs$.

In contrast to this, the case that the anneal process is performed will be seen. When the anneal temperature is 600 to 700° C., channel mobility is increased in comparison with the case that no anneal process is performed at all. Channel mobility reaches 205 $cm^2/Vs$ at 700° C. When the anneal temperature is 800° C., channel mobility becomes 199 $cm^2/Vs$, and begins to be reduced. As the anneal temperature is raised from this temperature, channel mobility is suddenly reduced. When the anneal temperature becomes 1000° C., it is understood that channel mobility approximately becomes a value close to zero.

It can be confirmed from this result that the desorption of H or OH is mainly caused at 800 to 900° C., and is advanced at these temperatures or more. The dangling bond due to H or OH is terminated in the same temperature area as the desorption. Accordingly, it is considered that the termination-desorption temperature is mainly 800 to 900° C. Further, it can be confirmed that channel mobility is increased in comparison with a sample in which no anneal is performed until the anneal of 800° C. Accordingly, channel mobility can be further improved by performing the anneal of 800° C. or less, preferably, 700° C. or less after the gate oxide film formation.

Further, a thermal desorption spectroscopy analysis is made to specify the termination-desorption temperature in detail. Concretely, the temperature of a substrate forming the gate oxide film within a vacuum chamber is raised by laser heating, and a desorbed element is examined by a mass spectrometer. Thus, desorption gas and desorption temperature can be specified in detail.

However, a large amount of hydrogen also exists within the atmospheric air. Therefore, it becomes difficult to distinguish this hydrogen and a very small amount of hydrogen of the MOS interface. Therefore, deuterium (D) as an isotope of hydrogen almost not existing within the atmospheric air is used in a termination element of the dangling bond, and a technique for analyzing this deuterium is used. Since hydrogen and deuterium are isotopes, it is considered that natures relating to the termination and the desorption are almost the same.

A concrete manufacturing method of an analyzing sample will next be described. First, a 4H—SiC substrate of an n type having a main surface set to a (11–20)-plane is used as a substrate. Wet oxidation is performed by bubbling heavy water ($D_2O$) by a bubbling oxidation method with respect to this substrate so that a gate oxide film is formed. In a forming recipe of the gate oxide film, $H_2O$ in FIG. 4 described later is changed to $D_2O$. The thermal desorption spectroscopy analysis is then made by this sample. The analyzing element is set to $D_2$ and $D_2O$). $D_2$ is formed by bonding desorbed D, and $D_2O$ is formed by bonding desorbed OD to D, and the analysis is made by supposing $D_2O$ of moisture within the insulating film.

Figure 29A:
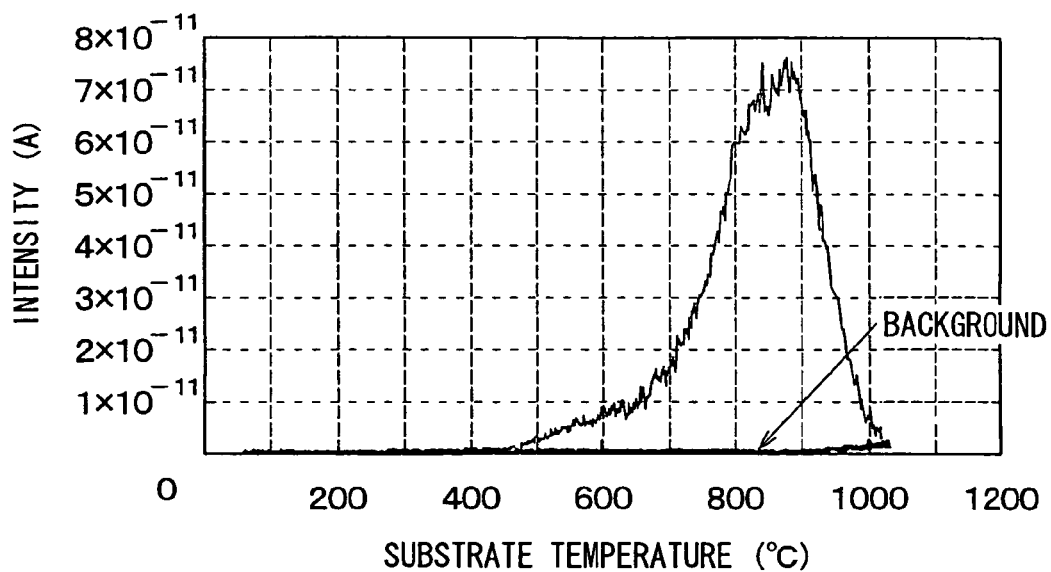
FIG. 29A is a graph showing results in which desorption temperature of deuterium is analyzed by a thermal desorption spectroscopy analysis.
Figure 29B:
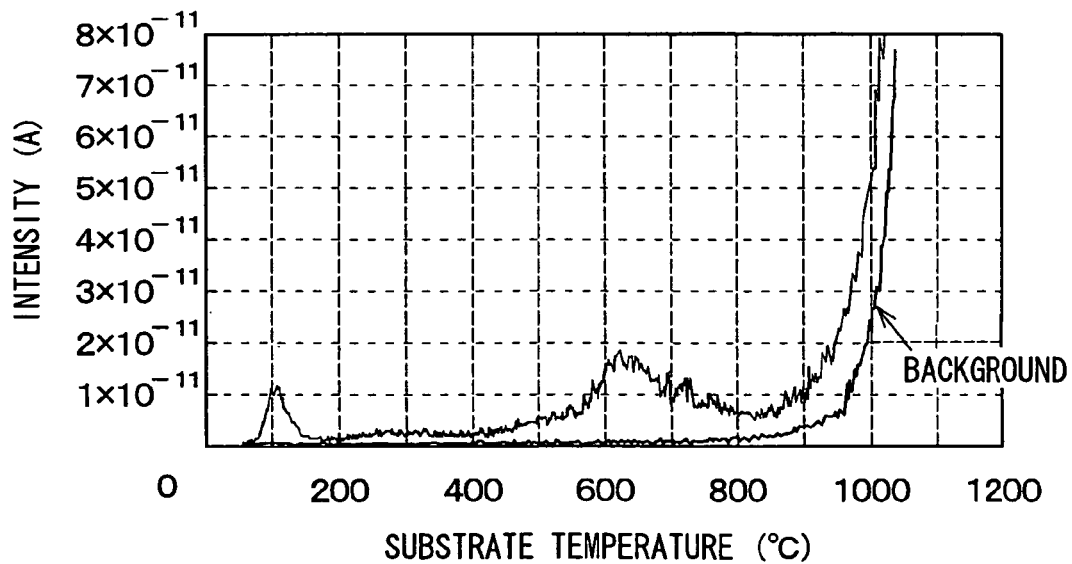
FIG. 29B is a graph showing results in which desorption temperature of heavy water is analyzed by the thermal desorption spectroscopy analysis.

FIG. 29A is a graph showing an analyzing result relative to $D_2$ (M/z=4) spectrum. FIG. 29B is a graph showing an analyzing result relative to $D_2O$ (M/z=20) spectrum. The axis of ordinate in each of these figures shows electric current intensity of the mass spectrometer. The graph described as a background in each of these figures shows the analyzing result in a state in which there is no sample. Amounts provided by subtracting background amounts from the graphs of the analyzing results of $D_2$ and $D_2O$ show pure mass analyzing amounts of $D_2$ and $D_2O$.

As shown in FIG. 29A, the desorption of $D_2$ is generated at 700° C. to 1000° C., and a peak of the desorption is particularly shown at 800° C. to 900° C. and very preferable conformity to temperature for reducing channel mobility is shown. Thus, it is possible to specify that the termination-desorption temperature of the dangling bond of H or OH is 700° C. to 1000° C., particularly, 800° C. to 900° C. On the other hand, as shown in FIG. 29B, the desorption of $D_2O$ is generated at 600° C. to 800° C., and a peak of the desorption is particularly shown at 600° C. to 700° C. This corresponds to the improvement of channel mobility until the anneal of 700° C. or less, or 800° C. or less. It is considered from these contents that the termination element of the dangling bond contributing to channel mobility is mainly hydrogen. Further, it is also considered that the anneal processing for removing moisture within the gate insulating film contributes to the improvement of channel mobility.

Figure 30:
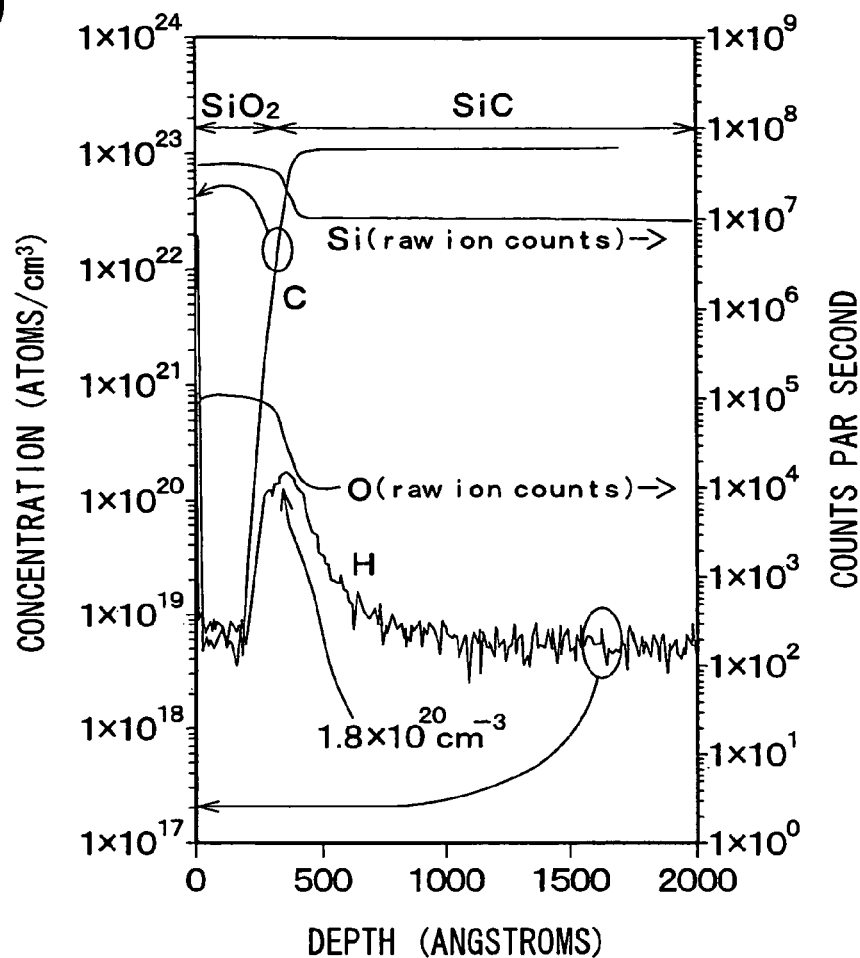
FIG. 30 is a graph showing examination results of hydrogen concentration when anneal temperature is set to 1000° C. and an anneal process is performed for 10 minutes.

FIG. 30 shows results in which hydrogen concentration is examined when anneal temperature is set to 1000° C. and an Ar anneal process is performed for 10 minutes in such an experiment as a reference. As shown in this figure, the hydrogen concentration of the interface of SiC and the gate oxide film is reduced in comparison with the case shown in FIG. 27B. Thus, it can be confirmed that H or OH is desorbed from the dangling bond of the interface of SiC and the gate oxide film.

The following matters can be said from this result to perform the anneal process in which the termination has an advantage over the desorption of H or OH. Namely, the anneal temperature is set to the termination-desorption temperature or more. Further, while an atmosphere for terminating the dangling bond by H or OH at the time of the termination-desorption temperature or more is set, this atmosphere is continuously maintained until the termination-desorption temperature or less is attained at the temperature lowering time of the anneal process.

Accordingly, it is preferable to perform the anneal process in which the anneal temperature is set to 800° C. or more, and the atmosphere for terminating the dangling bond by H or OH is always continuously set when the anneal temperature becomes 800° C. or more (preferably, 700° C. or more).

The termination-desorption temperature explained here is also similarly set with respect to the temperature lowering time in the gate oxide film forming process. Namely, if the wet atmosphere is continuously maintained during 800 to 900° C. at the temperature lowering time, preferably from 1000° C. or more to 700° C. or less, it is possible to maintain a state in which the dangling bond of the interface of SiC and the gate oxide film is also terminated by H or OH after the gate oxide film forming process.

Subsequently, on the basis of obtaining of the result of a high terminating effect of the dangling bond due to H or OH at 800 to 900° C. as mentioned above, an anneal effect in this temperature area is verified.

Figure 31:
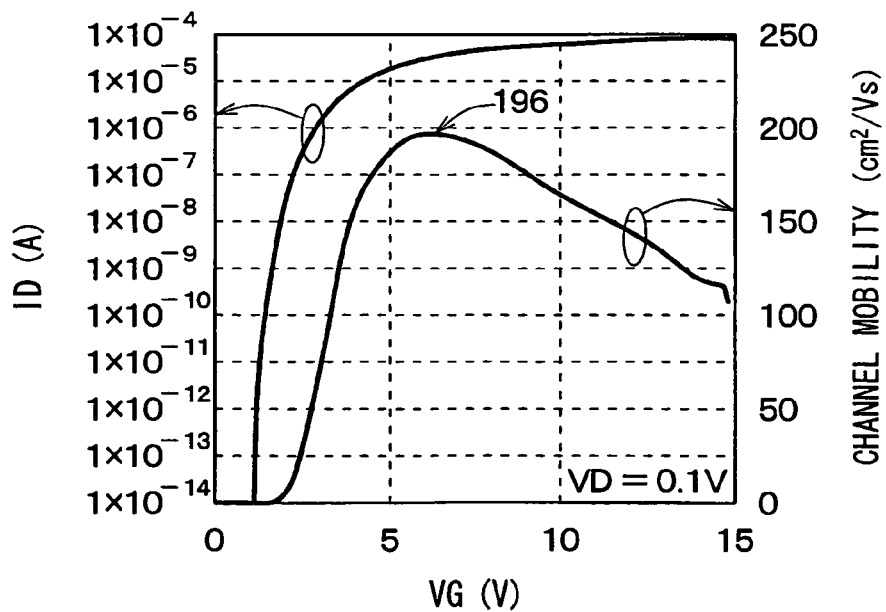
FIG. 31 is a graph showing results in which the relation of channel mobility with respect to the gate voltage and the magnitude of the drain electric current is examined.

Concretely, the verification is performed by manufacturing the MOSFET of a structure used in the experiment of FIGS. 25A and 25B. In this case, when the MOSFET of the structure used in the experiment of FIGS. 25A and 25B is manufactured, the wet atmosphere is continuously maintained until the termination-desorption temperature, and the gate oxide film is formed. A polysilicon film provided by doping n type impurities on this gate oxide film is formed and is then patterned so that a gate electrode is formed and the anneal processing using the wet atmosphere is performed. The annealing processing also provides the round-off oxidation process for rounding a corner of the gate poly silicon film. Temperatures at anneal starting and stopping times are set to 600° C., and temperature is raised and lowered in a temperature gradient of 10° C./min, and the anneal process is performed for 120 minutes at a highest temperature of 850° C. With respect to the MOSFET via such a process, channel mobility with respect to a gate voltage and the magnitude of a drain electric current are examined so that results shown in FIG. 31 are obtained.

As can be seen from this figure, channel mobility becomes 196 $cm^2$/Vs. Namely, first, channel mobility is improved by forming the gate oxide film by continuously maintaining the wet atmosphere until the termination-desorption temperature. Further, high channel mobility can be maintained by performing the anneal processing in the wet atmosphere, and channel mobility can be also further raised.

In particular, in a state in which the interface of SiC and the gate oxide film is covered with the gate electrode as after the gate electrode is formed, the thickness of a layer covering the interface is increased and the gate electrode plays a role as a cap layer. Therefore, when the anneal processing is performed under a situation in which the termination of the dangling bond due to H or OH has an advantage over the desorption, the dangling bond can be terminated by H or OH while the desorption of H or OH is further prevented by the cap layer. Therefore, there is a high possibility that channel mobility is further raised. In particular, when the gate electrode is polysilicon, hydrogen is generated by an oxidizing reaction in the wet atmosphere, and contributes to the dangling bond termination. Therefore, there is a high possibility that channel mobility is further raised.

Figure 32:
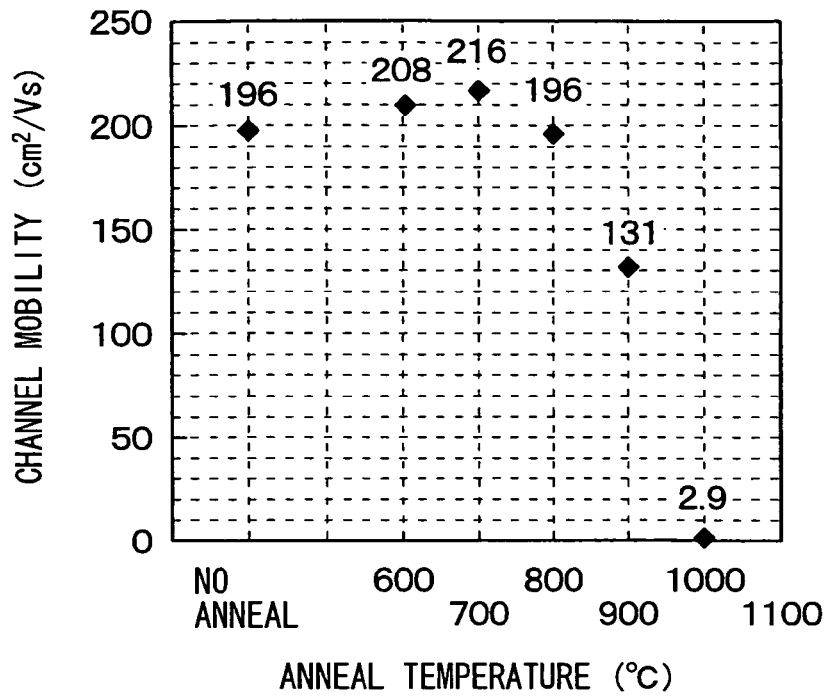
FIG. 32 is a graph showing examination results of anneal temperature dependence of channel mobility.

Similar to FIG. 28, FIG. 32 shows results in which anneal temperature dependence within an Ar atmosphere of channel mobility is examined with respect to MOSFET performing round-off oxidation. Similarly, channel mobility is improved until 700° C., and reaches 216 $cm^2$/Vs at its maximum at 700° C. When the anneal temperature is 800° C., channel mobility becomes 196 $cm^2$/Vs, and begins to be reduced. As the anneal temperature is raised from this temperature, channel mobility is suddenly reduced. When the anneal temperature becomes 1000° C., it is understood that channel mobility approximately becomes a value close to zero. It can be specified from this result that the termination-desorption temperature of the dangling bond of H or OH is 700° C. to 1000° C., particularly, 800° C. to 900° C. Further, it is also possible to confirm that moisture removing anneal of 800° C. or less, preferably, 700° C. or less is effective to improve channel mobility.

Figure 33:
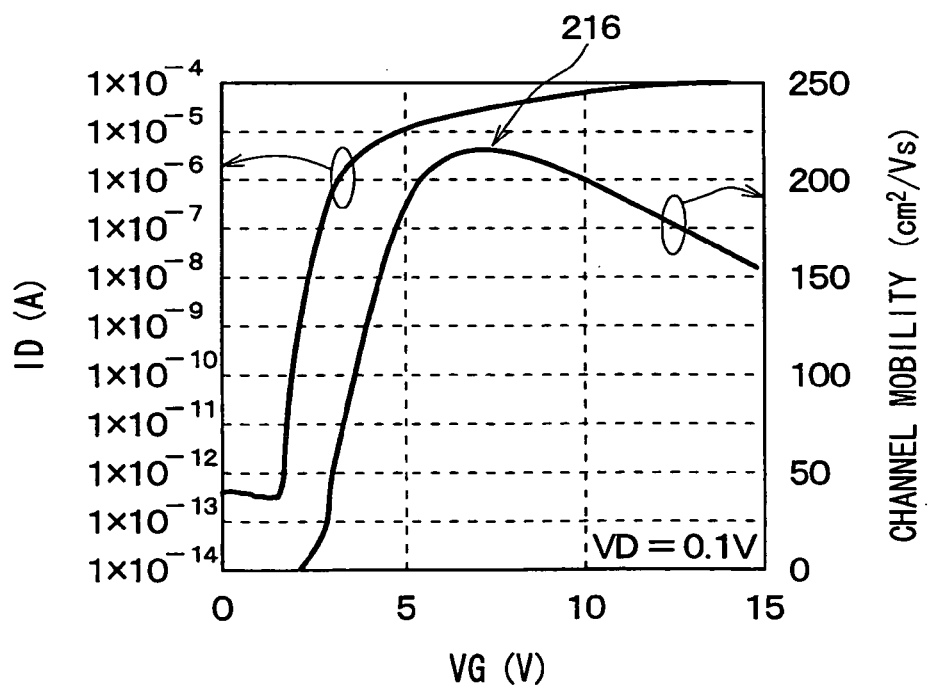
FIG. 33 is a graph showing results in which the channel mobility with respect to the gate voltage and the magnitude of the drain electric current are examined with respect to MOSFET performing Ar anneal processing of 700° C.

FIG. 33 is a view showing results in which channel mobility with respect to a gate voltage and the magnitude of a drain electric current are examined with respect to the MOSFET performing the round-off oxidation and the Ar anneal at 700° C. in this way. Channel mobility becomes 216 $cm^2$/Vs.

Further, temperature dependence of the anneal processing (wet anneal) in the wet atmosphere is considered to realize high channel mobility. Concretely, the lateral type MOSFET is manufactured and examined as follows.

In the gate insulating film forming process, a TEOS film having 100 nm is formed at 680° C. by using an LPCVD device, and the wet anneal is then performed. In the wet anneal, temperature is raised at 10° C./min in the wet atmosphere from 600° C., and is held for 10 minutes at the wet anneal temperature. Thereafter, temperature is lowered at 10° C./min until 600° C. in the wet atmosphere as it is. The wet anneal temperature is set to four levels of 1080° C., 1000° C., 950° C. and 900° C. Round-off oxidation processing of 850° C. is also further performed at all levels to raise channel mobility.

Figure 34:
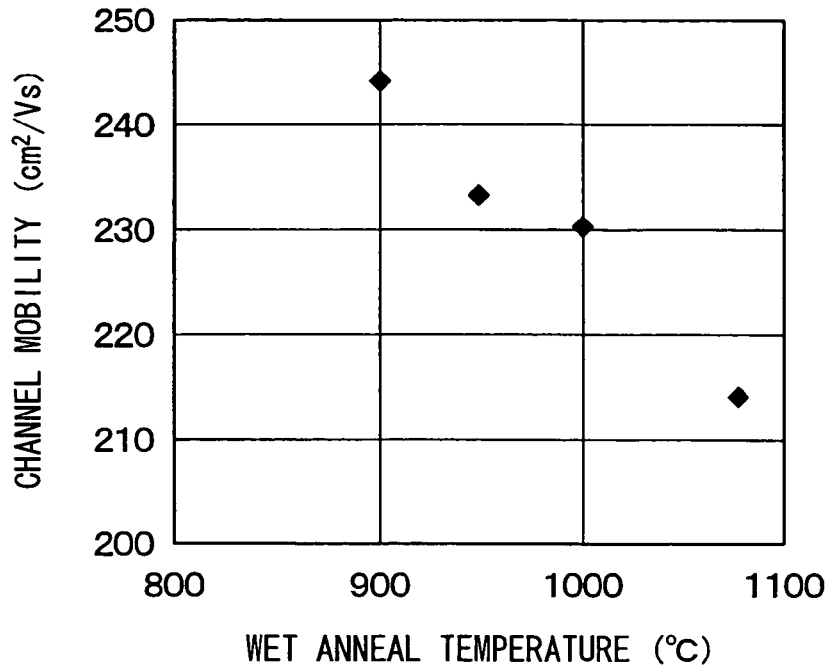
FIG. 34 is a graph showing evaluation results of the channel mobility of the lateral type MOSFET.

FIG. 34 is a view showing an evaluation result of channel mobility of the lateral type MOSFET manufactured as mentioned above. As shown in this figure, it is understood that channel mobility is raised as temperature is close to 800 to 900° C. as the termination-desorption temperature. It is also understood that channel mobility is lowered as the temperature of the wet anneal is raised. It can be the from this result that there is a high possibility that the termination effect of the dangling bond is raised as the wet anneal temperature is close to 700 to 1000° C. (particularly, 800 to 900° C.) as the termination-desorption temperature. Accordingly, it is preferable to set the wet anneal or wet oxidation temperature to 700 to 1000° C. as the termination-desorption temperature, particularly, 800 to 900° C.

Figure 35:
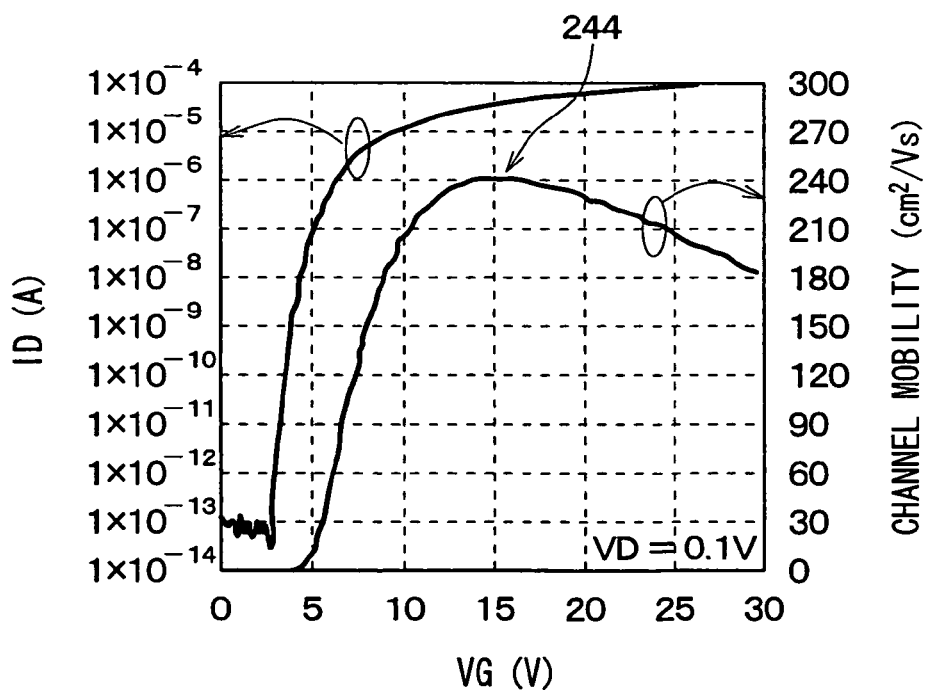
FIG. 35 is a graph showing results in which the channel mobility with respect to the gate voltage and the magnitude of the drain electric current are examined when wet anneal is performed at 900° C.

FIG. 35 is a view showing results in which channel mobility with respect to the gate voltage and the magnitude of the drain electric current are examined when the wet anneal is performed at 900° C. Channel mobility becomes a very high value of 244 $cm^2$/Vs.

Subsequently, the MOSFET of a structure used in the experiment of FIGS. 25A and 25B is also manufactured and verified with respect to a case (hydrogen anneal) using a hydrogen atmosphere instead of the wet atmosphere. When the MOSFET of the structure used in the experiment of FIGS. 25A and 25B is manufactured, the gate oxide film is formed by a recipe of FIG. 4 described later, and the hydrogen anneal is performed after the gate oxide film is formed. In a condition of the hydrogen anneal, temperature is raised at 10° C./min from 600° C. to 900° C. in the hydrogen atmosphere, and is held for 30 minutes at 900° C. within the hydrogen atmosphere. Thereafter, temperature is lowered until 600° C. at 10° C./min in the hydrogen atmosphere as it is. As a result of the evaluation of channel mobility of the completed MOSFET, a channel mobility of 186 $cm^2$/Vs is obtained and no deterioration of characteristics is caused. It can be said from this result that effects similar to those obtained by performing anneal in the wet atmosphere can be also obtained when the hydrogen anneal is performed.

Further, in the above description, the atmosphere of the gate oxide film forming process, or the atmosphere of the anneal processing is considered from the view point that the dangling bond of the interface of SiC and the gate oxide film is terminated by H or OH. However, when a device process design is made, for example, there is also a case in which a heat treatment process of high temperature exceeding 850° C.

is performed as in an interlayer insulating film reflow, etc. This case is also considered by manufacturing the MOSFET of the structure used in the experiment of FIGS. 25A and 25B.

Concretely, when the MOSFET of the structure used in the experiment of FIGS. 25A and 25B is manufactured, the wet anneal also performing the round-off oxidation of polysilicon constituting the gate is performed for 120 minutes at 850° C., and starting and stopping temperatures of the wet atmosphere are set to 600° C., and a temperature raising-lowering rate is set to 10° C./min.

Further, an interlayer insulating film is formed by forming BPSG as a film at 420° C. by plasma CVD. Thereafter, the reflow is performed for 10 minutes at 950° C. within the wet atmosphere. At this time, the starting and stopping temperatures of the wet atmosphere are set to 600° C., and the temperature raising-lowering rate is set to 10° C./min.

Figure 36:
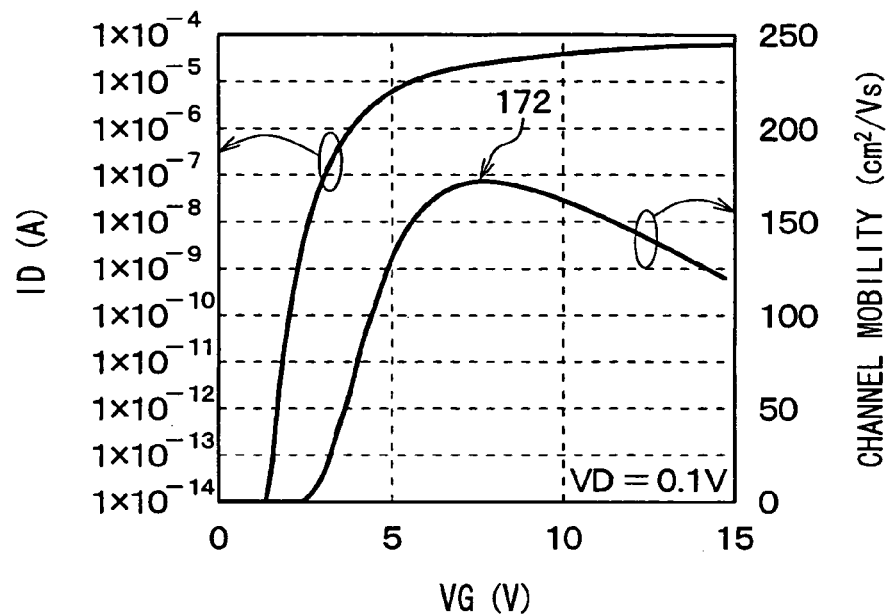
FIG. 36 is a graph showing results in which the relation of the channel mobility with respect to the gate voltage and the magnitude of the drain electric current is examined.

With respect to the MOSFET via such a process, channel mobility with respect to the gate voltage and the magnitude of the drain electric current are examined, and results shown in FIG. 36 are obtained.

When a heat treatment process except for the above gate oxide film forming process, etc. is performed in a device process design, there is also a possibility that H or OH is desorbed from the dangling bond of the interface of SiC and the gate oxide film.

However, as can be seen from FIG. 36, such a heat treatment process can be also set such that no large characteristic deterioration of 172 $cm^2/Vs$ in channel mobility is caused by using the wet atmosphere in a temperature area of 600° C. or more. Therefore, it can be said that it is possible to restrain H or OH from being desorbed from the dangling bond of the interface of SiC and the gate oxide film by performing such a heat treatment process in the wet atmosphere. Here, the heat treatment process is performed as the wet atmosphere, but similar contents are also the when the heat treatment process is performed as the hydrogen atmosphere.

Finally, verification similar to that in the above case is performed with respect to an accumulation type lateral MOSFET (e.g., see JP-A-10-308510) for forming an accumulation type channel constructed by an impurity layer of the same electric conductivity type as a source area and a drain area instead of the inversion type lateral MOSFET of the structure used in the experiment of FIGS. 25A and 25B.

Figure 37:
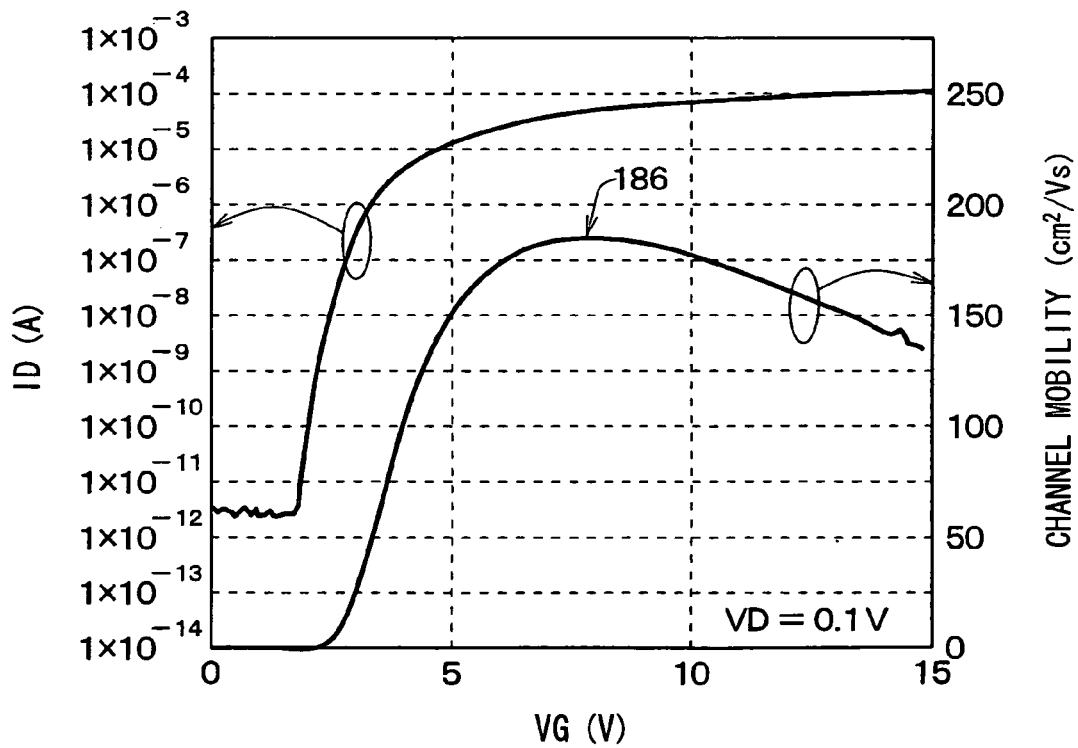
FIG. 37 is a graph showing results in which the relation of the channel mobility with respect to the gate voltage and the magnitude of the drain electric current is examined.

In FIG. 37, a gate oxide film is formed by performing wet oxidation similar to that in the conventional case. In a state in which the wet atmosphere is maintained as it is at the temperature lowering time of this gate oxide film forming process, temperature is lowered at 10° C./min until 700° C. as the termination-desorption temperature or less so that MOSFET is manufactured. Channel mobility with respect to the gate voltage and drain electric current characteristics are then examined.

As shown in this figure, the result of a high channel mobility of 186 $cm^2/Vs$ can be also obtained with respect to the accumulation type lateral MOSFET. Thus, the wet atmosphere or the hydrogen atmosphere can be also maintained until the termination-desorption temperature or less is attained in the gate oxide film forming process with respect to the semiconductor device of the accumulation type as well as the semiconductor device of the inversion type. Otherwise, the improvement of channel mobility can be intended by setting the wet atmosphere or the hydrogen atmosphere when temperature exceeds 700° C. or more in the anneal process after the gate oxide film forming process, and other heat treatment processes.

Figure 38A:
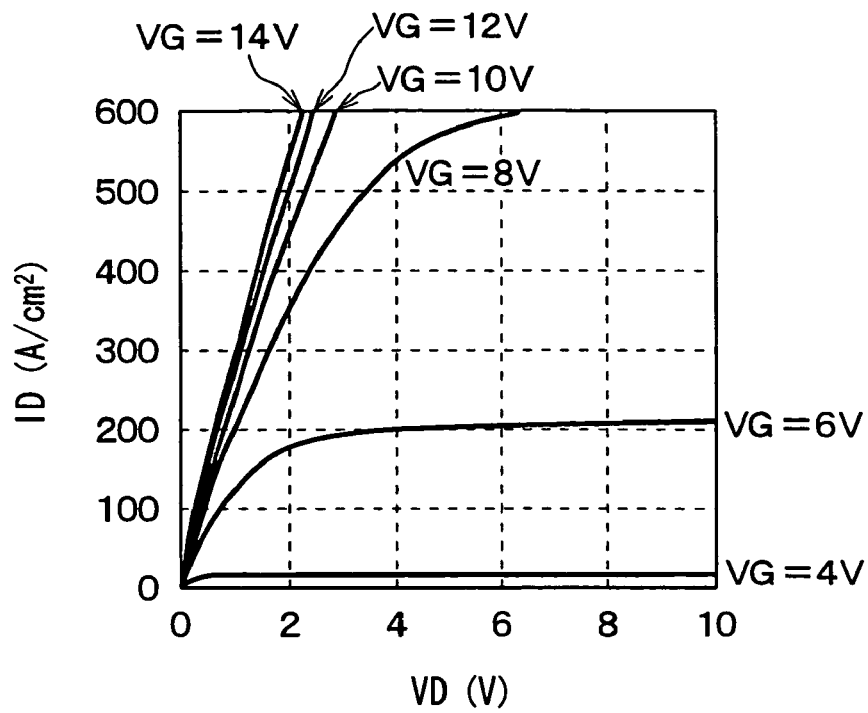
FIG. 38A is a graph showing drain voltage (VD)-drain electric current (ID) characteristics.
Figure 38B:
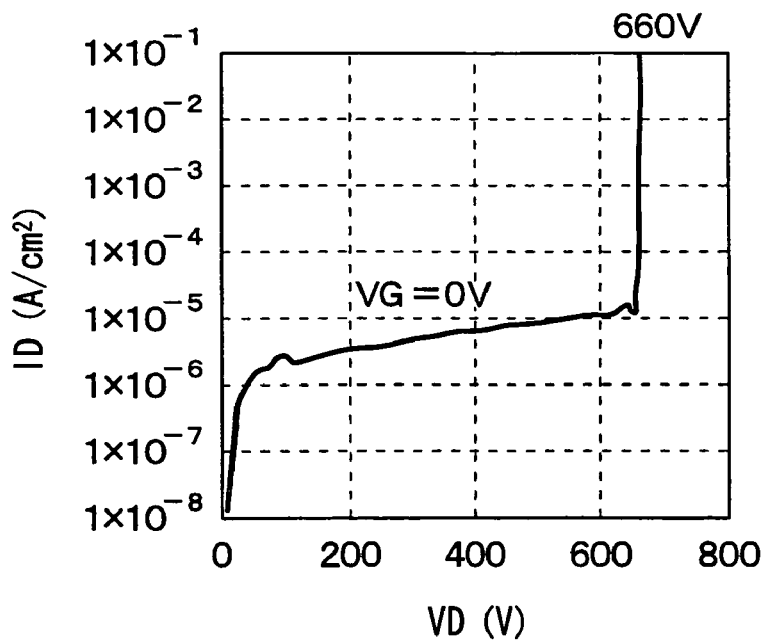
FIG. 38B is a graph showing blocking characteristics.

A planar type MOSFET of the accumulation type having 25 μm in cell pitch is manufactured and a characteristic inspection is manufactured and characteristically inspected as a reference to verify whether the MOSFET of a vertical type is operated well or not. This result is shown in FIGS. 38A and 38B. FIG. 38A shows drain voltage (VD) and drain electric current (ID) characteristics, and FIG. 38B shows blocking characteristics. As shown in these figures, the characteristics of 4.5 $m\Omega \cdot cm^2$ when gate voltage=10V and drain voltage (VD)=2V and withstand voltage 660 V when gate voltage=0V are obtained. Thus, it has been confirmed that the planar type MOSFET of the accumulation type is accurately operated.

In view of the above verification, a silicon carbide semiconductor device is provided as follows.

First Embodiment

A first embodiment mode of the present invention will be explained. In this embodiment mode, one embodiment mode of the present invention is applied to an inversion type lateral MOSFET. FIG. 1 shows a sectional construction of the inversion type lateral MOSFET. FIGS. 2 and 3 show manufacturing processes of the inversion type lateral MOSFET shown in FIG. 1. The structure of the inversion type lateral MOSFET of this embodiment mode and its manufacturing method will be explained with reference to these figures.

As shown in FIG. 1, one face side of a substrate 1 of a $p^+$ type constructed by SiC is set to a main surface, and a $p/p^+$ substrate forming a p type base layer 2 constructed by SiC epitaxially grown on the main surface is used as a semiconductor substrate. For example, the substrate 1 of the $p^+$ type is constructed by 4H—SiC and the main surface is set to face a, i.e., a (11–20)-plane and impurity concentration is set to about $5 \times 10^{18}$ $cm^{-3}$. For example, the impurity concentration of the p type base layer 2 is set to about $5 \times 10^{16}$ $cm^{-3}$. The inversion type lateral MOSFET is formed by using such a $p/p^+$ substrate in the semiconductor substrate.

A $p^+$ type base contact area (hereinafter simply called a contact area) 3 is formed in a surface layer portion of the p type base layer 2. The impurity concentration of this contact area 3 is set to be higher than that of the p type base layer 2. For example, the impurity concentration of the contact area 3 is set to a high concentration of $3 \times 10^{20}$ $cm^{-3}$ or more, and the contact area 3 is set to 0.4 μm in depth. This contact area 3 is used to fix an electric potential of the p type base layer 2.

An $n^+$ type source area 4 and an $n^+$ type drain area 5 are formed in a surface layer portion of the p type base layer 2 so as to be separated from the contact area 3. These areas are formed so as to be separated from each other. For example, these $n^+$ type source area 4 and $n^+$ type drain area 5 are set to a high concentration of $3 \times 10^{20}$ $cm^{-3}$ or more, and are set to 0.3 μm in depth.

A portion nipped by the $n^+$ type source area 4 and the $n^+$ type drain area 5 among the surface layer portion of the p type base layer 2 is set to a channel area, and a gate oxide film 6 of e.g., 52 nm in film thickness is formed so as to cover at least the surface of the channel area. A structure for terminating dangling bond by an element of H or OH is formed at the interface of this gate oxide film 6 and the p type base layer 2 constituting the channel area.

For example, a gate 7 constructed by polysilicon provided by doping n type impurities (e.g., P (phosphorus)) is patterned on the surface of the gate oxide film 6.

Further, for example, an interlayer insulating film 8 constructed by LTO is formed so as to cover the remaining portion of the gate 7 and the gate oxide film 6. Contact holes 9a to 9c connected to the contact area 3, the $n^+$ type source area 4 and the $n^+$ type drain area 5 are formed in this interlayer insulating film 8 and the gate oxide film 6, and a contact hole 9d connected to the gate 7 is formed in the interlayer insulating film 8.

A base electrode 10 for electric potential fixation electrically connected to the contact area 3, a source electrode 11 electrically connected to the n+ type source area 4, a drain electrode 12 electrically connected to the n+ type drain area 5, and a gate electrode 13 electrically connected to the gate 7 are arranged through the respective contact holes 9a to 9d so that the inversion type lateral MOSFET is constructed.

In the inversion type lateral MOSFET constructed in this way, the channel area formed in a surface layer portion of the p type base layer 2 is set to an electric current path, and an electric current is flowed between the n+ type source area 4 and the n+ type drain area 5 arranged in upper and lower streams of the electric current path. The electric current flowed to the channel area is controlled by controlling a voltage applied to the gate 7 so that the electric current flowed between the n+ type source area 4 and the n+ type drain area 5 can be controlled.

Next, a manufacturing method of the inversion type lateral MOSFET shown in FIG. 1 will be explained by using FIGS. 2 and 3.

Figure 2A:
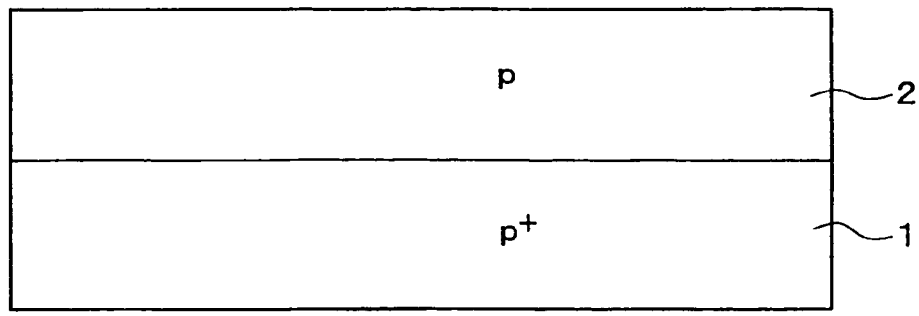
FIGS. 2A to 2C are cross sectional views showing manufacturing processes of the inversion type lateral MOSFET shown in FIG. 1.
Figure 2B:
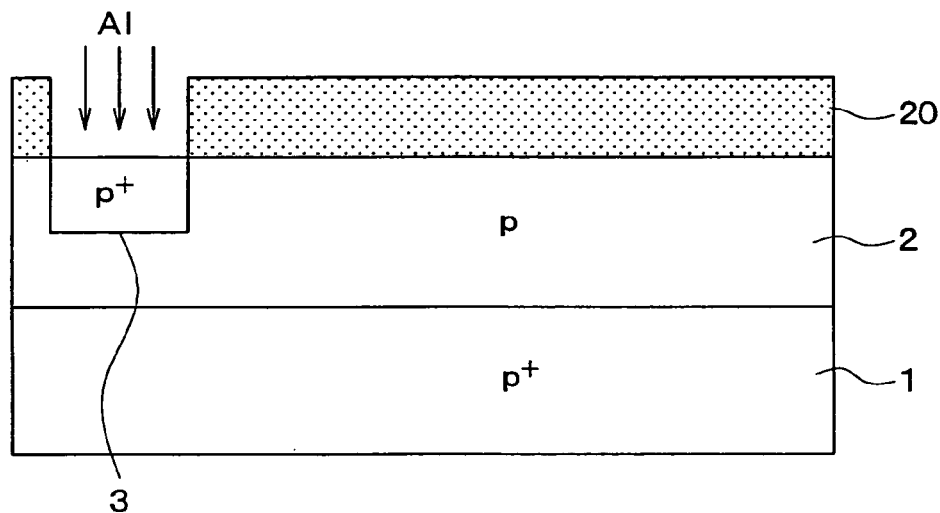

First, as shown in FIG. 2A, a semiconductor substrate constructed by the p/p+ substrate formed by the substrate 1 of the p+ type and the p type base layer 2 is prepared. As shown in FIG. 2B, for example, LTO 20 is then formed as a film in this semiconductor substrate, concretely, on the surface of the p type base layer 2. LTO 20 is opened on a forming schedule area of the contact area 3 via a photolithography process. Thereafter, for example, Al (aluminum) ions are implanted as p type impurities.

Figure 2C:
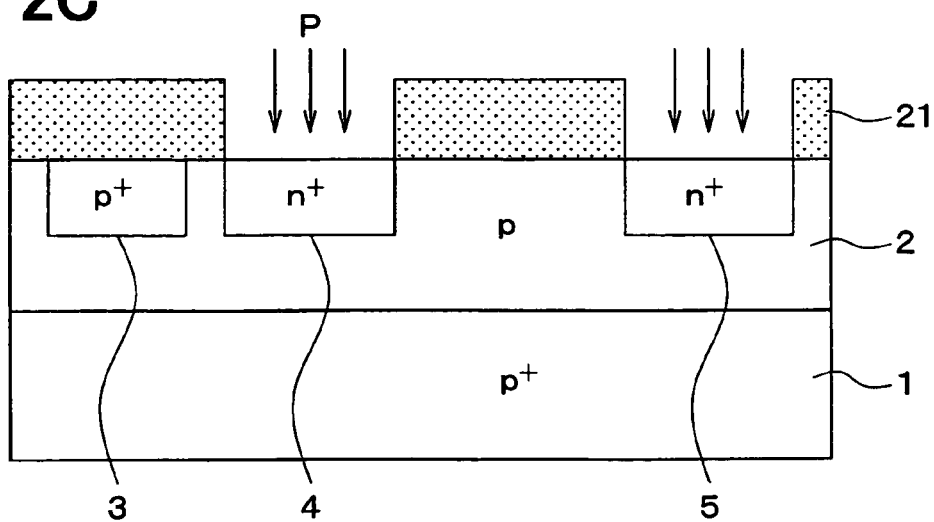

Next, after LTO 20 is removed, for example, LTO 21 is again formed as a film as shown in FIG. 2C. LTO 21 is opened on a forming schedule area of the n+ type source area 4 and the n+ type drain area 5 via the photolithography process. Thereafter, for example, P (phosphorus) ions are implanted as n type impurities.

Thereafter, after LTO 21 is removed, for example, activation anneal is performed for 30 minutes at 1600° C. so that the implanted p type impurities and n type impurities are activated. Thus, the contact area 3, the n+ type source area 4 and the n+ type drain area 5 are formed.

Figure 4:
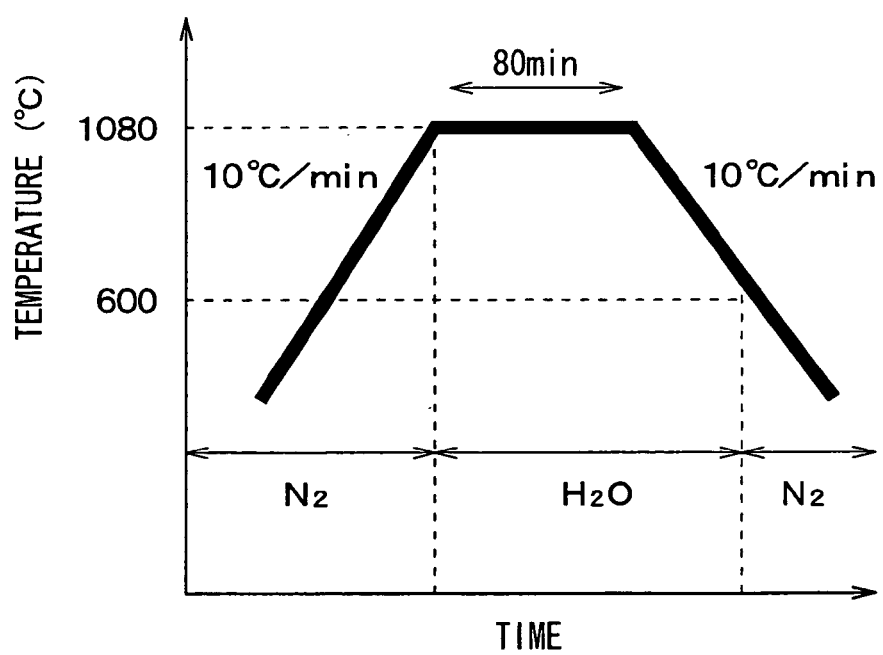
FIG. 4 is a graph schematically showing atmosphere and temperature controls of a gate oxide film forming process.
Figure 3A:
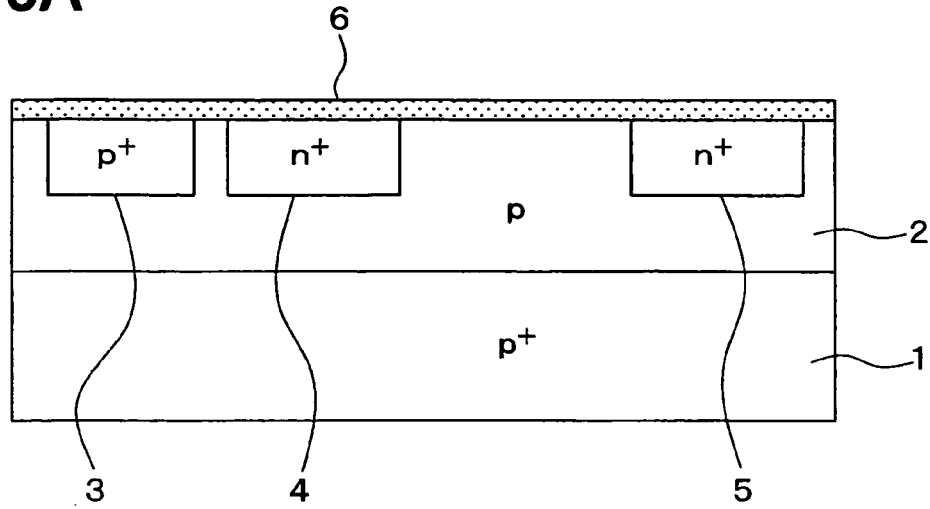
FIGS. 3A to 3C are cross sectional views showing manufacturing processes of the inversion type lateral MOSFET subsequent to FIGS. 2A to 2C.

Subsequently, a gate oxide film forming process is performed, and a gate oxide film 6 is formed as shown in FIG. 3A. Concretely, the gate oxide film 6 is formed by gate oxidation using a pyrogenic method using a wet atmosphere. At this time, atmosphere and temperature controls of the gate oxide film forming process are performed as shown in FIG. 4.

Namely, temperature rises in a temperature gradient of 10° C./min as a nitrogen ($N_2$) atmosphere from room temperature to 1080° C. When temperature reaches 1080° C., the atmosphere is set to a wet ($H_2O$) atmosphere, and this temperature is held for 80 minutes. Thus, for example, the gate oxide film 6 having 52 nm in film thickness is formed. Thereafter, while the wet atmosphere is maintained, temperature is lowered at 10° C./min. At this time, the wet atmosphere is maintained until temperature is lowered to 600° C. or less. This temperature is not limited to 600° C., but may be also set to 800° C. or less as termination-desorption temperature or less, preferably, 700° C. or less.

Figure 5:
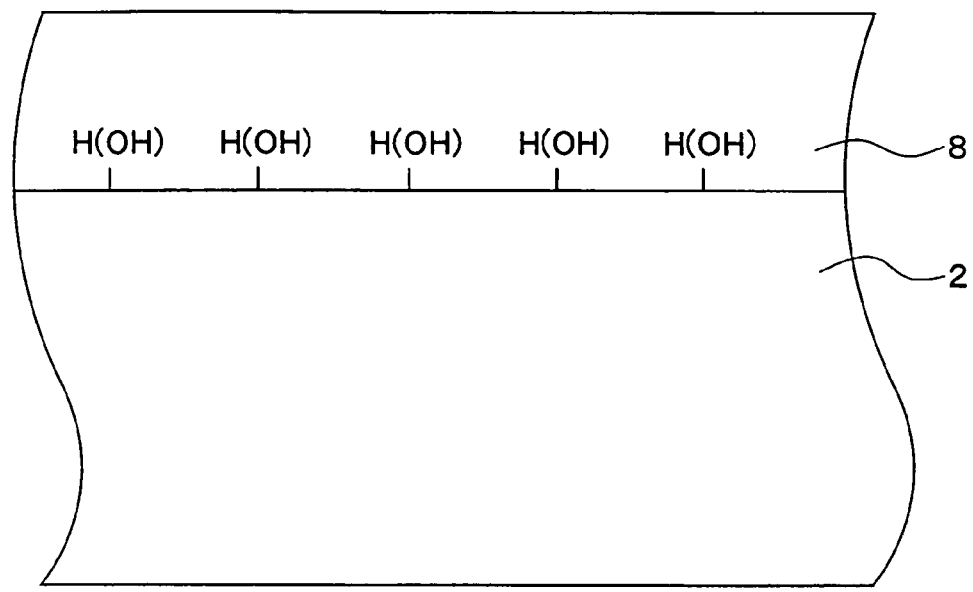
FIG. 5 is a typical schematic view showing a situation in which dangling bond of the interface of a gate oxide film 6 and a p type base layer 2 constituting a channel area is terminated by an element of H or OH.

Thus, the wet atmosphere is maintained at a temperature lowering time of the gate oxide film forming process. Thus, a structure for terminating dangling bond by an element of H or OH is formed at the interface of the gate oxide film 6 and the p type base layer 2 constituting the channel area. FIG. 5 typically shows its situation. As shown in this figure, for example, a state in which H or OH enters the gate oxide film 6 formed on the surface of the p type base layer 2 is attained.

Figure 3B:
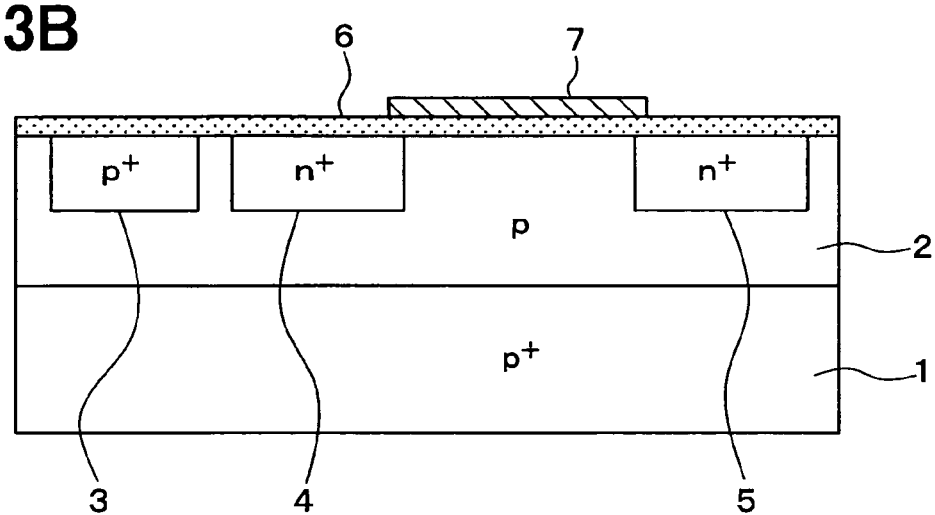

Thereafter, as shown in FIG. 3B, a polysilicon layer provided by doping n type impurities on the surface of the gate oxide film 6 is formed as a film under a temperature of 600° C. Thereafter, a gate 7 is formed by patterning using an unillustrated resist.

Figure 3C:
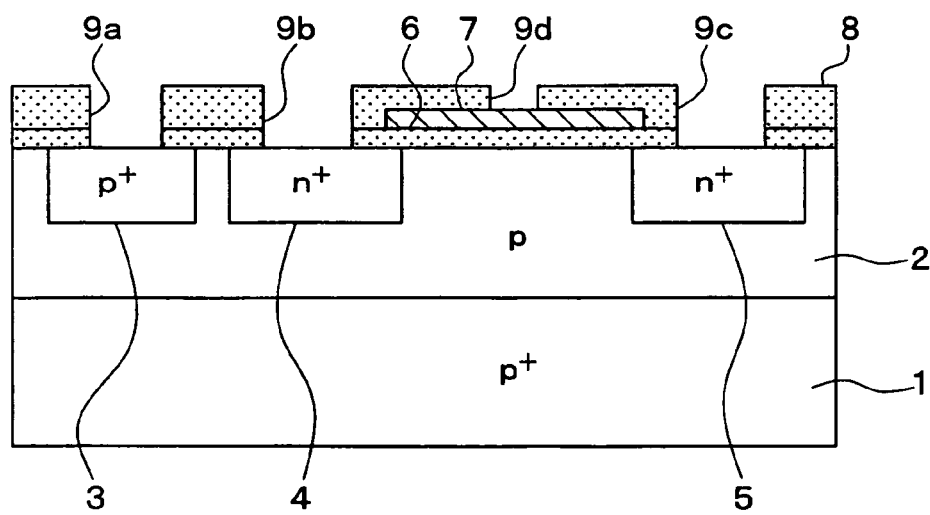

Further, as shown in FIG. 3C, for example, an interlayer insulating film 8 constructed by LTO is formed at 420° C., and is patterned. Thus, contact holes 9a to 9c connected to the contact area 3, the n+ type source area 4 and the n+ type drain area 5 are formed in the interlayer insulating film 8 and the gate oxide film 6, and a contact hole 9d connected to the gate 7 is formed in the interlayer insulating film 8.

A Ni (nickel) film is then formed so as to bury the interior of the contact holes 9a to 9d, and is then patterned so that various kinds of electrodes 10 to 13 are formed. At this time, since the contact area 3, the n+ type source area 4 and the n+ type drain area 5 are set to high concentrations as mentioned above, these areas come in ohmic contact with various kinds of electrodes 10 to 13 without performing a heat treatment process, etc. Thus, the inversion type lateral MOSFET shown in FIG. 1 is completed.

In the manufacturing method of the inversion type lateral MOSFET explained above, as mentioned above, temperature is lowered until the termination-desorption temperature or less while the wet atmosphere is maintained at the temperature lowering time of the gate oxide film forming process. Therefore, dangling bond at the interface of the gate oxide film 6 and the p type base layer 2 constituting the channel area can be terminated by an element of H or OH. Therefore, the inversion type lateral MOSFET of high channel mobility can be set.

Further, the forming process of the interlayer insulating film 8 and the forming processes of various kinds of electrodes 10 to 13 are performed after the gate oxide film forming process. However, the temperatures of all the processes are set to be less than the termination-desorption temperature of H or OH. Therefore, it is possible to prevent H or OH from being desorbed from the dangling bond of the interface of the gate oxide film 6 and the p type base layer 2 constituting the channel area by these processes. Thus, a reduction of the channel mobility can be prevented.

Second Embodiment Mode

A second embodiment mode of the present invention will be explained. In this embodiment mode, one embodiment mode of the present invention is also applied to the inversion type lateral MOSFET. However, this embodiment mode differs from the first embodiment mode in that the manufacturing method of the inversion type lateral MOSFET is partially changed. The structure of the inversion type lateral MOSFET, etc. in this embodiment mode are similar to those in the first embodiment mode. The inversion type lateral MOSFET of this embodiment mode will next be explained. However, the explanation will be made with respect to only different points from the first embodiment mode, and is omitted with respect to portions similar to those of the first embodiment mode.

Figure 6:
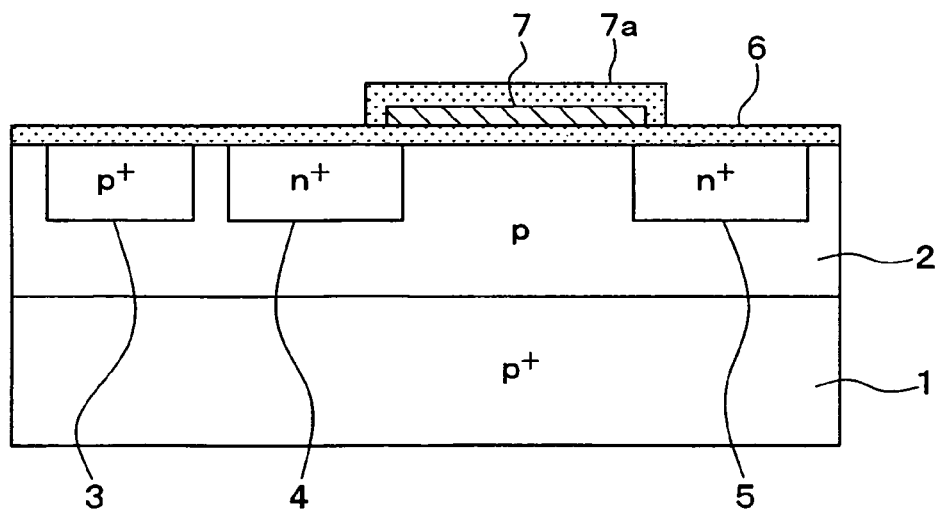
FIG. 6 is a cross sectional view showing a manufacturing process of an inversion type lateral MOSFET shown in a second embodiment mode of the present invention.

The inversion type lateral MOSFET of this embodiment mode is manufactured by adding a manufacturing process shown in FIG. 6 to the manufacturing method of the inversion type lateral MOSFET shown in FIGS. 2 and 3 in the first embodiment mode.

Namely, after respective processes shown in FIGS. 2A to 2C and FIGS. 3A and 3B are performed, processing shown in FIG. 6 is performed. Thereafter, processing shown in FIG.

3C, etc. are performed. Thus, the inversion type lateral MOSFET of a structure similar to that of the first embodiment mode is manufactured.

Concretely, round oxidation of the surface of the gate 7 formed in the process shown in FIG. 3B is performed in the process shown in FIG. 6. For example, oxidation (wet oxidation) is performed within the wet atmosphere at 850° C. for 120 minutes. An oxide film 7a is formed on the surface of the gate 7, and the surface of the gate 7 is rounded.

Figure 7:
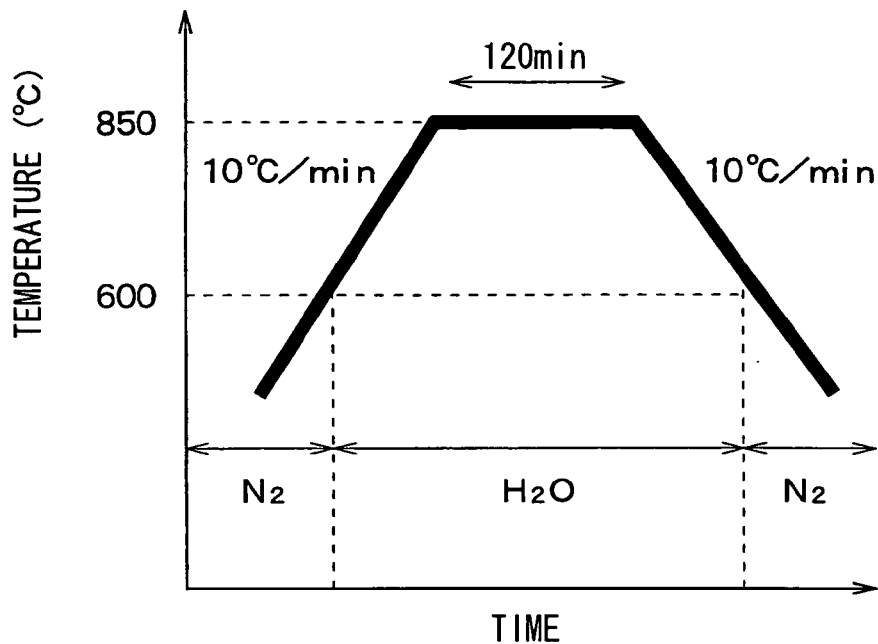
FIG. 7 is a graph schematically showing atmosphere and temperature controls of the round-off oxidation process of the gate.

At this time, atmosphere and temperature controls of the wet oxidation are performed as shown in FIG. 7.

Namely, temperature is raised in a temperature gradient of 10° C./min as a nitrogen ($N_2$) atmosphere from room temperature to 600° C. (less than termination-desorption temperature). When temperature reaches 600° C., the wet ($H_2O$) atmosphere is set and temperature is raised in the same temperature gradient until 850° C. When temperature reaches 850° C., this temperature is held for 120 minutes so that an oxide film 7a is formed on the surface of the gate 7. Thereafter, temperature is lowered at 10° C./min while the wet atmosphere is maintained as it is. At this time, the wet atmosphere is maintained until temperature is lowered to 600° C. When temperature reaches 600° C., it is again returned from the wet atmosphere to a nitrogen atmosphere, and temperature is lowered until the room temperature. The starting and stopping temperatures of this wet atmosphere are not limited to 600° C., but may be also set to 800° C. or less as the termination-desorption temperature or less, preferably, 700° C. or less.

Thus, the wet atmosphere is maintained when the termination-desorption temperature or more is attained in the round-off oxidation of the gate 7. Thus, it is possible to prevent that an element of H or OH is desorbed from the dangling bond of the interface of the gate oxide film 6 and the p type base layer 2 constituting the channel area.

Accordingly, when heat treatment is taken at high temperature after the gate oxide film forming process as in this embodiment mode, the wet atmosphere is set when the termination-desorption temperature or more is attained. Thus, the improvement of channel mobility can be intended.

Further, such round-off oxidation is performed in a state in which the gate oxide film 6 is covered with the gate 7. Therefore, the gate 7 plays a role as a cap layer. Therefore, when an anneal process is performed under a situation in which the termination of the dangling bond due to H or OH has an advantage over the desorption, the dangling bond can be terminated by H or OH while the desorption of H or OH is further prevented by the cap layer. Therefore, there is a high possibility that channel mobility is further raised. In particular, in the case of polysilicon, hydrogen is generated by an oxidizing reaction in the wet atmosphere, and contributes to the dangling bond termination. Therefore, there is a high possibility that channel mobility is further raised.

Third Embodiment Mode

A third embodiment mode of the present invention will be explained. In this embodiment mode, one embodiment mode of the present invention is also applied to the inversion type lateral MOSFET. However, this embodiment mode differs from the first or second embodiment mode in that the manufacturing method of the inversion type lateral MOSFET is partially changed. The structure of the inversion type lateral MOSFET, etc. in this embodiment mode are similar to those in the first or second embodiment mode. The inversion type lateral MOSFET of this embodiment mode will next be explained. However, only different points from the first or second embodiment mode will be explained, and the explanations of portions similar to those of the first or second embodiment mode are omitted.

Figure 8A:
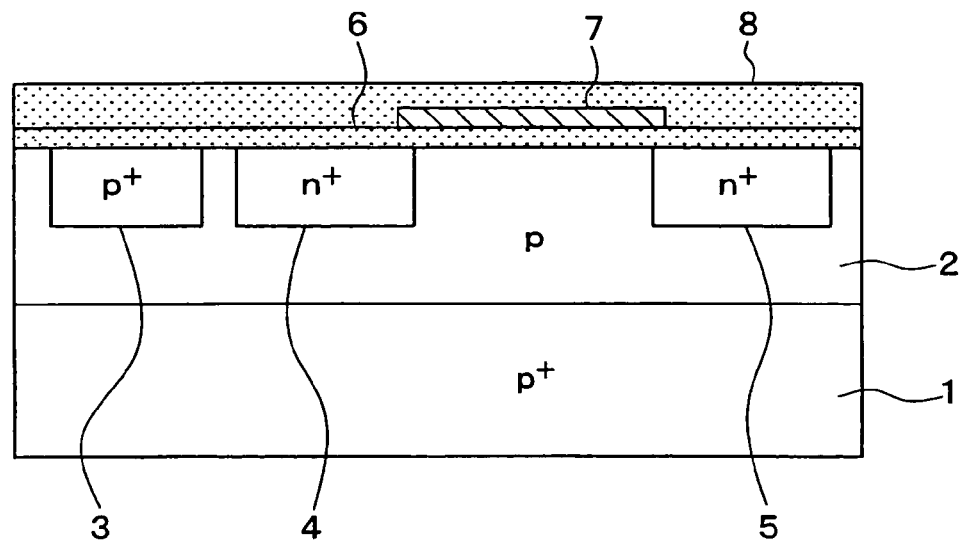
FIGS. 8A and 8B are cross sectional views showing manufacturing processes of an inversion type lateral MOSFET shown in a third embodiment mode of the present invention.
Figure 8B:
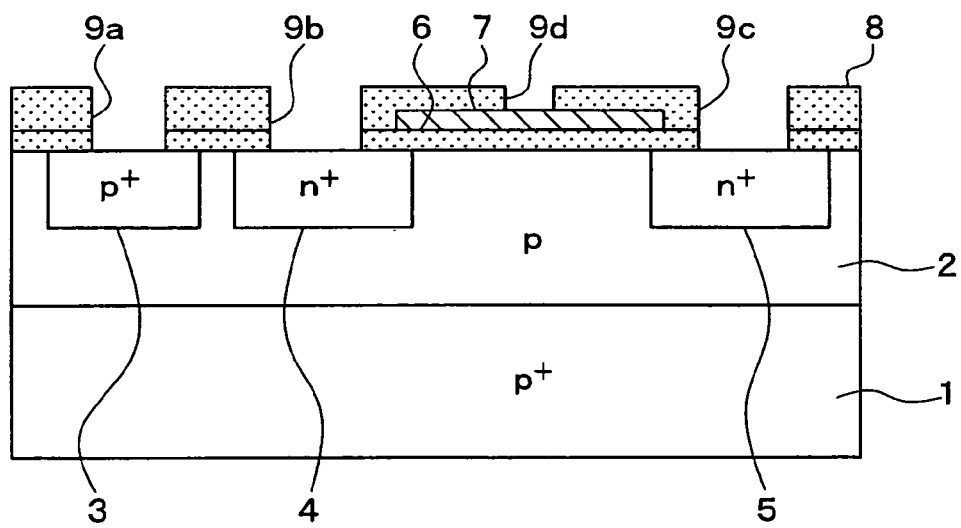

The inversion type lateral MOSFET of this embodiment mode is manufactured by changing the forming process of the interlayer insulating film 8 shown in FIG. 3C to processes shown in FIGS. 8A and 8B among the manufacturing method of the inversion type lateral MOSFET shown in the above FIGS. 2 to 3 (and FIG. 6).

Namely, after the respective processes shown in FIGS. 2A to 2C and FIGS. 3A and 3B are performed (or, after the processing shown in FIG. 6 is further performed), processings shown in FIGS. 8A and 8B are performed instead of the processing shown in FIG. 3C. Thus, the inversion type lateral MOSFET of a structure similar to that of each of the first and second embodiment modes is manufactured.

Concretely, in a process shown in FIG. 8A, an interlayer insulating film 8 is formed as a film on the surfaces (or the surfaces of the oxide film 7a and the gate oxide film 6 formed in the process shown in FIG. 6) of the gate 7 and the gate oxide film 6 formed in the process shown in FIG. 3B. Thereafter, contact holes 9a to 9d are formed in the interlayer insulating film 8 and the gate oxide film 6 as shown in FIG. 8B.

Figure 9:
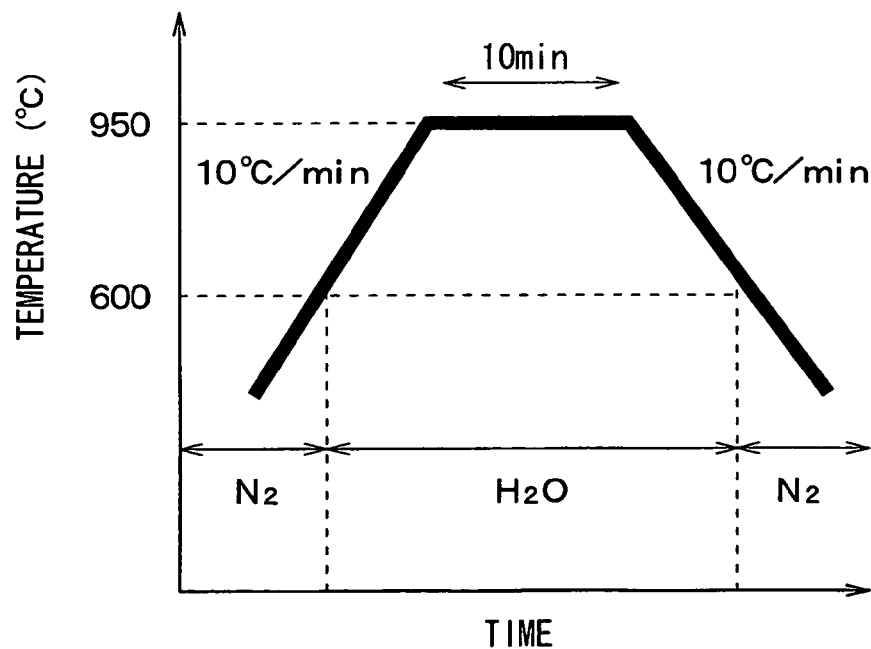
FIG. 9 is a graph schematically showing atmosphere and temperature controls of the reflow process of the interlayer insulating film.

At this time, PSG is formed as a film at 420° C. by e.g., plasma CVD in the process shown in FIG. 8A. Thereafter, for example, a reflow is performed within the wet atmosphere at 950° C. for 10 minutes so that the interlayer insulating film 8 is formed. The atmosphere and temperature controls of the wet oxidation at this time are performed as shown in FIG. 9.

Namely, temperature is raised in a temperature gradient of 10° C./min as a nitrogen ($N_2$) atmosphere from the room temperature to 600° C. (less than the termination-desorption temperature). When temperature reaches 600° C., the wet ($H_2O$) atmosphere is set and temperature is raised in the same temperature gradient until 950° C. When temperature reaches 950° C., the reflow process is performed by holding this temperature for 10 minutes. Thereafter, while the wet atmosphere is maintained, temperature is lowered at 10° C./min. At this time, the wet atmosphere is maintained until temperature is lowered to 600° C. When temperature reaches 600° C., it is again returned from the wet atmosphere to the nitrogen atmosphere, and temperature is lowered until the room temperature. The starting and stopping temperatures of this wet atmosphere are not limited to 600° C., but may be also set to 800° C. or less as the termination-desorption temperature or less, preferably 700° C. or less. Further, a hydrogen atmosphere may be also set instead of the wet atmosphere as another method. In this case, temperature is raised in a temperature gradient of 10° C./min as the nitrogen ($N_2$) atmosphere from the room temperature to 600° C. (less than the termination-desorption temperature). When temperature then reaches 600° C., the hydrogen atmosphere is set and temperature is raised in the same temperature gradient until 950° C. When temperature reaches 950° C., the reflow process is performed by holding this temperature for 10 minutes. Thereafter, while the hydrogen atmosphere is maintained, temperature is lowered at 10° C./min. At this time, the hydrogen atmosphere is maintained until temperature is lowered to 600° C. When temperature reaches 600° C., it is again returned from the hydrogen atmosphere to the nitrogen atmosphere, and temperature is lowered until the room temperature. The starting and stopping temperatures of this hydrogen anneal are not limited to 600° C., but may be also set to 800° C. or less as the termination-desorption temperature or less, preferably, 700° C. or less.

Thus, the wet atmosphere or the hydrogen atmosphere is maintained when the termination-desorption temperature or more in the reflow process of the interlayer insulating film 8 is attained. Thus, it is possible to prevent H or OH from being desorbed from the dangling bond of the interface of the gate oxide film 6 and the p type base layer 2 constituting the channel area.

Accordingly, when heat treatment is taken at high temperature after the gate oxide film forming process as in this embodiment mode, the wet atmosphere or the hydrogen atmosphere is also set when the termination-desorption temperature or more is attained. Thus, the improvement of channel mobility can be intended.

Further, such a reflow process is performed in a state in which the gate oxide film 6 is covered with plural films of the gate 7, etc. Therefore, the plural films of the gate 7, etc. play a role as a cap layer. Therefore, when the anneal process is performed under a situation in which the termination of the dangling bond due to H or OH has an advantage over the desorption, the dangling bond can be terminated by H or OH while the desorption of H or OH is further prevented by the cap layer. Therefore, channel mobility can be further raised.

Fourth Embodiment Mode

Figure 10:
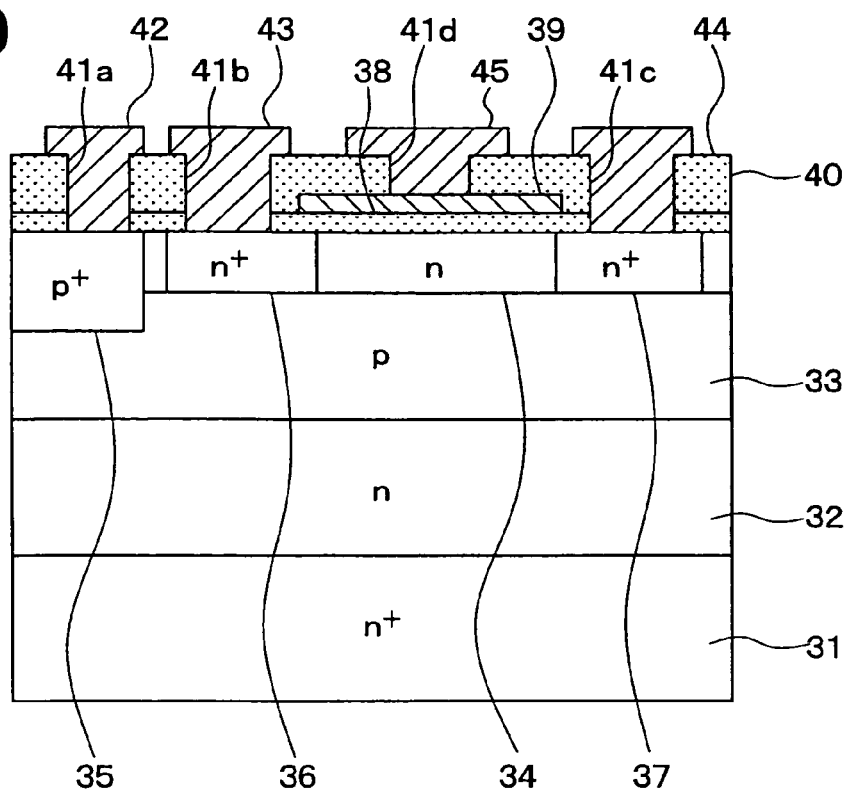
FIG. 10 is a cross sectional view showing the sectional construction of an accumulation type lateral MOSFET to which a fourth embodiment mode of the present invention.

A fourth embodiment mode of the present invention will be explained. In this embodiment mode, one embodiment mode of the present invention is applied to an accumulation type lateral MOSFET. FIG. 10 shows a sectional construction of the accumulation type lateral MOSFET. FIGS. 11 to 13 show manufacturing processes of the accumulation type lateral MOSFET shown in FIG. 10. The structure and manufacturing method of the accumulation type lateral MOSFET of this embodiment mode will be explained with reference to these figures.

As shown in FIG. 10, the accumulation type lateral MOSFET is formed in a substrate 31 of the n$^+$ type constructed by SiC with one face side as a main surface. For example, the substrate 31 of the n$^+$ type is constructed by 4H—SiC, and the main surface is set to face a, i.e., a (11–20)-plane, and impurity concentration is set to about $5 \times 10^{18}$ cm$^{-3}$.

An n type drift layer 32 constructed by SiC epitaxially grown is formed on the main surface of this substrate 31. For example, the n type drift layer 32 is set to about $1 \times 10^{16}$ cm$^{-3}$ in impurity concentration, and 10 μm in thickness.

A p type base layer 33 is formed in a surface layer portion of the n type drift layer 32. For example, this p type base layer 33 is set to about $1 \times 10^{19}$ cm$^{-3}$ and 0.7 μm in depth.

An n type channel layer (hereinafter called a channel epitaxial layer) 34 for constructing a channel area epitaxially grown is formed on the p type base layer 33. For example, this channel epitaxial layer 34 is set to about $1 \times 10^{16}$ cm$^{-3}$ in concentration and 0.3 μm in film thickness (depth).

A contact area 35 of the p$^+$ type is formed so as to pass through this channel epitaxial layer 34 and reach the p type base layer 33. For example, this contact area 35 is set to a high concentration of $3 \times 10^{20}$ cm$^{-3}$ or more, and 0.4 μm in depth.

An n$^+$ type source area 36 and an n$^+$ type drain area 37 are formed on both sides through the channel epitaxial layer 34 so as to be separated from this contact area 35. These areas 36 and 37 are formed so as to be separated from each other. For example, these n$^+$ type source area 36 and n$^+$ type drain area 37 are set to a high concentration of $3 \times 10^{20}$ cm$^{-3}$ or more, and 0.3 μm in depth.

Further, a portion nipped by the n$^+$ type source area 36 and the n$^+$ type drain area 37 among a surface layer portion of the channel epitaxial layer 34 is set to a channel area, and a gate oxide film 38 of e.g., 38 nm in film thickness is formed so as to cover at least the surface of the channel area. A structure for terminating the dangling bond by an element of H or OH is formed at the interface of this gate oxide film 38 and the channel epitaxial layer 34 constituting the channel area.

For example, a gate 39 constructed by polysilicon formed by doping n type impurities (e.g., P (phosphorus)) is patterned on the surface of the gate oxide film 38.

Further, an interlayer insulating film 40 constructed by e.g., LTO is formed so as to cover the remaining portion of the gate 39 and the gate oxide film 38. Contact holes 41a to 41c connected to the contact area 35, the n$^+$ type source area 36 and the n$^+$ type drain area 37 are formed in these interlayer insulating film 40 and gate oxide film 38. A contact hole 41d connected to the gate 39 is formed in the interlayer insulating film 40.

A base electrode 42 for electric potential fixation electrically connected to the contact area 35, a source electrode 43 electrically connected to the n$^+$ type source area 36, a drain electrode 44 electrically connected to the n$^+$ type drain area 37, and a gate electrode 45 electrically connected to the gate 39 are arranged through the respective contact holes 41a to 41d so that the accumulation type lateral MOSFET is constructed.

In the accumulation type lateral MOSFET constructed in this way, the channel epitaxial layer 34, i.e., the channel area is set to an electric current path, and an electric current is flowed between the n$^+$ type source area 36 and the n$^+$ type drain area 37 arranged in upper and lower streams of the electric current path. The width of a depletion layer formed in the channel area is then controlled by controlling a voltage applied to the gate 39 and the electric current flowed to this depletion layer is controlled so that the electric current flowed between the n$^+$ type source area 36 and the n$^+$ type drain area 37 can be controlled.

The manufacturing method of the accumulation type lateral MOSFET shown in FIG. 10 will next be explained by using FIGS. 11 to 13.

Figure 11A:
FIGS. 11A to 11D are cross sectional views showing manufacturing processes of the accumulation type lateral MOSFET shown in FIG. 10.
Figure 11B:
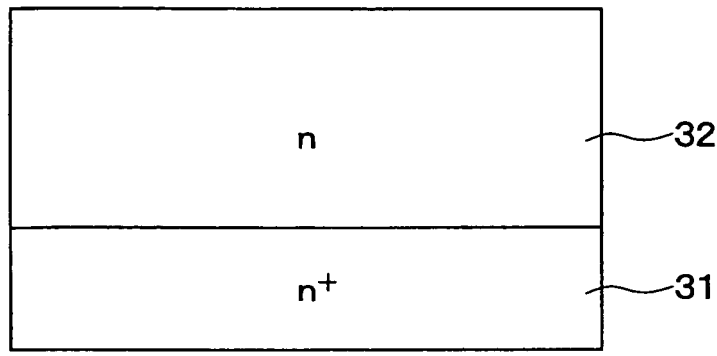

First, as shown in FIG. 11A, a substrate 31 of the n$^+$ type is prepared. As shown in FIG. 11B, an n type drift layer 32 is epitaxially grown on the main surface of the substrate 31 such that the n type drift layer 32 has about $1 \times 10^{16}$ cm$^{-3}$ in impurity concentration and 10 μm in thickness.

Figure 11C:
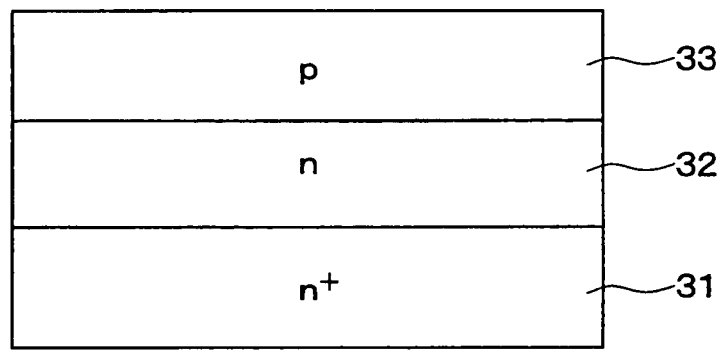
Figure 11D:
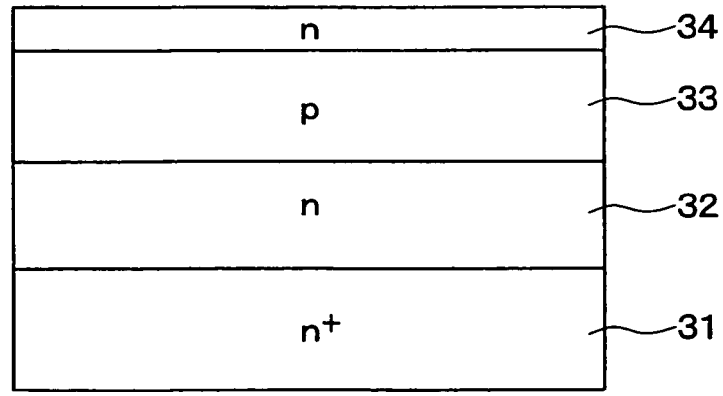

Thereafter, as shown in FIG. 11C, Al ions as p type impurities are implanted into a surface layer portion of the n type drift layer 32. Thereafter, activation anneal is performed at 1600° C. for 30 minutes. Thus, for example, a p type base layer 33 having about $1 \times 10^{19}$ cm$^{-3}$ in impurity concentration and 0.7 μm in depth is formed. As shown in FIG. 11D, for example, a channel epitaxial layer 34 having about $1 \times 10^{16}$ cm$^{-3}$ in concentration and 0.3 μm in film thickness (depth) is epitaxially grown on this p type base layer 33.

Figure 12A:
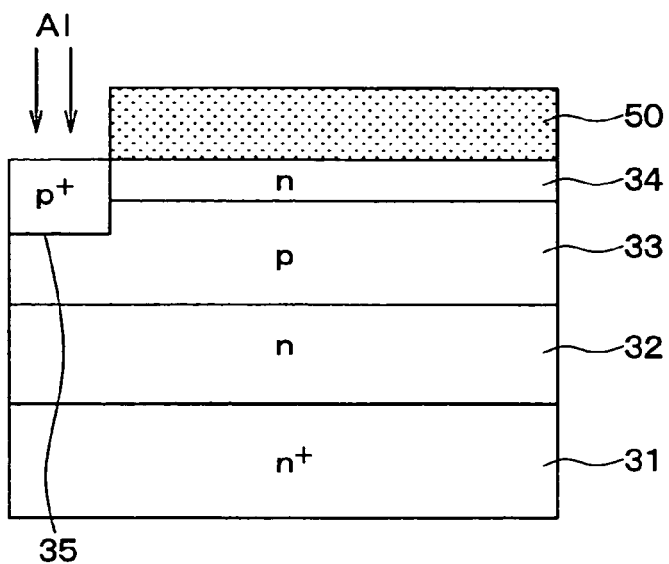
FIGS. 12A to 12C are cross sectional views showing manufacturing processes of the accumulation type lateral MOSFET subsequent to FIGS. 11A to 11D.

Next, as shown in FIG. 12A, for example, LTO 50 is formed as a film, and is then opened in a forming schedule area of the contact area 35 via a photolithography process. Al ions are then implanted with LTO 50 as a mask.

Figure 12B:
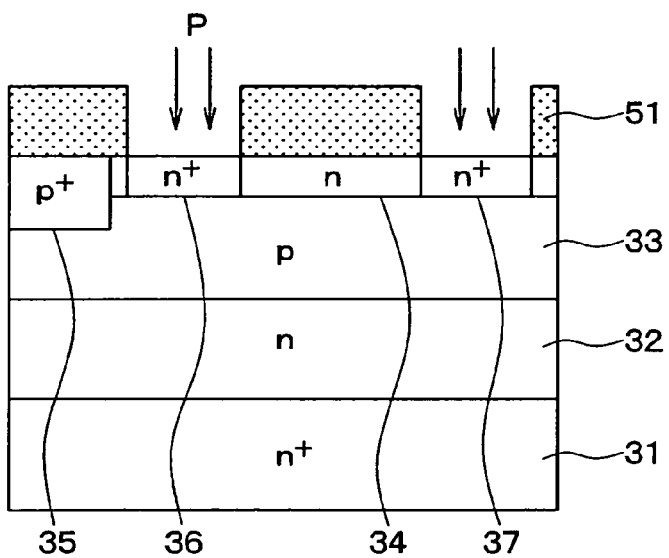

Further, after LTO 50 is removed, for example, LTO 51 is again formed as a film as shown in FIG. 12B, and is opened on a forming schedule area of the n$^+$ type source area 36 and the n$^+$ type drain area 37 via a photolithography process. Thereafter, for example, P ions are implanted as n type impurities.

Thereafter, after LTO 51 is removed, for example, activation anneal is performed at 1600° C. for 30 minutes so that the implanted p type impurities and n type impurities are activated. Thus, the contact area 35, the n$^+$ type source area 36 and the n$^+$ type drain area 37 are formed.

Figure 12C:
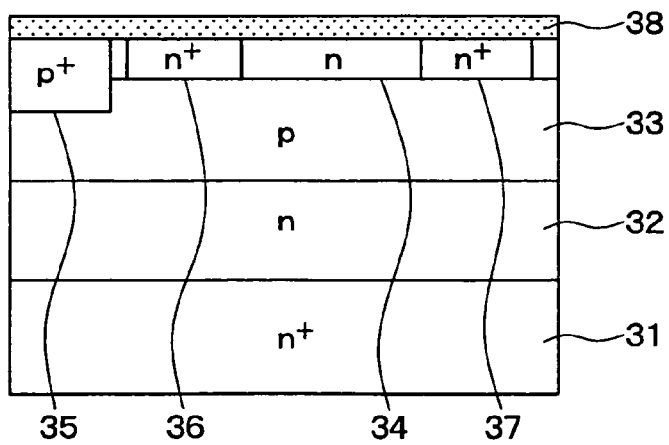

Subsequently, a gate oxide film forming process is performed, and a gate oxide film 38 is formed as shown in FIG. 12C. Concretely, the gate oxide film 38 is formed by gate oxidation using the pyrogenic method using the wet atmosphere. At this time, atmosphere and temperature controls of the gate oxide film forming process are performed as shown in FIG. 4 shown in the first embodiment mode. However, time for holding a temperature of 1080° C. is set to 60 minutes, and switching temperature from the wet atmosphere at a temperature lowering time to the nitrogen atmosphere is set to 700° C.

Namely, temperature is raised in a temperature gradient of 10° C./min as the nitrogen ($N_2$) atmosphere from the room temperature to 1080° C. When temperature reaches 1080° C., the wet ($H_2O$) atmosphere is set and this temperature is held for 60 minutes. Thus, for example, a gate oxide film 38 having 38 nm in film thickness is formed. Thereafter, while the wet atmosphere is maintained, temperature is lowered at 10° C./min. At this time, the wet atmosphere is maintained until temperature is lowered to 700° C. or less.

Thus, the wet atmosphere is maintained at the temperature lowering time of the gate oxide film forming process. Thus, a structure for terminating dangling bond by an element of H or OH is formed at the interface of the gate oxide film 38 and the channel epitaxial layer 34 constituting the channel area.

Figure 13A:
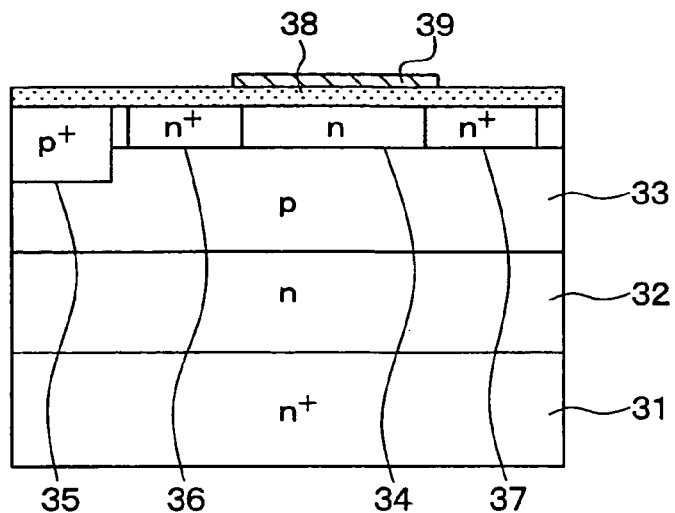
FIGS. 13A to 13C are cross sectional views showing manufacturing processes of the accumulation type lateral MOSFET subsequent to FIGS. 12A to 12C.

Thereafter, as shown in FIG. 13A, a polysilicon layer provided by doping n type impurities on the surface of the gate oxide film 38 is formed as a film under a temperature of 600° C., and is then patterned by using an unillustrated resist so that a gate 39 is formed.

Figure 13B:
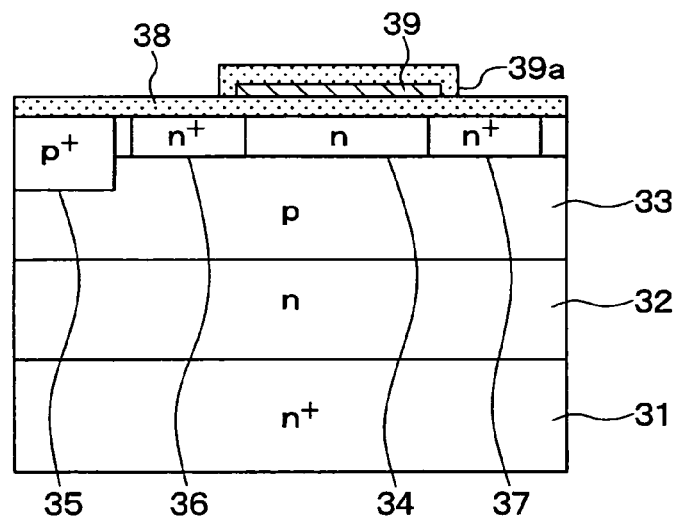

Further, as shown in FIG. 13B, round-off oxidation of the surface of the gate 39 is performed. For example, the oxidation (wet oxidation) is performed within the wet atmosphere at 850° C. for 120 minutes, and an oxide film 39*a* is formed on the surface of the gate 39, and the surface of the gate 39 is rounded.

At this time, the atmosphere and temperature controls of the wet oxidation are performed as shown in FIG. 7 shown in the second embodiment mode, and the wet atmosphere is maintained when the termination-desorption temperature or more is attained. Thus, it is possible to prevent H or OH from being desorbed from the dangling bond of the interface of the gate oxide film 38 and the channel epitaxial layer 34.

Figure 13C:
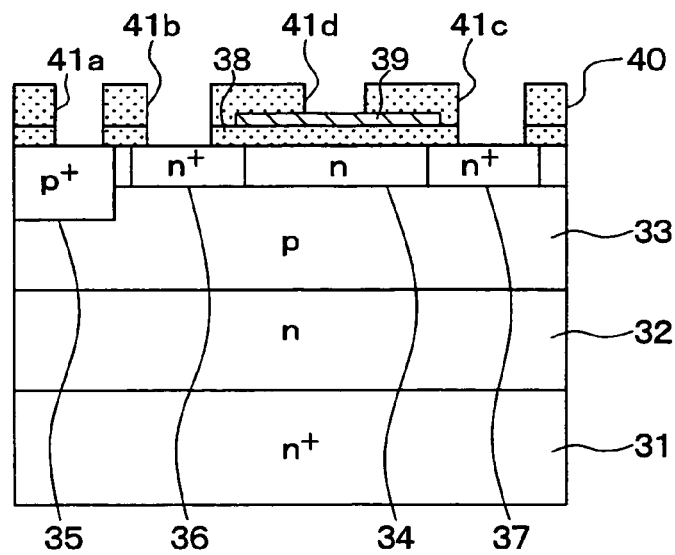

Subsequently, an interlayer insulating film 40 is formed as shown in FIG. 13C. For example, BPSG is formed as a film by plasma CVD at 420° C. Thereafter, for example, a reflow is performed within the wet atmosphere at 950° C. for 10 minutes so that the interlayer insulating film 40 is formed. The atmosphere and temperature controls of the wet oxidation at this time are performed as shown in FIG. 9 shown in the third embodiment mode, and the wet atmosphere is maintained when the termination-desorption temperature or more is attained in the reflow process of the interlayer insulating film 40. Thus, it is possible to prevent H or OH from being desorbed from the dangling bond of the interface of the gate oxide film 38 and the channel epitaxial layer 34.

Thereafter, the interlayer insulating film 40 is patterned. Thus, contact holes 41*a* to 41*c* connected to the contact area 35, the n$^+$ type source area 36 and the n$^+$ type drain area 37 are formed in the interlayer insulating film 40 and the gate oxide film 38. A contact hole 41*d* connected to the gate 39 is formed in the interlayer insulating film 40.

A Ni film is then formed so as to bury the interiors of the contact holes 41*a* to 41*d*, and is then patterned so that various kinds of electrodes 42 to 45 are formed. At this time, since the contact area 35, the n$^+$ type source area 36 and the n$^+$ type drain area 37 are set to high concentrations as mentioned above, these areas come in ohmic contact with various kinds of electrodes 42 to 45 without performing a heat treatment process, etc. Thus, the accumulation type lateral MOSFET shown in FIG. 10 is completed.

In the manufacturing method of the accumulation type lateral MOSFET explained above, as mentioned above, temperature is lowered until the termination-desorption temperature or less while the wet atmosphere is maintained at the temperature lowering time of the gate oxide film forming process. Therefore, the dangling bond of the interface of the gate oxide film 38 and the channel epitaxial layer 34 can be terminated by an element of H or OH. Thus, the accumulation type lateral MOSFET of high channel mobility can be set.

Further, the wet atmosphere is maintained when the termination-desorption temperature or more is attained in the round-off oxidation of the gate 39. Thus, it is possible to prevent H or OH from being desorbed from the dangling bond of the interface of the gate oxide film 38 and the channel epitaxial layer 34.

Further, the wet atmosphere is maintained when the termination-desorption temperature or more is attained in the reflow process of the interlayer insulating film 40. Thus, it is possible to prevent H or OH from being desorbed from the dangling bond of the interface of the gate oxide film 38 and the channel epitaxial layer 34.

Accordingly, when heat treatment is taken at high temperature after the gate oxide film forming process as in this embodiment mode, the wet atmosphere is also set when the termination-desorption temperature or more is attained. Thus, the improvement of channel mobility can be intended.

Fifth Embodiment Mode

Figure 14:
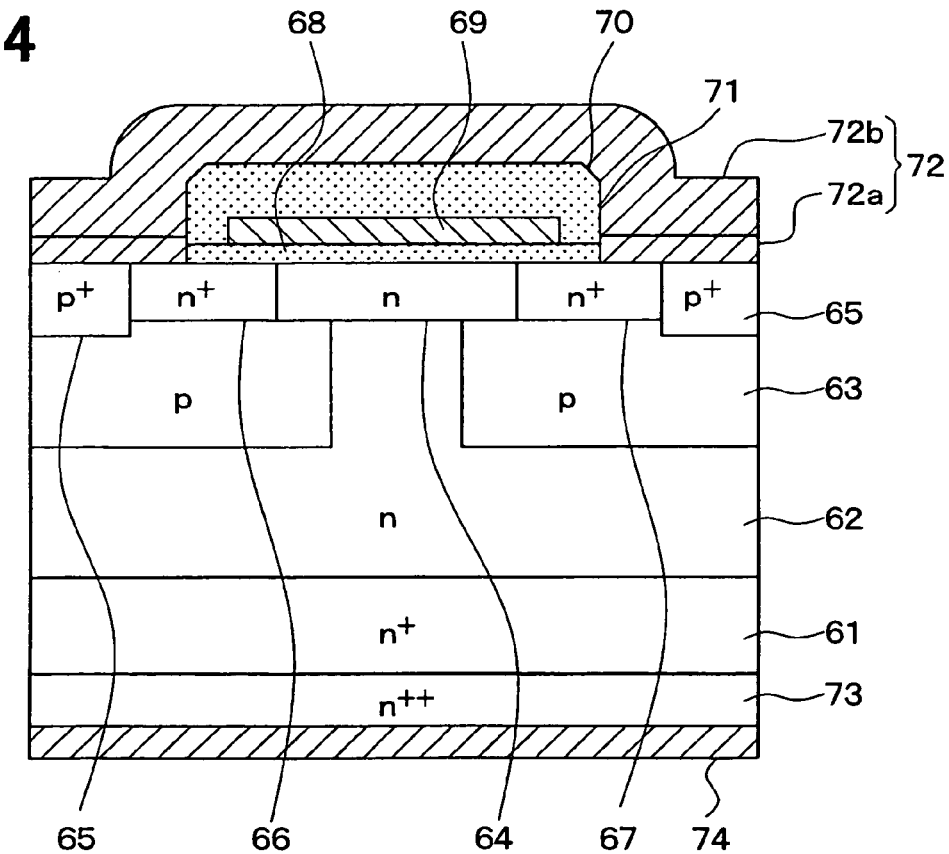
FIG. 14 is a cross sectional view showing the sectional construction of a planar type MOSFET to which a fifth embodiment mode of the present invention.

A fifth embodiment mode of the present invention will be explained. In this embodiment mode, one embodiment mode of the present invention is applied to a planar type MOSFET. FIG. 14 shows a sectional construction of the planar type MOSFET. FIGS. 15 to 19 show manufacturing processes of the planar type MOSFET shown in FIG. 14. The structure and manufacturing method of the planar type MOSFET of this embodiment mode will be explained with reference to these figures.

As shown in FIG. 14, the planar type MOSFET is formed in a substrate 61 of the n$^+$ type constructed by SiC with one face side as a main surface. For example, the substrate 61 of the n$^+$ type is constructed by 4H—SiC and the main surface is set to face a, i.e., a (11–20)-plane, and the substrate 61 has about $5\times10^{18}$ cm$^{-3}$ in impurity concentration.

An n type drift layer 62 constructed by SiC epitaxially grown is formed on the main surface of this substrate 61. For example, the n type drift layer 62 is set to about $1\times10^{16}$ cm$^{-3}$ in impurity concentration and 10 μm in thickness.

Plural p type base areas 63 are formed so as to be spaced from each other at a predetermined interval in a surface layer portion of the n type drift layer 62. For example, this p type base area 63 is set to about $1\times10^{19}$ cm$^{-3}$ and 0.7 μm in depth.

Further, an n type channel layer (hereinafter called a channel epitaxial layer) 64 for constructing a channel area epitaxially grown is formed on the p type base area 63. For example, this channel epitaxial layer 64 is set to about $1\times10^{16}$ cm$^{-3}$ in concentration and 0.3 μm in film thickness (depth).

A contact area 65 of the p$^+$ type is formed so as to pass through this channel epitaxial layer 34 and reach the p type base area 63. For example, this contact area 65 is set to a high concentration of $3\times10^{20}$ cm$^{-3}$ or more, and 0.4 μm in depth.

Further, n$^+$ type source areas 66, 67 are formed on both sides through the channel epitaxial layer 64 on the inside from this contact area 65. These n$^+$ type source areas 66, 67 are formed so as to be separated from each other. For example, these n$^+$ type source areas 66, 67 are set to a high concentration of $3\times10^{20}$ cm$^{-3}$ or more and 0.3 μm in depth.

Further, a portion located on the p type base area 63 among a surface layer portion of the channel epitaxial layer 64 is set to a channel area, and a gate oxide film 68 having e.g., 38 nm in film thickness is formed so as to cover at least the surface of the channel area. A structure for terminating dangling bond by an element of H or OH is formed at the interface of this gate oxide film 68 and the channel epitaxial layer 64 constituting the channel area.

For example, a gate 69 constructed by polysilicon formed by doping n type impurities (e.g., P (phosphorus)) is patterned on the surface of the gate oxide film 68.

Further, for example, an interlayer insulating film 70 constructed by LTO is formed so as to cover the remaining portion of the gate 69 and the gate oxide film 68. A contact hole 71 connected to the contact area 65 and the n⁺ type source areas 66, 67, an unillustrated contact hole connected to the gate 69, etc. are formed in this interlayer insulating film 70 and the gate oxide film 68. A source electrode 72 constructed by a contact portion 72a electrically connected to the contact area 65 and the n⁺ type source areas 66, 67, and a wiring electrode 72b constructed by Al is arranged through the contact hole 71.

On the other hand, a drain contact area 73 of the n⁺ type set to concentration higher than that of the substrate 61 is formed on the rear face side of the substrate 61. For example, a drain electrode 74 as a rear face electrode constructed by Ni is formed in this drain contact area 73. The planar type MOSFET is constructed by such a structure.

In the planar type MOSFET constructed in this way, the channel epitaxial layer 64, i.e., the channel area is set to an electric current path, and an electric current is flowed between the n⁺ type source areas 66, 67 and the drain contact area 73 arranged in upper and lower streams of the electric current path. The width of a depletion layer formed in the channel area is controlled by controlling a voltage applied to the gate 69, and the electric current flowed to this depletion layer is controlled. Thus, the electric current flowed between the n⁺ type source areas 66, 67 and the drain contact area 73 can be controlled.

Next, the manufacturing method of the planar type MOSFET shown in FIG. 14 will be explained by using FIGS. 15 to 19.

Figure 15A:
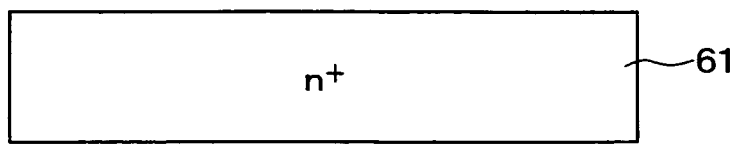
FIGS. 15A to 15D are cross sectional views showing manufacturing processes of the planar type MOSFET shown in FIG. 14.
Figure 15B:
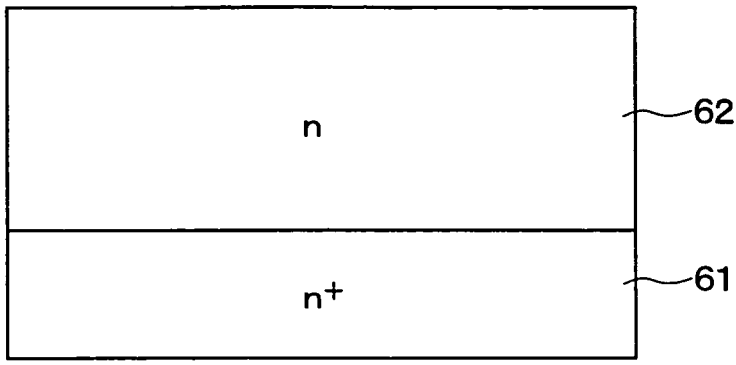

First, a substrate 61 of the n⁺ type is prepared as shown in FIG. 15A. Thereafter, as shown in FIG. 15B, an n type drift layer 62 is epitaxially grown on the main surface of the substrate 61 such that the n type drift layer 62 has about $1 \times 10^{16}$ cm⁻³ in impurity concentration and 10 μm in thickness.

Figure 15C:
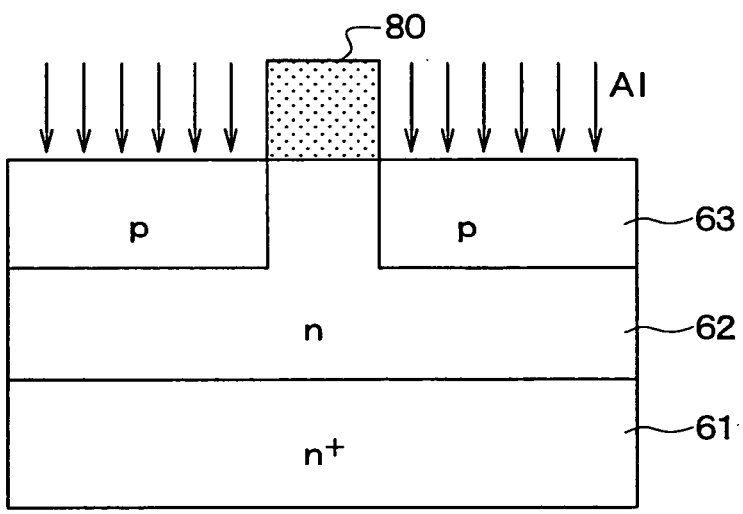
Figure 15D:
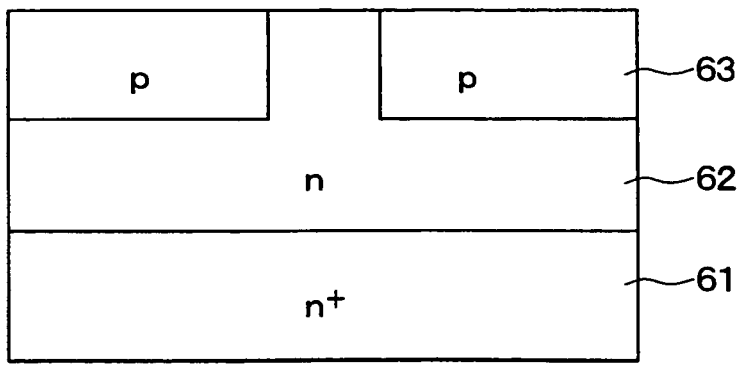

Thereafter, for example, LTO 80 is formed as a film as shown in FIG. 15C, and is then opened on a forming schedule area of a p type base area 63 via a photolithography process. Al ions as p type impurities are then implanted into a surface layer portion of the n type drift layer 62 with LTO 80 as a mask. Thereafter, LTO 80 is removed as shown in FIG. 15D, and activation anneal is performed at 1600° C. for 30 minutes. Thus, for example, a p type base area 63 having about $1 \times 10^{19}$ cm⁻³ in impurity concentration and 0.7 μm in depth is formed.

Figure 16A:
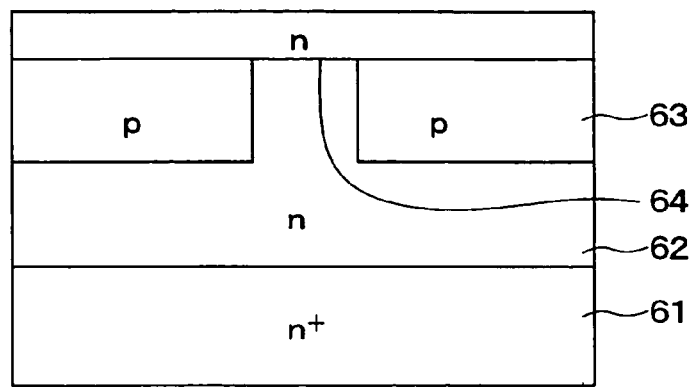
FIGS. 16A to 16C are cross sectional views showing manufacturing processes of the planar type MOSFET subsequent to FIGS. 15A to 15D.

Subsequently, as shown in FIG. 16A, for example, a channel epitaxial layer 64 having about $1 \times 10^{16}$ cm⁻³ in concentration and 0.3 μm in film thickness (depth) is epitaxially grown on this p type base area 63.

Figure 16B:
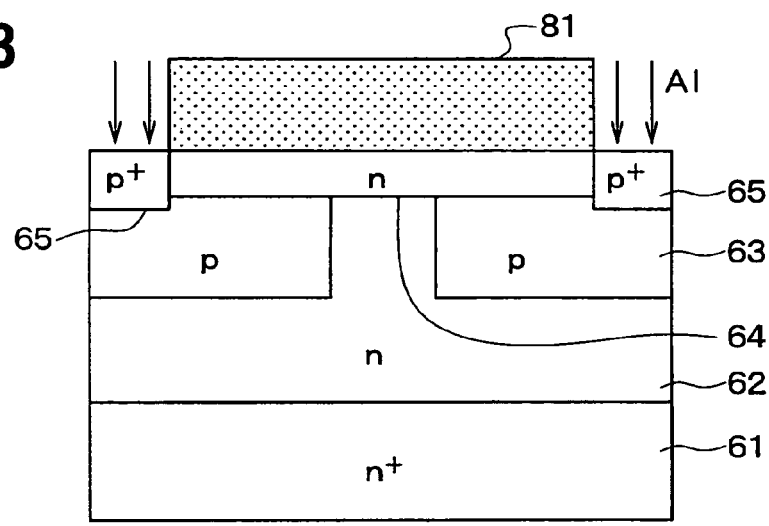

Next, for example, LTO 81 is formed as a film as shown in FIG. 16B, and is then opened in a forming schedule area of a contact area 65 via a photolithography process. Al ions are then implanted with LTO 81 as a mask.

Figure 16C:
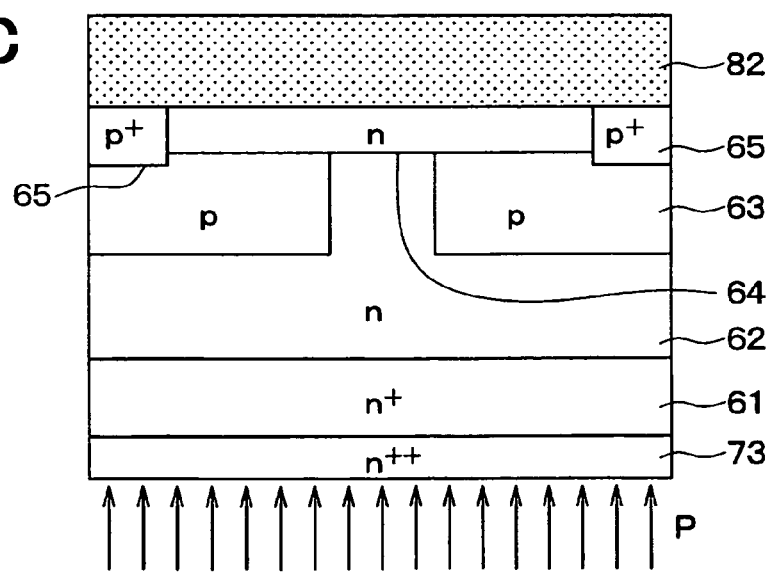

Further, after LTO 81 is removed, for example, LTO 82 is formed as a film and protects a substrate surface as a film as shown in FIG. 16C. Thereafter, P ions are implanted from the rear face of the substrate 61.

Figure 17A:
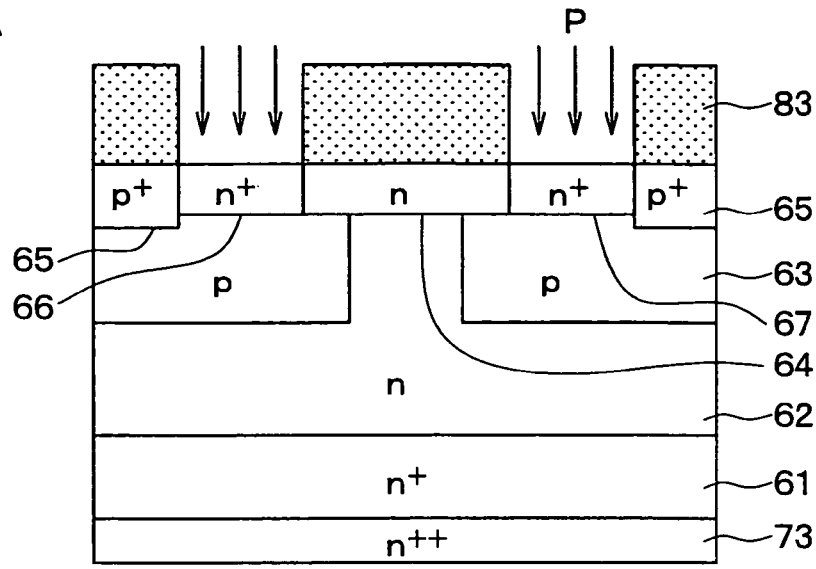
FIGS. 17A to 17C are cross sectional views showing manufacturing processes of the planar type MOSFET subsequent to FIGS. 16A to 16C.

Further, after LTO 82 is removed, for example, LTO 83 is formed as a film as shown in FIG. 17A, and is opened on a forming schedule area of n⁺ type source areas 66, 67 via the photolithography process. Thereafter, for example, P ions are implanted as n type impurities.

Figure 17B:
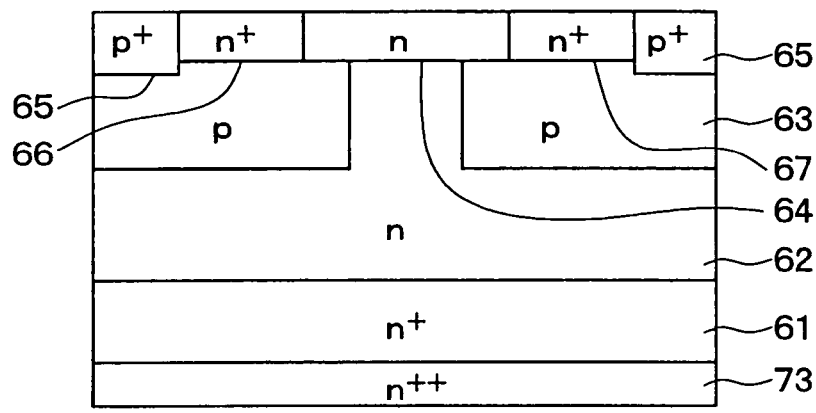

Thereafter, LTO 83 is removed as shown in FIG. 17B. Thereafter, for example, activation anneal is performed at 1600° C. for 30 minutes so that the implanted p type impurities and n type impurities are activated. Thus, the contact area 65 and the n⁺ type source areas 66, 67 are formed.

Figure 17C:
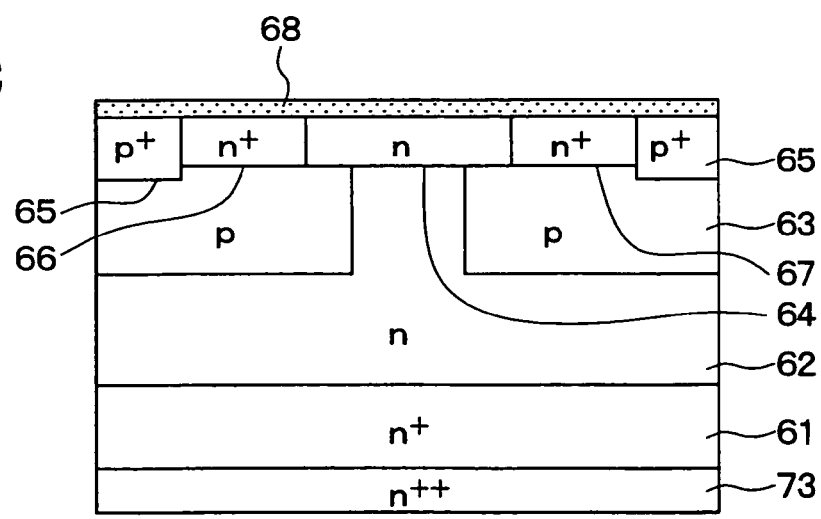

Subsequently, as shown in FIG. 17C, a gate oxide film 68 is formed by performing a gate oxide film forming process. Concretely, the gate oxide film 68 is formed by gate oxidation using the pyrogenic method using the wet atmosphere. At this time, atmosphere and temperature controls of the gate oxide film forming process are performed as shown in FIG. 4 shown in the first embodiment mode. However, time for holding a temperature of 1080° C. is set to 60 minutes, and switching temperature from the wet atmosphere at a temperature lowering time to the nitrogen atmosphere is set to 700° C.

Namely, temperature is raised in a temperature gradient of 10° C./min as the nitrogen (N₂) atmosphere from the room temperature to 1080° C. When temperature reaches 1080° C., the wet (H₂O) atmosphere is set and this temperature is held for 60 minutes. Thus, for example, a gate oxide film 68 of 38 nm in film thickness is formed. Thereafter, temperature is lowered at 10° C./min while the wet atmosphere is maintained. At this time, the wet atmosphere is maintained until temperature is lowered to 700° C. or less.

Thus, the wet atmosphere is maintained at the temperature lowering time of the gate oxide film forming process. Thus, a structure for terminating dangling bond by an element of H or OH is formed at the interface of the gate oxide film 68 and the channel epitaxial layer 64 constituting the channel area.

Figure 18A:
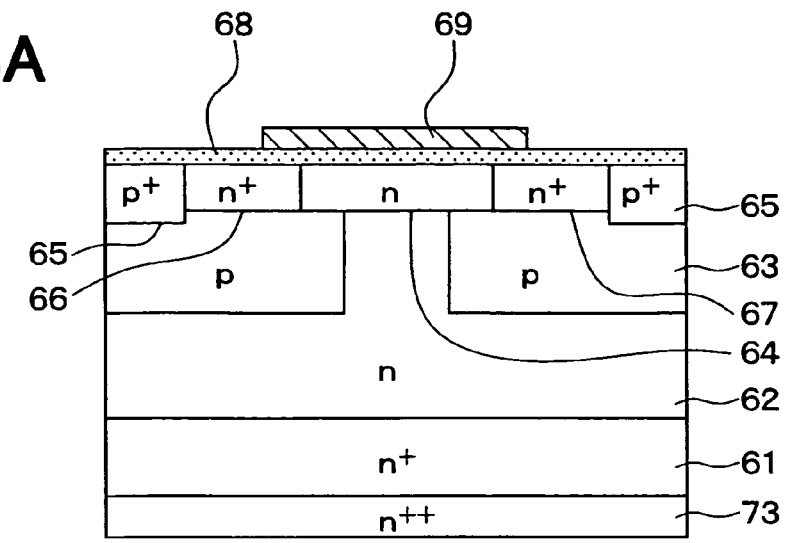
FIGS. 18A to 18C are cross sectional views showing manufacturing processes of the planar type MOSFET subsequent to FIGS. 17A to 17C.

Thereafter, as shown in FIG. 18A, a polysilicon layer provided by doping n type impurities on the surface of the gate oxide film 68 is formed as a film under a temperature of 600° C., and is then patterned by using an unillustrated resist so that a gate 69 is formed.

Figure 18B:
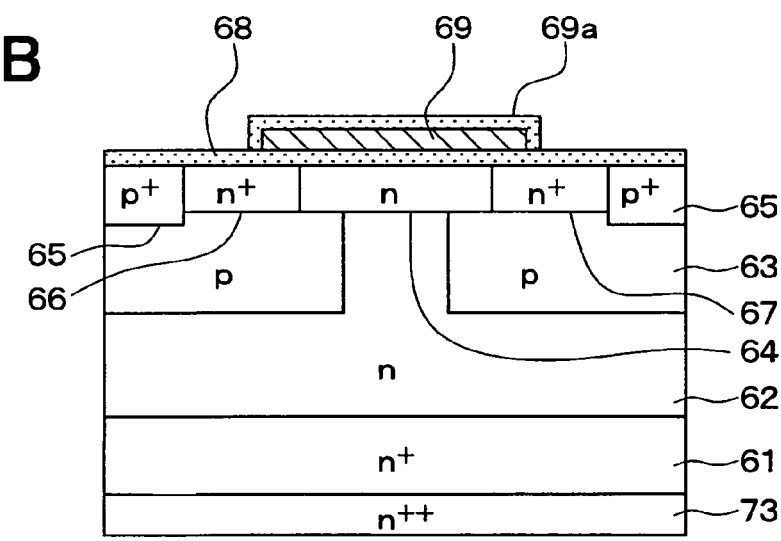

Further, as shown in FIG. 18B, round-off oxidation of the surface of the gate 69 is performed. For example, the oxidation (wet oxidation) is performed within the wet atmosphere at 850° C. for 120 minutes so that an oxide film 69a is formed on the surface of the gate 69 and the surface of the gate 69 is rounded.

At this time, atmosphere and temperature controls of the wet oxidation are performed as shown in FIG. 7 shown in the second embodiment mode. The wet atmosphere is maintained when the termination-desorption temperature or more is attained. However, switching temperature from the nitrogen atmosphere at a temperature rising time to the wet atmosphere, and switching temperature from the wet atmosphere at a temperature lowering time to the nitrogen atmosphere are set to 700° C. Thus, it is possible to prevent H or OH from being desorbed from dangling bond of the interface of the gate oxide film 68 and the channel epitaxial layer 64.

Figure 18C:
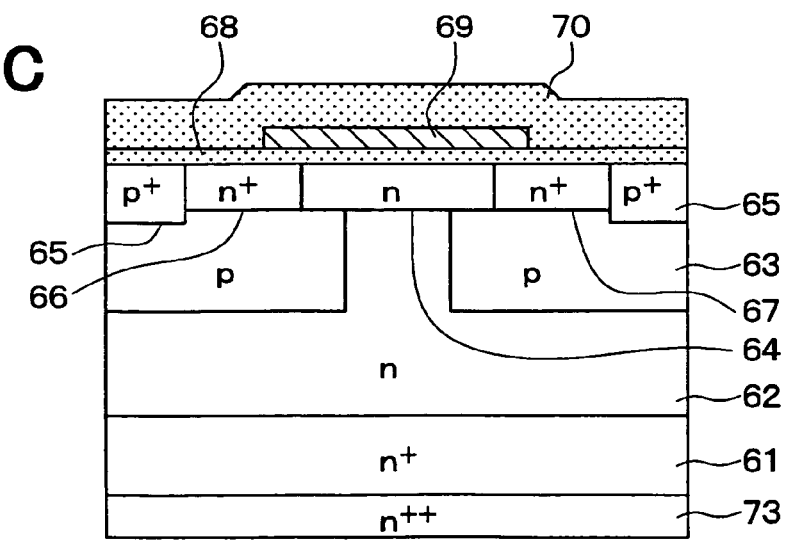

Subsequently, an interlayer insulating film 70 is formed as shown in FIG. 18C. For example, BPSG is formed as a film at 420° C. by plasma CVD. Thereafter, for example, a reflow is performed within the wet atmosphere at 950° C. for 10 minutes so that the interlayer insulating film 70 is formed. The atmosphere and temperature controls of the wet oxidation at this time are performed as shown in FIG. 9 shown in the third embodiment mode. The wet atmosphere is maintained when the termination-desorption temperature or more is attained in the reflow process of the interlayer insulating film 70. However, switching temperature from the nitrogen atmosphere at the temperature rising time to the wet atmosphere, and switching temperature from the wet atmosphere at the temperature lowering time to the nitrogen atmosphere are set to 700° C. Thus, it is possible to prevent H or OH from being desorbed from dangling bond of the interface of the gate oxide film 68 and the channel epitaxial layer 64.

Figure 19A:
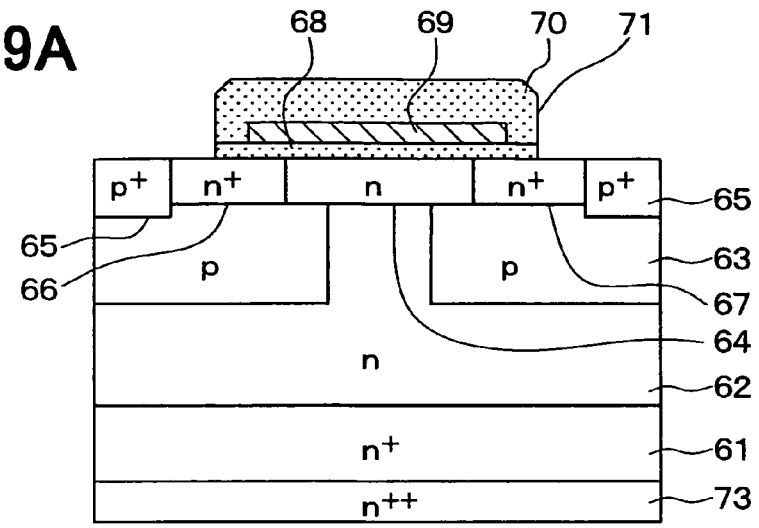
FIGS. 19A to 19C are cross sectional views showing manufacturing processes of the planar type MOSFET subsequent to FIGS. 18A to 18C.

Thereafter, the interlayer insulating film 70 is patterned as shown in FIG. 19A. Thus, a contact hole 71 connected to the contact area 65 and the n$^+$ type source areas 66, 67 is formed in the interlayer insulating film 70 and the gate oxide film 68.

Figure 19B:
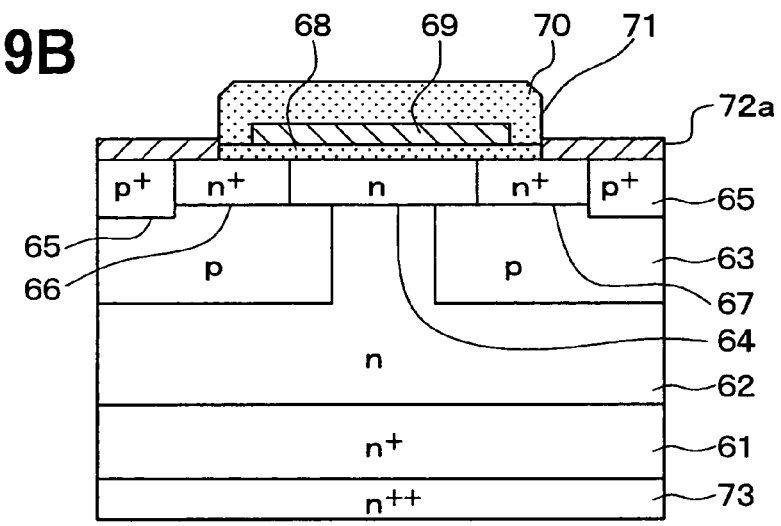
Figure 19C:
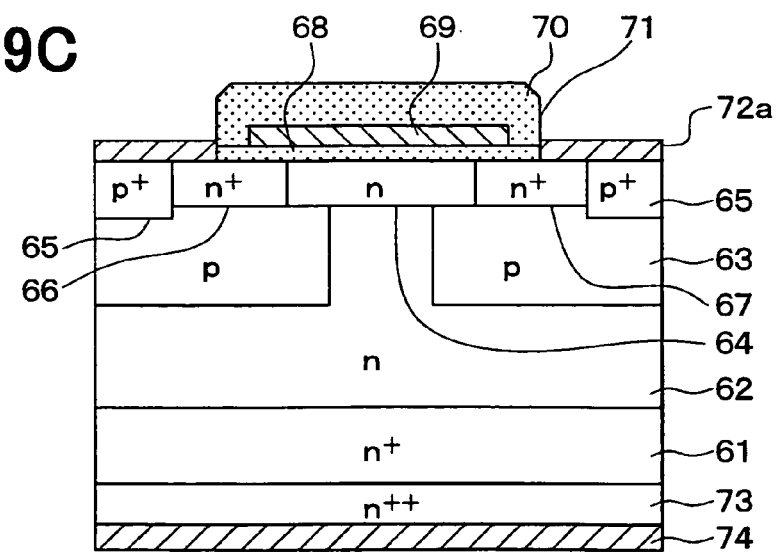

As shown in FIG. 19B, a Ni film is formed so as to bury the interior of the contact hole 71, and is then patterned so that a contact portion 72a of various kinds of source electrodes 72 is formed. Further, as shown in FIG. 19C, a drain electrode 74 using Ni is formed on the rear face side of the substrate 61 so as to abut on a drain contact area 73.

Thereafter, anneal processing of 700° C. or less is performed within an Ar atmosphere so as to set the contact portion 72a and the drain electrode 74 to ohmic contact. At this time, since the contact area 65 and the n$^+$ type source areas 66, 67 are set to high concentrations as mentioned above, these areas sufficiently come in ohmic contact with various kinds of electrodes 72a even when a heat treatment process of high temperature, etc. are not performed.

However, if the anneal processing is performed within a hydrogen atmosphere, the heat treatment of 700° C. or more can be taken. If the hydrogen atmosphere is used in this way, for example, the anneal processing of 1000° C. can be also performed. Thus, it is possible to restrain the desorption of H or OH from the dangling bond of the interface of the gate oxide film 68 and the channel epitaxial layer 64, and reduce contact resistance.

Finally, an unillustrated contact hole connected to the gate 69 is formed by using an unillustrated resist with respect to the interlayer insulating film 70. Thereafter, a wiring electrode 72b is formed by Al so that a source electrode 72 is formed and a planar type MOSFET shown in FIG. 14 is completed.

In the manufacturing method of the planar type MOSFET explained above, as mentioned above, temperature is lowered until the termination-desorption temperature or less while the wet atmosphere is maintained at the temperature lowering time of the gate oxide film forming process. Therefore, dangling bond of the interface of the gate oxide film 68 and the channel epitaxial layer 64 can be terminated by an element of H or OH. Thus, the planar type MOSFET of high channel mobility can be set.

Further, the wet atmosphere is maintained when the termination-desorption temperature or more is attained in round-off oxidation of the gate 69. Thus, it is possible to prevent H or OH from being desorbed from the dangling bond of the interface of the gate oxide film 68 and the channel epitaxial layer 64.

Further, the wet atmosphere is maintained when the termination-desorption temperature or more is attained in the reflow process of the interlayer insulating film 70. Thus, it is possible to prevent H or OH from being desorbed from the dangling bond of the interface of the gate oxide film 68 and the channel epitaxial layer 64.

Accordingly, when heat treatment is taken at high temperature after the gate oxide film forming process as in this embodiment mode, the wet atmosphere is set when the termination-desorption temperature or more is attained. Thus, the improvement of channel mobility can be intended.

Sixth Embodiment Mode

Figure 20:
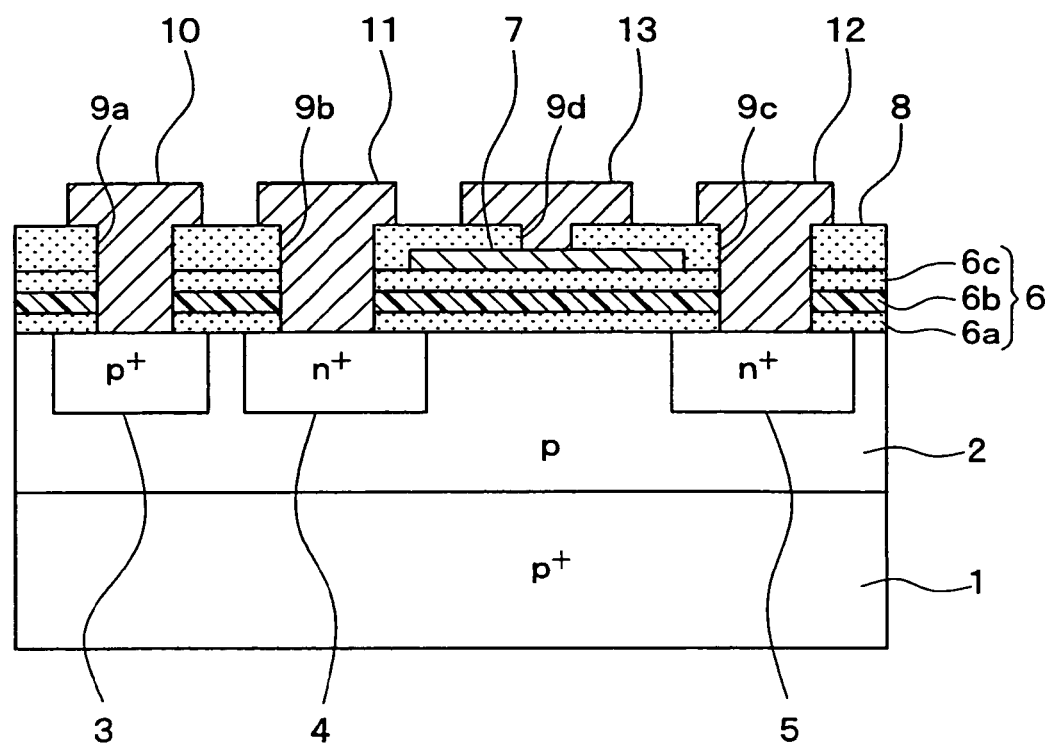
FIG. 20 is a cross sectional view showing the sectional construction of an inversion type lateral MOSFET to which a sixth embodiment mode of the present invention.

A sixth embodiment mode of the present invention will be explained. In this embodiment mode, the structure of the gate insulating film of the inversion type lateral MOSFET shown in the first embodiment mode is changed. FIG. 20 shows a sectional construction of the inversion type lateral MOSFET of this embodiment mode. FIGS. 21 and 22 show manufacturing processes of the inversion type lateral MOSFET shown in FIG. 20. The structure and manufacturing method of the inversion type lateral MOSFET of this embodiment mode will be explained with reference to these figures.

As shown in FIG. 20, in this embodiment mode, the gate insulating film 6 of the inversion type lateral MOSFET shown in the first embodiment mode is constructed by an ONO film formed by a three-layer structure of a silicon oxide film 6a, a silicon nitride film 6b and a silicon oxide film 6c.

Next, the manufacturing method of the inversion type lateral MOSFET shown in FIG. 20 will be explained by using FIGS. 21 to 22. The explanation is omitted with respect to portions similar to those of the first embodiment mode in this manufacturing method, and only different portions from the first embodiment mode will be explained.

Figure 21A:
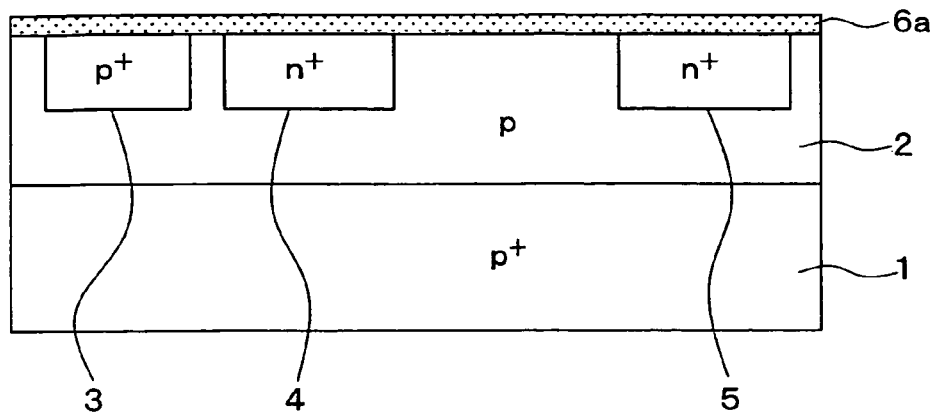
FIGS. 21A to 21C are cross-sectional views showing manufacturing processes of the inversion type lateral MOSFET shown in FIG. 20.

First, as shown in FIG. 21A, a p/p$^+$ type substrate having a p type base layer 2 formed on the main surface of a substrate 1 of the p$^+$ type is prepared. A structure for forming a contact area 3, an n$^+$ type source area 4 and an n$^+$ type drain area 5 in a surface layer portion of the p type base layer 2 is prepared. Wet oxidation is performed at 1080° C. for 80 minutes by the pyrogenic method. Thereafter, when temperature is lowered and reaches 700° C., it is switched from the wet atmosphere to the nitrogen atmosphere. Thus, a silicon oxide film 6a of about 52 nm in oxide film thickness is formed.

Figure 21B:
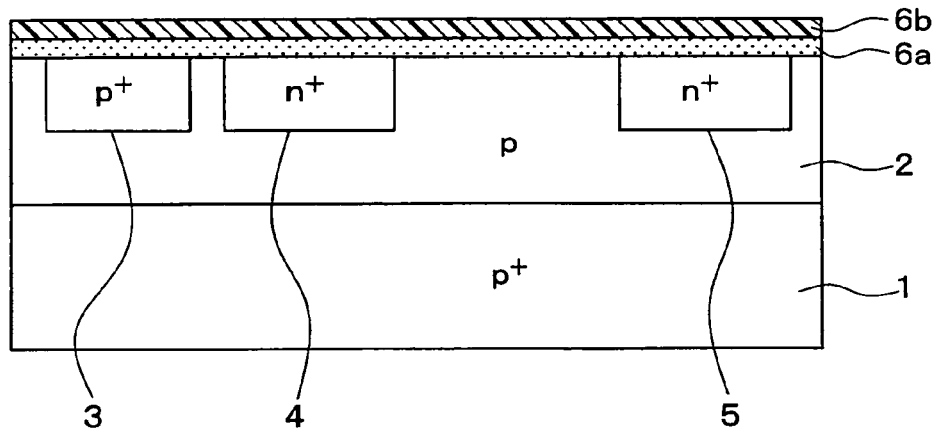

Subsequently, as shown in FIG. 21B, a silicon nitride film 6b is formed on the surface of the silicon oxide film 6a by using an LP-CVD device such that the silicon nitride film 6b has a film thickness of about 15 nm. At this time, film forming temperature is set to 800° C. It is possible to set the desorption of a terminal element not to be generated by setting the film forming temperature to 800° C. or less in this way.

Figure 21C:
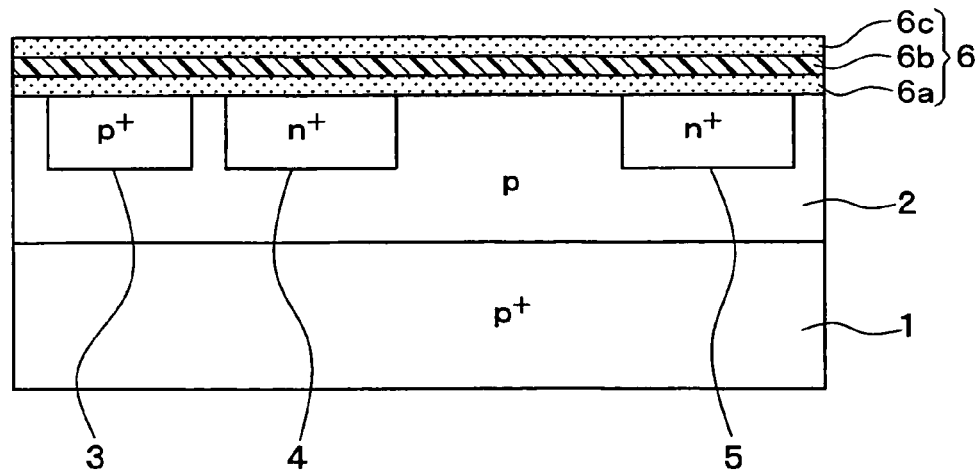

Subsequently, as shown in FIG. 21C, the surface of the silicon nitride film 6b is oxidized by wet oxidation of 950° C., and a silicon oxide film (top oxide film) 6c having about 7 nm in film thickness is formed. The wet oxidation at this time is set such that the wet atmosphere is set from 700° C. and temperature is raised and the wet atmosphere is also maintained at the temperature lowering time until temperature reaches 700° C. It is possible to set the desorption of the terminal element not to be generated by setting the wet atmosphere at 700° C. or more in this way. In particular, in the case of this process, a cap effect is obtained, and hydrogen is generated by an oxidizing reaction of the silicon nitride film 6b in addition to this cap effect. Therefore, a terminating effect of the dangling bond of the MOS interface is improved, and an improving effect of channel mobility can be obtained.

Figure 22A:
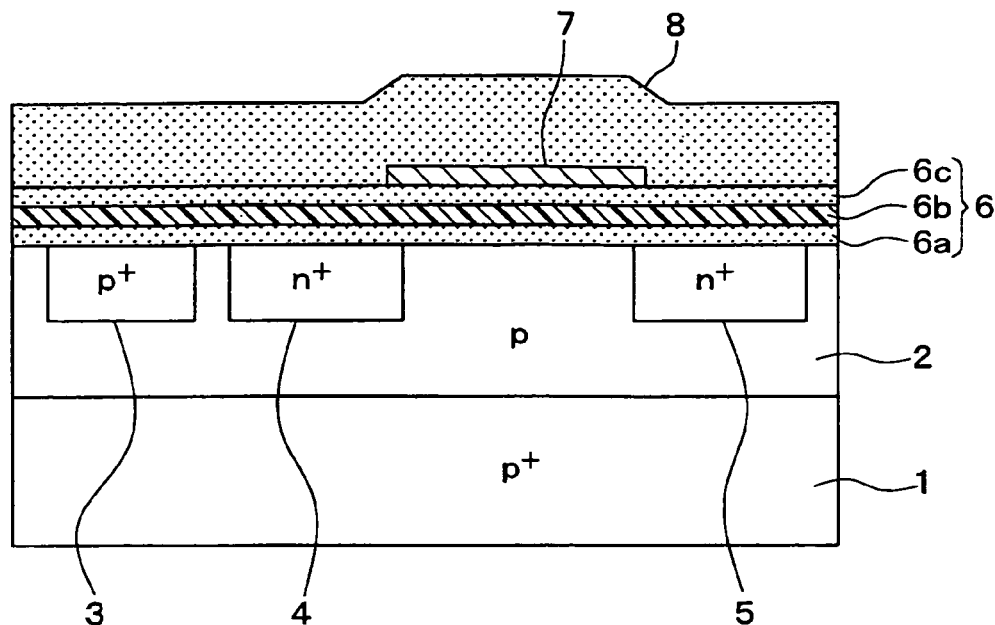
FIGS. 22A and 22B are cross-sectional views showing manufacturing processes of the inversion type lateral MOSFET subsequent to FIGS. 21A to 21C.
Figure 22B:
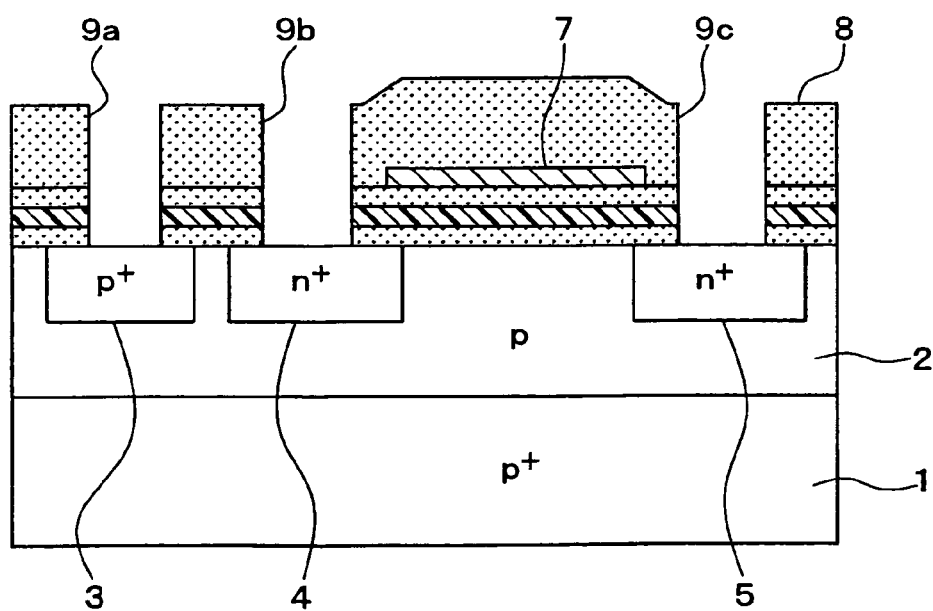

Thereafter, as shown in FIG. 22A, after a process for forming a gate oxide film 7 on the surface of the silicon oxide film 6c is performed, an interlayer insulating film 8 is formed by forming LTO as a film at 420° C. Thereafter, as shown in FIG. 22B, a base electrode 10, a source electrode 11, a drain electrode 12 and a gate electrode 13 are further formed via a process for forming contact holes 9a to 9c connected to the contact area 3, the n$^+$ type source area 4 and the n$^+$ type drain area 5, etc. Thus, the inversion type lateral MOSFET of this embodiment mode is completed.

Thus, the inversion type lateral MOSFET for constructing the gate insulating film 6 by the ONO film may be also set. Here, the insulating film nipped by the silicon oxide films 6a, 6c among the gate insulating film 6 is set to the silicon nitride film 6b. However, in addition, a high dielectric film of $HfO_2$, HfSiON, HfAlO, $Al_2O_3$, $Ta_2O_5$, etc. may be also interposed. In this case, oxidation temperature of the top oxide film formed by oxidizing the surface of the high dielectric film may be suitably changed from the case of the silicon nitride film 6b.

Other Embodiment Modes (1) In the above embodiment modes, the explanations have been made with respect to the case for forming gate oxide films 6, 38, 68 by the wet oxidation. However, if it is desirous to terminate the dangling bond of the interface of the gate oxide films 6, 38, 68 and the p type base layer 2 and the channel epitaxial layers 34, 64 by an element of H or OH during the gate oxide film forming process, the wet atmosphere or the hydrogen atmosphere is maintained at the temperature lowering time of at least the gate oxide film forming process.

Accordingly, the gate oxide films 6, 38, 68 can be also formed by another technique except for the wet oxidation, and it can be switched to the wet atmosphere at only the temperature lowering time, and the dangling bond of the interface of SiC and the gate oxide films 6, 38, 68 can be also terminated by H or OH at the temperature lowering time.

For example, oxidation is performed by a dry atmosphere, an $N_2O$ atmosphere, an NO atmosphere, an ozone atmosphere, an $H_2O$ radical atmosphere, etc., or the gate oxide film is formed by deposition of LTO, TEOS, HTO, etc. by CVD, etc. At subsequent temperature lowering time, it is switched to the wet atmosphere by introducing $H_2O$ into a chamber for forming the gate oxide film, and temperature is lowered until the termination-desorption temperature or less.

Here, the explanation has been made with respect to the case for constructing the gate insulating film by the oxide film. However, when this technique is used, the gate insulating film can be also constructed by an insulating film of another kind. For example, $HfO_2$, HfSiON, HfAlO, $Al_2O_3$, $Ta_2O_5$, $Si_3N_4$, etc. are used.

(2) In each of the above embodiment modes, the case for setting the wet atmosphere at the temperature lowering time of the gate oxide film forming process is shown. However, anneal processing for improving characteristics may be also performed by using the wet atmosphere or the hydrogen atmosphere after the gate oxide film forming process.

Figure 23:
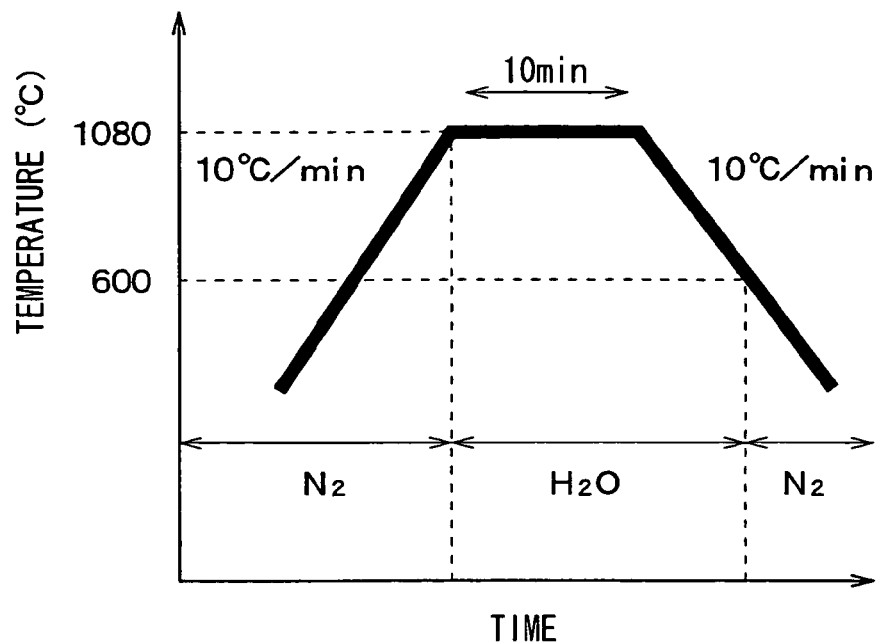
FIG. 23 is a graph schematically showing atmosphere and temperature controls of a gate oxide film forming process shown in another embodiment mode.

For example, after the process shown in FIG. 3A of the first embodiment mode is performed as follows, anneal processing using the wet atmosphere is subsequently performed. FIG. 23 schematically shows atmosphere and temperature controls of an anneal process using the wet atmosphere.

First, for example, HTO is formed as a film by introducing $N_2O$ and $SiH_4$ gases at 800° C. using e.g., a CVD device, etc., and a gate oxide film 6 is formed. Thereafter, the anneal process using the wet atmosphere is performed.

Namely, temperature is raised in a temperature gradient of 10° C./min as the nitrogen ($N_2$) atmosphere from the room temperature to 1080° C. When temperature reaches 1080° C., the wet ($H_2O$) atmosphere is set and the anneal processing is performed by holding this temperature for 10 minutes. Thereafter, temperature is lowered at 10° C./min while the wet atmosphere is maintained. At this time, the wet atmosphere is maintained until temperature is lowered to 600° C. or less.

Thus, the anneal processing is performed after the gate oxide film forming process, and the wet atmosphere is maintained at the temperature lowering time of the anneal processing. Thus, the dangling bond of the interface of the gate oxide film 6 and the p type base layer 2 constituting the channel area can be terminated by an element of H or OH.

Effects similar to those of each of the above embodiment modes can be also obtained by this way. If the anneal processing is performed after the gate oxide film forming process in this way, the gate oxide film may be also formed by a technique except for the wet oxidation as mentioned above, and the gate insulating film may be also formed by an insulating film of another kind instead of the oxide film.

It is also effective to perform such anneal processing for the purpose of a further characteristic improvement after the gate oxide films 6, 38, 68 are formed by the wet atmosphere.

Here, the anneal processing is performed just after the gate oxide film forming process, i.e., before the gate forming process, but may be also performed after the gate forming process, after an interlayer insulating film forming process, etc. In accordance with such a construction, the gates 6, 38, 68 and the interlayer insulating films 8, 40, 70 play a role as a cap layer. Therefore, a characteristic improvement of the interface of the gate oxide films 6, 38, 68 and SiC can be further made.

(3) Similarly, at the temperature lowering time of the gate oxide film forming process, the wet atmosphere is always set during a period until temperature is lowered to 600° C. However, it is sufficient to continuously maintain the wet atmosphere in a temperature area including the range of at least the termination-desorption temperature.

Figure 24:
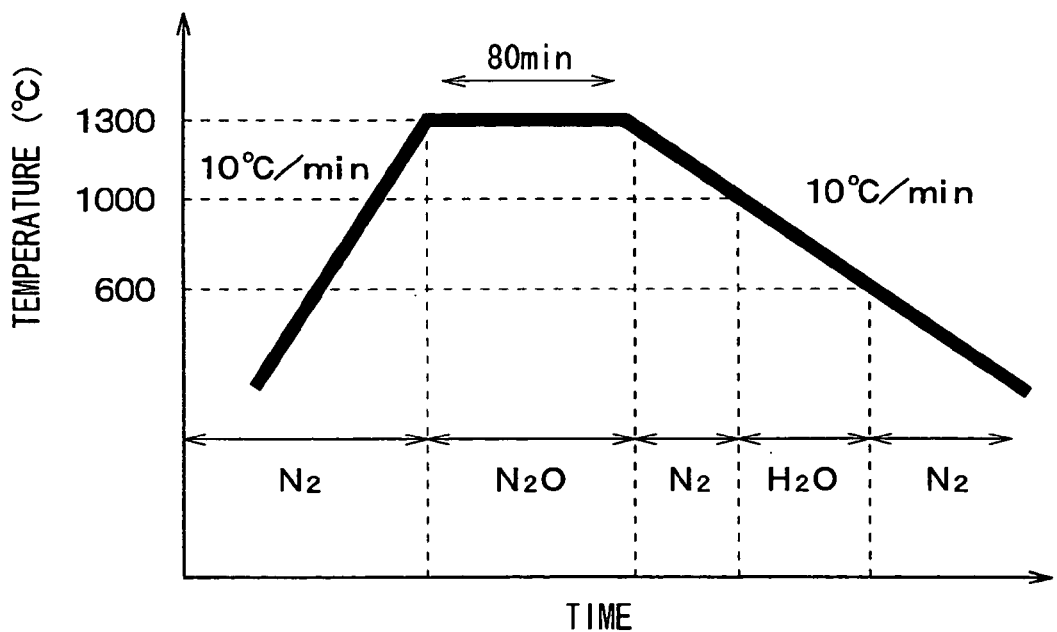
FIG. 24 is a graph schematically showing atmosphere and temperature controls of the gate oxide film forming process shown in another embodiment mode.

For example, atmosphere and temperature controls as shown in FIG. 24 can be performed in the process shown in FIG. 3A of the first embodiment mode.

Namely, temperature is raised in a temperature gradient of 10° C./min as the nitrogen atmosphere from the room temperature to 1300° C. Next, when temperature reaches 1300° C., oxidation is performed for 80 minutes in an $N_2O$ atmosphere ($N_2$ dilution) and the gate oxide film 6 is formed. Subsequently, it is returned to the nitrogen atmosphere, and temperature is lowered in a temperature gradient of 10° C./min. When temperature then reaches 1000° C., it is switched to the wet atmosphere. Temperature is lowered at 10° C./min while the wet atmosphere is maintained until temperature is lowered to 600° C. or less. Thereafter, when temperature becomes 600° C., it is again returned to the nitrogen atmosphere and temperature is lowered until the room temperature.

Thus, if the wet atmosphere is maintained in a temperature area including at least the termination-desorption temperature at the temperature lowering time of the gate oxide film forming process, the dangling bond of the interface of the gate oxide film 6 and the p type base layer 2 constituting the channel area can be terminated by an element of H or OH.

When the $N_2O$ atmosphere is used in this way, the dangling bond of the interface of the gate oxide film 6 and the p type base layer 2 constituting the channel area can be also terminated by N in addition to H or OH. Thus, an interface state density can be further reduced, and channel mobility can be further improved. Further, similar contents can be also the and the improvement of channel mobility can be also intended when the gate oxidation is performed by using an NO atmosphere without limiting the atmosphere to the $N_2O$ atmosphere.

(4) In each of the above embodiment modes, the wet atmosphere is formed by the pyrogenic method, but may be also formed by a bubbling method for boiling $H_2O$.

(5) In the above second to fifth embodiment modes, a combination of a technique for setting the wet atmosphere at the temperature lowering time of the gate oxide film forming process, and a technique for performing the anneal processing, the reflow processing, etc. in the wet atmosphere or the hydrogen atmosphere is explained. However, the combination of these techniques is not indispensable, and the above effects can be also obtained by independently using each of the techniques.

(6) In the above embodiment modes, face a of 4H—SiC, i.e., a (11–20)-plane is used, but another face may be also used and another crystal structure may be also used.

(7) In the above embodiment modes, the inversion type lateral MOSFET, the accumulation type lateral MOSFET and the planar type MOSFET have been explained as examples as the semiconductor device of the MOS structure. However, these MOSFETs are merely shown as one example of the semiconductor device of the MOS structure. For example, the present invention can be also applied to IGBT of the MOS structure, and can be also applied to MOSFET of a trench gate type. In short, the present invention can be also applied to the semiconductor device of any MOS structure.

(8) In each of the above embodiment modes, the wet atmosphere or the hydrogen atmosphere is not necessarily set to 100%, but may be also diluted with another gas.

(9) When the azimuth of a crystal is shown, a bar (-) should be originally affixed onto a predetermined desirable number, but a limit of an expression based on a personal computer application exists. Therefore, in this specification, the bar is set to be affixed before the predetermined desirable number.

The above disclosure has the following aspects.

According to a first aspect of the present disclosure, a silicon carbide semiconductor device having a MOS structure includes: a substrate made of silicon carbide; a channel area for providing an electric current path, wherein the channel area is made of silicon carbide and disposed in the substrate; a first impurity area disposed on an upstream side of the electric current path; a second impurity area disposed on a downstream side of the electric current path; a gate insulating film disposed on a surface of the channel area; and a gate disposed on the gate insulating film. The channel area provides the electric current path as a channel by controlling a voltage applied to the gate so that an electric current in the electric current path flowing between the first impurity area and the second impurity area is controlled. The channel area and the gate insulating film have an interface therebetween. The interface includes a dangling bond, which is terminated by a hydrogen atom or a hydroxyl. The interface has a hydrogen concentration equal to or larger than $2.6 \times 10^{20}$ cm$^{-3}$.

The above device is characterized in that dangling bond of an interface of the channel area and the gate insulating film is terminated by an element of H or OH, and hydrogen concentration at the interface is set to $2.6 \times 10^{20}$ cm$^{-3}$ or more. Thus, if the dangling bond of the interface of the channel area and the gate insulating film is terminated by the element of H or OH, and the hydrogen concentration at the interface is set to a high value of $2.6 \times 10^{20}$ cm$^{-3}$ or more, it is possible to set a silicon carbide semiconductor device of high channel mobility.

Alternatively, the interface may include another dangling bond, which is terminated by a nitrogen atom. In this case, the dangling bond of the interface of the channel area and the gate insulating film is terminated by a nitrogen element in addition to the element of H or OH. Thus, an interface level can be further reduced by also terminating the dangling bond of the interface of the channel area and the gate insulating film by the nitrogen element so that an improvement of channel mobility can be intended.

Alternatively, the substrate may have a main surface, which is provided by a (11–20)-plane. In this case, a main surface of the substrate is set to a (11–20)-plane. Mismatching of a lattice constant with respect to $SiO_2$ is reduced by using such a plane azimuth. Therefore, no dangling bond is easily generated, and a silicon carbide semiconductor device of high channel mobility can be particularly obtained.

Alternatively, the hydrogen atom terminating the dangling bond may have a desorbing amount, which represents a maximum peak in a range between 800° C. and 900° C. In the above silicon carbide semiconductor device, it is confirmed that a desorbing amount of hydrogen for terminating the dangling bond becomes a peak at 800 to 900° C.

According to a second aspect of the present disclosure, a method for manufacturing a silicon carbide semiconductor device having a MOS structure is provided. The method includes steps of: preparing a substrate made of silicon carbide; forming a channel area on the substrate, wherein the channel area is made of silicon carbide, and provides an electric current path; forming a first impurity area on an upstream side of the electric current path; forming a second impurity area on a downstream side of the electric current path; forming a gate insulating film on a surface of the channel area; forming a gate on the gate insulating film; and heating and cooling the substrate. The channel area provides the electric current path as a channel by controlling a voltage applied to the gate so that an electric current in the electric current path flowing between the first impurity area and the second impurity area is controlled. In the step of heating and cooling the substrate, the substrate is cooled in a wet atmosphere or a hydrogen atmosphere in a temperature range between 800° C. and 900° C. so that a dangling bond of an interface between the gate insulating film and the channel area is terminated by a hydrogen atom or a hydroxyl.

The above method is characterized in that a heat treatment process is included, and a wet atmosphere or a hydrogen atmosphere is continuously maintained in a temperature area of 800 to 900° C. at a temperature lowering time in the heat treatment process so as to terminate dangling bond of an interface of the gate insulating film and the channel area by an element of H or OH. Thus, at the temperature lowering time in the heat treatment process, the wet atmosphere or the hydrogen atmosphere is continuously maintained in the temperature area of 800 to 900° C. as the termination-desorption temperature, and temperature is lowered until the termination-desorption temperature or less. Therefore, the dangling bond of the interface of the gate insulating film and the channel area can be terminated by the element of H or OH. Therefore, the silicon carbide semiconductor device of high channel mobility can be set.

Alternatively, the step of heating and cooling the substrate may be performed as heat treatment of the step of forming the gate insulating film. This method is characterized in that the heat treatment process is performed as heat treatment of the gate insulating film forming process, and the wet atmosphere or the hydrogen atmosphere is continuously maintained in the temperature area of 800 to 900° C. at a temperature lowering time of the gate insulating film forming process. Thus, for example, effects shown in claim 5 can be obtained by continuously maintaining the wet atmosphere or the hydrogen atmosphere at the temperature lowering time of heat treatment of the gate insulating film forming process.

Alternatively, in the step of heating and cooling the substrate as the heat treatment of the step of forming the gate insulating film, the substrate may be cooled in the wet atmosphere or the hydrogen atmosphere until a temperature is equal to or lower than 800° C. In this case, it is preferable that the wet atmosphere or the hydrogen atmosphere is continuously maintained until temperature is lowered to 800° C. or less at the temperature lowering time of the gate insulating film forming process as well as the temperature area of 800 to 900° C.

Further, in the step of heating and cooling the substrate as the heat treatment of the step of forming the gate insulating film, the substrate may be cooled in the wet atmosphere or the hydrogen atmosphere until a temperature is equal to or lower than 700° C. In this case, it is more preferable that the wet atmosphere or the hydrogen atmosphere is continuously maintained until temperature is lowered to 700° C. or less at the temperature lowering time of the gate insulating film forming process.

Alternatively, in the step of forming the gate insulating film, a gate oxide film as the gate insulating film may be formed by a wet oxidation method in such a manner that the substrate is heated up to a temperature equal to or higher than 800° C. in the wet atmosphere. This method is characterized in that a gate oxide film is formed as the gate insulating film by performing wet oxidation for raising temperature to 800° C. or more within the wet atmosphere in the gate insulating film forming process. Thus, the gate insulating film can be constructed by the gate oxide film by performing the wet oxidation for raising temperature to 800° C. or more within the wet atmosphere.

Alternatively, in the step of forming the gate insulating film, the wet atmosphere for performing the wet oxidation method may be maintained when the substrate is cooled. In this case, the above effects can be obtained by also maintaining the wet atmosphere for performing the wet oxidation at the temperature lowering time.

Alternatively, the gate insulating film may be formed by a technique different from the wet oxidation method using the wet atmosphere in the step of forming the gate insulating film. This method is characterized in that the gate insulating film is formed by a technique different from the wet oxidation using the wet atmosphere in the gate insulating film forming process. Thus, the gate insulating film can be also formed by the technique different from the wet oxidation using the wet atmosphere. For example, the gate oxide film is formed by depositing LTO, TEOS, HTO, etc. by a dry atmosphere, an $N_2O$ atmosphere, an NO atmosphere, an ozone atmosphere, an $H_2O$ radical, CVD, etc. An insulating film except for oxide films of $HfO_2$, HfSiON, HfAlO, $Al_2O_3$, $Ta_2O_5$, $Si_3N_4$, etc. may be also used.

Alternatively, in the step of forming the gate insulating film, a gate oxide film as the gate insulating film may be formed by an oxidation method with an $N_2O$ atmosphere or an NO atmosphere. In this case, if the gate insulating film is constructed by a gate oxide film by performing oxidation within the $N_2O$ atmosphere or the NO atmosphere, the dangling bond of the interface of the channel area and the gate insulating film can be also terminated by a nitrogen element in addition to the element of H or OH. Thus, the interface state density can be further reduced and the improvement of channel mobility can be intended.

Alternatively, in the step of heating and cooling the substrate as the heat treatment of the step of forming the gate insulating film, a predetermined temperature in a range between 800° C. and 900° C. may be maintained for a predetermined time when the substrate is cooled. This method is characterized in that a predetermined temperature within a temperature range of 800 to 900° C. is held for a predetermined time at the temperature lowering time of the gate insulating film forming process. Thus, if the predetermined temperature of the temperature area of 800 to 900° C. is maintained for the predetermined time, i.e., if the termination-desorption temperature is set to a long time, a termination effect of the dangling bond due to H and OH can be improved.

Alternatively, in the step of heating and cooling the substrate as the heat treatment of the step of forming the gate insulating film, a predetermined temperature in a range between 700° C. and 1000° C. may be maintained for a predetermined time when the substrate is cooled. In this case, when a predetermined temperature within a temperature range of 700 to 1000° C. is held for a predetermined time at the temperature lowering time of the gate insulating film forming process, the termination effect of the dangling bond due to H and OH can be also improved.

Alternatively, the step of heating and cooling the substrate may be performed as an anneal process for improving characteristics of the interface between the gate insulating film and the channel area after the step of forming the gate insulating film. This method is characterized in that the heat treatment process is performed as anneal processing for improving characteristics of the interface of the gate insulating film and the channel area after the gate insulating film forming process. Thus, the heat treatment process can be also performed as the anneal processing for improving the characteristics of the interface of the gate insulating film and the channel area after the gate insulating film forming process. Such anneal processing can be also performed together with the heat treatment during the gate insulating film forming process, and can be also performed instead of the heat treatment during the gate insulating film forming process.

Alternatively, in the step of heating and cooling the substrate as the anneal process after the step of forming the gate insulating film, the substrate may be cooled in the wet atmosphere or the hydrogen atmosphere in a temperature range between 800° C. and 900° C. In this case, the wet atmosphere or the hydrogen atmosphere is continuously maintained in a temperature area of 800 to 900° C. at the temperature lowering time of at least the anneal processing.

Alternatively, in the step of heating and cooling the substrate as the anneal process after the step of forming the gate insulating film, the substrate may be cooled in the wet atmosphere or the hydrogen atmosphere until a temperature is equal to or lower than 800° C. In this case, it is preferable that the wet atmosphere or the hydrogen atmosphere is continuously maintained until temperature is lowered to 800° C. or less.

Alternatively, in the step of heating and cooling the substrate as the anneal process after the step of forming the gate insulating film, the substrate may be cooled in the wet atmosphere or the hydrogen atmosphere in a temperature range between 700° C. and 1000° C. In this case, it is more preferable that the wet atmosphere or the hydrogen atmosphere is continuously maintained in a temperature area of 700 to 1000° C. at the temperature lowering time of the anneal processing.

Alternatively, in the step of heating and cooling the substrate as the anneal process after the step of forming the gate insulating film, the substrate may be cooled in the wet atmosphere or the hydrogen atmosphere until a temperature is equal to or lower than 700° C. In this case, it is further preferable when the wet atmosphere or the hydrogen atmosphere is continuously maintained until temperature is lowered to 700° C. or less.

Alternatively, in the step of heating and cooling the substrate as the anneal process after the step of forming the gate insulating film, the substrate may be heated in the wet atmosphere or the hydrogen atmosphere in a temperature range equal to or higher than 800° C. In this case, the wet atmosphere or the hydrogen atmosphere is preferably continuously maintained in a temperature area of 800° C. or more at a temperature rising time of the anneal processing as well as the temperature lowering time of the anneal processing.

Alternatively, in the step of heating and cooling the substrate as the anneal process after the step of forming the gate insulating film, the substrate is heated in the wet atmosphere or the hydrogen atmosphere in a temperature range equal to or higher than 700° C. In this case, it is more preferable if the wet atmosphere or the hydrogen atmosphere is continuously maintained in a temperature area of 700° C. or more.

Alternatively, in the step of heating and cooling the substrate as the anneal process after the step of forming the gate insulating film, a predetermined temperature in a range between 800° C. and 900° C. may be maintained for a predetermined time when the substrate (1, 31, 61) is cooled. This method is characterized in that a predetermined temperature within a temperature range of 800 to 900° C. is held for a predetermined time at the temperature lowering time of the anneal processing. Thus, if the predetermined temperature of the temperature area of 800 to 900° C. is maintained for the predetermined time, i.e., if the termination-desorption temperature is set to a long time, the termination effect of the dangling bond due to H and OH can be improved.

Alternatively, in the step of heating and cooling the substrate as the anneal process after the step of forming the gate insulating film, a predetermined temperature in a range between 700° C. and 1000° C. may be maintained for a predetermined time when the substrate is cooled. In this case, when a predetermined temperature within a temperature range of 700 to 1000° C. is held for a predetermined time at the temperature lowering time of the anneal processing, the termination effect of the dangling bond due to H and OH can be also improved.

Alternatively, the method may further include a step of: forming a cap layer on a surface of the gate insulating film. The step of heating and cooling the substrate as the anneal process is performed after the step of forming the cap layer. This method is characterized in that a process for forming a cap layer on a surface of the gate insulating film is included, and the anneal processing is performed after the cap layer forming process. Thus, if the anneal processing is performed after the cap layer is formed, the dangling bond can be terminated by H or OH while the desorption of H or OH is further prevented by the cap layer. Therefore, channel mobility can be further raised.

Alternatively, the step of forming the cap layer may be performed together with the step of forming the gate so that the cap layer provides the gate. In this case, the gate forming process can be enumerated as the cap layer forming process, and the gate can be formed as the cap layer. Further, as shown in claim 29, the cap layer forming process can also include a process for forming an interlayer insulating film so as to cover the gate, and the interlayer insulating film can be formed as the cap layer.

Alternatively, the gate as the cap layer may be made of polysilicon. In this case, if the cap layer is formed by polysilicon when the cap layer is set to the gate, it does not react on the gate insulating film even when the anneal processing is performed. Therefore, it is suitable as the cap layer. Further, in the case of polysilicon, hydrogen is generated by an oxidizing reaction in the wet atmosphere, and contributes to the dangling bond termination. Therefore, there is a high possibility that channel mobility is further raised.

Alternatively, the step of heating and cooling the substrate as the anneal process may be performed as round-off oxidation of the gate. The round-off oxidation is performed in the wet atmosphere. In this case the heat treatment process can be performed as round-off oxidation of the gate (constructed by polysilicon, and the round-off oxidation is performed in the wet atmosphere.

Alternatively, the round-off oxidation may be performed in a temperature range between 800° C. and 900° C. In this case, higher channel mobility is obtained by performing the round-off oxidation at 800° C. to 900° C. as the termination-desorption temperature. Further, a round-off oxide film preferable in controllability can be formed since an oxidizing rate is suitable.

Alternatively, in the step of forming the cap layer, an interlayer insulating film may be formed to cover the gate, and the cap layer provides the interlayer insulating film.

Alternatively, the method may further include steps of: forming an interlayer insulating film to cover the gate; and performing a reflow process to the interlayer insulating film. The step of heating and cooling the substrate (1, 31, 61) provides the step of performing a reflow process. This method is characterized in that this invention includes a process for forming the interlayer insulating film so as to cover the gate, and a process for performing reflow processing of the interlayer insulating film, and the heat treatment process is performed as the reflow processing of the interlayer insulating film. Thus, the heat treatment process can be also performed as the reflow processing of the interlayer insulating film so that higher channel mobility can be obtained.

Alternatively, the wet atmosphere or the hydrogen atmosphere may be maintained in a temperature range equal to or higher than 800° C. after the step of forming the gate insulating film. This method is characterized in that the wet atmosphere or the hydrogen atmosphere is continuously maintained in a temperature area of 800° C. or more in performing a process of 800° C. or more after the gate insulating film forming process. When a device process design is made, for example, there is also a case in which the heat treatment process of high temperature exceeding 850° C. is performed as in an interlayer insulating film reflow, etc. In such a case, it is possible to prevent H or OH from being desorbed from the dangling bond of the interface of the channel area and the gate insulating film by continuously maintaining the wet atmosphere or the hydrogen atmosphere in the temperature area of 800° C. or more.

Alternatively, the wet atmosphere or the hydrogen atmosphere may be maintained in a temperature range equal to or higher than 700° C. after the step of forming the gate insulating film. If the wet atmosphere or the hydrogen atmosphere is continuously maintained in a temperature area of 700° C. or more in performing a process of 700° C. or more after the gate insulating film forming process, the desorption of H or OH can be further prevented.

Alternatively, all steps after the step of forming the gate insulating film may be performed in a temperature range equal to or lower than 800° C. This method is characterized in that all processes performed after the gate insulating film forming process are performed at 800° C. or less. Thus, when the dangling bond of the interface of the channel area and the gate insulating film is terminated by an element of H or OH by the gate insulating film forming process, the desorption of H or OH can be prevented if all subsequent processes are performed at 800° C. or less. Here, all the processes performed after the gate insulating film forming process are performed at 800° C. or less.

Alternatively, all steps after the step of forming the gate insulating film are performed in a temperature range equal to or lower than 700° C. In this case, the above effects can be more reliably obtained if all the processes performed after the gate insulating film forming process are performed at 700° C. or less.

Alternatively, the method may further include steps of: forming a source area as the first impurity layer having an impurity concentration equal to or higher than $3 \times 10^{20}$ cm$^{-3}$ to contact the channel area; and forming a source electrode, a part of which is made of nickel, the part contacting the source area.

Alternatively, the method may further include steps of: forming a drain area as the second impurity layer having an impurity concentration equal to or higher than $3 \times 10^{20}$ cm$^{-3}$ to contact the channel area or to be disposed on a back side of the substrate; and forming a drain electrode, a part of which is made of nickel, the part contacting the drain area.

Alternatively, the method may further include steps of: forming a base area in the substrate, wherein the base area has an electric conductivity type different from the first impurity area and the second impurity area; forming a contact area to contact the base area, wherein the contact area has the same electric conductivity type as the base area and an impurity concentration equal to or higher than $3 \times 10^{20}$ cm$^{-3}$; and forming an electrode for fixing an electric potential of the base area, wherein the electrode has a part contacting the contact area, the part being made of nickel.

The above methods are characterized in that a source area corresponding to a first impurity layer, a drain area corresponding to a second impurity layer, or a contact area is set to $3 \times 10^{20}$ cm$^{-3}$ in impurity concentration, and a portion coming in contact with a source electrode, a drain electrode or an electrode is formed by Ni. Thus, ohmic contact can be set if the source area, the drain area or the contact area is formed at the high concentration of $3 \times 10^{20}$ cm$^{-3}$ or more and the contact portion therewith is set to Ni.

Alternatively, the method may further include a step of: annealing the source electrode, the drain electrode, or the electrode. The step of annealing is performed in a temperature range equal to or lower than 800° C. In this case, when an electrode anneal process is performed at 800° C. or less, no ohmic contact is easily obtained. Therefore, it is effective that the impurity concentration of the source area, the drain area or the contact area is set to high concentration, and Ni is used as an electrode material.

Alternatively, the method may further include a step of: annealing the source electrode, the drain electrode, or the electrode. The step of annealing is performed in a temperature range equal to or lower than 700° C. In this case, if the electrode anneal process is performed at 700° C. or less, the above effects can be more reliably obtained.

Alternatively, the method may further include a step of: annealing the substrate at a temperature equal to or lower than 800° C. in an atmosphere different from the wet atmosphere after the step of heating and cooling the substrate. This method is characterized in that the anneal process is performed at 800° C. or less in an atmosphere different from the wet atmosphere of Ar, $N_2$, $O_2$, $H_2$, etc. after the heat treatment process. Thus, moisture within the gate insulating film can be removed and the improvement of channel mobility can be further intended by performing the anneal process in the atmosphere different from the wet atmosphere.

Alternatively, the step of annealing the substrate may be performed at a temperature equal to or lower than 700° C. In this case, if the anneal process is performed at 700° C. or less, the desorption of hydrogen can be further restrained so that the improvement of channel mobility can be further intended.

Alternatively, the step of forming the gate insulating film may include steps of: forming a first silicon oxide film on the surface of the channel area; forming an intermediate insulating film on the first silicon oxide film, the intermediate insulating film being made of silicon nitride film or a high dielectric film; and forming an oxide film by oxidizing the surface of the intermediate insulating film. In the step of forming the oxide film, the wet atmosphere or the hydrogen atmosphere is maintained in a temperature range equal to or higher than 800° C. when a temperature is lowered. This method is characterized in that the forming process of the gate insulating film includes a process for forming a first silicon oxide film on the surface of the channel area; a process for forming an intermediate insulating film constructed by a silicon nitride film or a high dielectric film on the first silicon oxide film; and a process for forming an oxide film by oxidizing the surface of the intermediate insulating film; and, in the process for forming the oxide film by oxidizing the surface of the intermediate insulating film, the wet atmosphere or the hydrogen atmosphere is continuously maintained in a temperature area of 800° C. or more at a temperature lowering time of at least this oxidation. Thus, the gate insulating film can be also set to a multilayer structure, and reliability of the gate insulating film can be further raised. In this case, the termination effect of the dangling bond due to H and OH can be improved by continuously maintaining the wet atmosphere or the hydrogen atmosphere in a temperature area of 800° C. or more at the temperature lowering time of oxidation.

Alternatively, in the step of forming the oxide film, the wet atmosphere or the hydrogen atmosphere is maintained in a temperature range equal to or higher than 700° C. when a temperature is lowered.

Alternatively, the step of heating and cooling the substrate may have a highest temperature in the wet atmosphere or the hydrogen atmosphere, the highest temperature equal to or lower than 1000° C.

Alternatively, the step of heating and cooling the substrate may have a highest temperature in the wet atmosphere or the hydrogen atmosphere, the highest temperature in a range between 800° C. and 900° C.

Alternatively, the step of heating and cooling the substrate may have a highest temperature in the wet atmosphere or the hydrogen atmosphere, the highest temperature in a range between 900° C. and 1000° C.

In the above methods, highest temperature of the wet atmosphere or the hydrogen atmosphere can be set to 1000° C. or less in the heat treatment process, e.g., the gate oxide film forming process and the anneal process performed thereafter. Thus, channel mobility can be improved by setting the highest temperature of the heat treatment process, e.g., the gate oxide film forming process and the anneal process performed thereafter to 1000° C. or less as a termination desorption temperature range, particularly, 800° C. to 900° C.

Alternatively, in the step of forming the gate insulating film, a gate oxide film as the gate insulating film may be formed by performing a wet oxidation at a temperature equal to or higher than 1000° C. in the wet atmosphere. This method is characterized in that gate oxidation temperature is set to 1000° C. or more in the gate oxide film forming process. The gate oxide film can be formed for a short time by forming the gate oxide film at such temperature.

Alternatively, in the step of heating and cooling the substrate as the anneal process after the step of forming the gate insulating film, a wet oxidation is performed at a temperature equal to or higher than 1000° C. in the wet atmosphere. This method is characterized in that the wet oxidation for raising temperature to 1000° C. or more within the wet atmosphere is performed in the anneal processing. Thus, temperature may be also set to 1000° C. or more in the anneal processing.

Alternatively, the substrate may have a main surface, which is provided by a (11–20)-plane. This method is characterized in that a main surface of the substrate is set to a (11–20)-plane. Mismatching of a lattice constant with respect to $SiO_2$ is reduced by using such a plane azimuth. Therefore, no dangling bond is easily generated, and a silicon carbide semiconductor device of high channel mobility can be particularly obtained.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a silicon carbide semiconductor device having a MOS structure comprising steps of:
   preparing a substrate made of silicon carbide, the substrate having a main surface, which is provided by an (11–20)-plane;
   forming a channel area on the substrate, wherein the channel area is made of silicon carbide, and provides an electric current path;
   forming a first impurity area on an upstream side of the electric current path;
   forming a second impurity area on a downstream side of the electric current path;
   forming a gate insulating film on a surface of the channel area;
   forming a gate on the gate insulating film; and
   heating and cooling the substrate, wherein
      the channel area provides the electric current path as a channel by controlling a voltage applied to the gate so that an electric current in the electric current path flowing between the first impurity area and the second impurity area is controlled,
      in the step of heating and cooling the substrate, the substrate is cooled in a wet atmosphere in a temperature range between 800° C. and 900° C. so that a dangling bond of an interface between the gate insulating film and the channel area is terminated by a hydrogen atom or a hydroxyl,
      the step of heating and cooling the substrate is performed as heat treatment of the step of forming the gate insulating film,
      the step of heating and cooling the substrate is further performed as an anneal process after the forming of the gate insulating film, the substrate being heated in the wet atmosphere at a temperature range equal to or higher than 800° C.; and
      the wet atmosphere is maintained in a temperature range equal to or higher than 800° C. after the step of forming the gate insulating film.

2. The method according to claim 1, wherein
in the step of heating and cooling the substrate as the heat treatment of the step of forming the gate insulating film, the substrate is cooled in the wet atmosphere until a temperature is equal to or lower than 800° C.

3. The method according to claim 1, wherein
in the step of heating and cooling the substrate as the heat treatment of the step of forming the gate insulating film, the substrate is cooled in the wet atmosphere until a temperature is equal to or lower than 700° C.

4. The method according to claim 1, wherein
in the step of forming the gate insulating film, a gate oxide film as the gate insulating film is formed by a wet oxidation method in such a manner that the substrate is heated up to a temperature equal to or higher than 800° C. in the wet atmosphere.

5. The method according to claim 4, wherein
in the step of forming the gate insulating film, the wet atmosphere for performing the wet oxidation method is maintained when the substrate is cooled.

6. The method according to claim 1, wherein
the gate insulating film is formed by a technique different from the wet oxidation method using the wet atmosphere in the step of forming the gate insulating film.

7. The method according to claim 6, wherein
in the step of forming the gate insulating film, a gate oxide film as the gate insulating film is formed by an oxidation method with an $N_2O$ atmosphere or an NO atmosphere.

8. The method according to claim 1, wherein
in the step of heating and cooling the substrate as the heat treatment of the step of forming the gate insulating film, a predetermined temperature in a range between 800° C. and 900° C. is maintained for a predetermined time when the substrate is cooled.

9. The method according to claim 1, wherein
in the step of heating and cooling the substrate as the heat treatment of the step of forming the gate insulating film, a predetermined temperature in a range between 700° C. and 1000° C. is maintained for a predetermined time when the substrate is cooled.

10. The method according to claim 1, wherein
the step of heating and cooling the substrate as an anneal process is performed for improving characteristics of the interface between the gate insulating film and the channel area after the step of forming the gate insulating film.

11. The method according to claim 10, wherein
in the step of heating and cooling the substrate as the anneal process after the step of forming the gate insulating film, the substrate is cooled in the wet atmosphere in a temperature range between 800° C. and 900° C.

12. The method according to claim 11, wherein
in the step of heating and cooling the substrate as the anneal process after the step of forming the gate insulating film, the substrate is cooled in the wet atmosphere until a temperature is equal to or lower than 800° C.

13. The method according to claim 11, wherein
in the step of heating and cooling the substrate as the anneal process after the step of forming the gate insulating film, a predetermined temperature in a range between 800° C. and 900° C. is maintained for a predetermined time when the substrate is cooled.

14. The method according to claim 11, wherein
in the step of heating and cooling the substrate as the anneal process after the step of forming the gate insulating film, a predetermined temperature in a range between 700° C. and 1000° C. is maintained for a predetermined time when the substrate is cooled.

15. The method according to claim 11, further comprising a step of:

forming a cap layer on a surface of the gate insulating film, wherein
the step of heating and cooling the substrate as the anneal process is performed after the step of forming the cap layer.

16. The method according to claim 15, wherein
the step of forming the cap layer is performed together with the step of forming the gate so that the cap layer provides the gate.

17. The method according to claim 16, wherein
the gate as the cap layer is made of polysilicon.

18. The method according to claim 17, wherein
the step of heating and cooling the substrate as the anneal process is performed as a round-off oxidation process of the gate, and
the round-off oxidation process is performed in the wet atmosphere.

19. The method according to claim 18, wherein
the round-off oxidation process is performed in a temperature range between 800° C. and 900° C.

20. The method according to claim 15, wherein
in the step of forming the cap layer, an interlayer insulating film is formed to cover the gate, and
the cap layer provides the interlayer insulating film.

21. The method according to claim 10, wherein
in the step of heating and cooling the substrate as the anneal process after the step of forming the gate insulating film, the substrate is cooled in the wet atmosphere in a temperature range between 700° C. and 1000° C.

22. The method according to claim 21, wherein
in the step of heating and cooling the substrate as the anneal process after the step of forming the gate insulating film, the substrate is cooled in the wet atmosphere until a temperature is equal to or lower than 700° C.

23. The method according to claim 10, wherein
in the step of heating and cooling the substrate as the anneal process after the step of forming the gate insulating film, the substrate is heated in the wet atmosphere in a temperature range equal to or higher than 700° C.

24. The method according to claim 10, wherein
in the step of heating and cooling the substrate as the anneal process after the step of forming the gate insulating film, a wet oxidation process is performed at a temperature equal to or higher than 1000° C. in the wet atmosphere.

25. The method according to claim 1, further comprising steps of:
forming an interlayer insulating film to cover the gate; and
performing a reflow process to the interlayer insulating film, wherein
the step of heating and cooling the substrate provides the step of performing a reflow process.

26. The method according to claim 1, wherein
all steps after the step of forming the gate insulating film are performed in a temperature range equal to or lower than 800° C.

27. The method according to claim 1, wherein
all steps after the step of forming the gate insulating film are performed in a temperature range equal to or lower than 700° C.

28. The method according to claim 1, further comprising steps of:
forming a source area as the first impurity layer having an impurity concentration equal to or higher than $3 \times 10^{20}$ $cm^{-3}$, the source area contacting the channel area; and
forming a source electrode, a part of which is made of nickel, the part contacting the source area.

29. The method according to claim 28, further comprising a step of:
annealing the source electrode, wherein
the step of annealing is performed in a temperature range equal to or lower than 800° C.

30. The method according to claim 28, further comprising a step of:
annealing the source electrode, wherein
the step of annealing is performed in a temperature range equal to or lower than 700° C.

31. The method according to claim 1, further comprising steps of:
forming a drain area as the second impurity layer having an impurity concentration equal to or higher than $3 \times 10^{20}$ $cm^{-3}$, the drain area contacting the channel area or being disposed on a back side of the substrate; and
forming a drain electrode, a part of which is made of nickel, the part contacting the drain area.

32. The method according to claim 1, further comprising steps of:
forming a base area in the substrate, wherein the base area has an electric conductivity type different from the first impurity area and the second impurity area;
forming a contact area to contact the base area, wherein the contact area has the same electric conductivity type as the base area and an impurity concentration equal to or higher than $3 \times 10^{20}$ $cm^{-3}$; and
forming an electrode for fixing an electric potential of the base area, wherein the electrode has a part contacting the contact area, the part being made of nickel.

33. The method according to claim 1, further comprising a step of:
annealing the substrate at a temperature equal to or lower than 800° C. in an atmosphere different from the wet atmosphere after the step of heating and cooling the substrate.

34. The method according to claim 1, wherein
the step of forming the gate insulating film includes steps of:
forming a first silicon oxide film on the surface of the channel area;
forming an intermediate insulating film on the first silicon oxide film, the intermediate insulating film being made of silicon nitride film or a high dielectric film; and
forming an oxide film by oxidizing the surface of the intermediate insulating film, and,
in the step of forming the oxide film, the wet atmosphere or the hydrogen atmosphere is maintained in a temperature range equal to or higher than 800° C. when a temperature is lowered.

35. The method according to claim 34, wherein,
in the step of forming the oxide film, the wet atmosphere or the hydrogen atmosphere is maintained in a temperature range equal to or higher than 700° C. when a temperature is lowered.

36. The method according to claim 1, wherein
the step of heating and cooling the substrate has a highest temperature in the wet atmosphere, the highest temperature equal to or lower than 1000° C.

37. The method according to claim 1, wherein
the step of heating and cooling the substrate has a highest temperature in the wet atmosphere, the highest temperature in a range between 800° C. and 900° C.

38. The method according to claim 1, wherein
the step of heating and cooling the substrate has a highest temperature in the wet atmosphere, the highest temperature in a range between 900° C. and 1000° C.

39. The method according to claim 1, wherein
in the step of forming the gate insulating film, a gate oxide film as the gate insulating film is formed by performing a wet oxidation at a temperature equal to or higher than 1000° C. in the wet atmosphere.

40. A method for manufacturing a silicon carbide semiconductor device having a MOS structure comprising steps of:
preparing a substrate made of silicon carbide, the substrate having a main surface, which is provided by a (11–20)-plane;
forming a channel area on the substrate, wherein the channel area is made of silicon carbide, and provides an electric current path;
forming a first impurity area on an upstream side of the electric current path;
forming a second impurity area on a downstream side of the electric current path;
forming a gate insulating film on a surface of the channel area;
forming a gate on the gate insulating film; and
heating and cooling the substrate, wherein
the channel area provides the electric current path as a channel by controlling a voltage applied to the gate so that an electric current in the electric current path flowing between the first impurity area and the second impurity area is controlled,
in the step of heating and cooling the substrate, the substrate is cooled in a wet atmosphere in a temperature range between 800° C. and 900° C. so that a dangling bond of an interface between the gate insulating film and the channel area is terminated by a hydrogen atom or a hydroxyl,
the step of heating and cooling the substrate is performed as heat treatment of the step of forming the gate insulating film,
the step of heating and cooling the substrate is further performed as an anneal process after the forming of the gate insulating film, the substrate being heated in the wet atmosphere at a temperature range equal to or higher than 800° C.; and
the wet atmosphere is maintained in a temperature range equal to or higher than 700° C. after the step of forming the gate insulating film.

41. A method for manufacturing a silicon carbide semiconductor device having a MOS structure comprising steps of:
preparing a substrate made of silicon carbide, the substrate having a main surface, which is provided by an (11–20)-plane;
forming a channel area on the substrate, wherein the channel area is made of silicon carbide, and provides an electric current path;
forming a first impurity area on an upstream side of the electric current path;
forming a second impurity area on a downstream side of the electric current path;
forming a gate insulating film on a surface of the channel area;
forming a gate on the gate insulating film;
heating and cooling the substrate; and
annealing the substrate at a temperature equal to or lower than 800° C. in an atmosphere different from the wet atmosphere after the step of heating and cooling the substrate, wherein
the channel area provides the electric current path as a channel by controlling a voltage applied to the gate so that an electric current in the electric current path flowing between the first impurity area and the second impurity area is controlled,
in the step of heating and cooling the substrate, the substrate is cooled in a wet atmosphere in a temperature range between 800° C. and 900° C. so that a dangling bond of an interface between the gate insulating film and the channel area is terminated by a hydrogen atom or a hydroxyl,
the step of heating and cooling the substrate is performed as heat treatment of the step of forming the gate insulating film,
the step of heating and cooling the substrate is further performed as an anneal process after the forming of the gate insulating film, the substrate being heated in the wet atmosphere at a temperature range equal to or higher than 800° C.; and
the wet atmosphere is maintained in a temperature range equal to or higher than 800° C. after the step of forming the gate insulating film, and
the step of annealing the substrate is performed at a temperature equal to or lower than 700° C.

* * * * *